(12) United States Patent
Chen

(10) Patent No.: US 10,529,840 B2
(45) Date of Patent: Jan. 7, 2020

(54) SEMICONDUCTOR DEVICE AND POWER CONVERTER

(71) Applicant: Mitsubishi Electric Corporation, Tokyo (JP)

(72) Inventor: Ze Chen, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/004,748

(22) Filed: Jun. 11, 2018

(65) Prior Publication Data

US 2019/0051738 A1 Feb. 14, 2019

(30) Foreign Application Priority Data

Aug. 8, 2017 (JP) ................. 2017-152892

(51) Int. Cl.
  *H01L 29/739* (2006.01)
  *H01L 29/10* (2006.01)
  *H02M 1/08* (2006.01)
  *H02M 7/5395* (2006.01)
  *H02P 27/08* (2006.01)

(52) U.S. Cl.
  CPC ...... *H01L 29/7397* (2013.01); *H01L 29/1095* (2013.01); *H02M 1/08* (2013.01); *H02M 7/5395* (2013.01); *H02P 27/08* (2013.01)

(58) Field of Classification Search
  None
  See application file for complete search history.

(56) References Cited

U.S. PATENT DOCUMENTS

| 2005/0029586 | A1  | 2/2005 | Ono et al. |
| 2014/0217463 | A1* | 8/2014 | Schulze ............ H01L 29/66333 257/139 |
| 2016/0284824 | A1* | 9/2016 | Nagata ............. H01L 21/76895 |
| 2018/0019331 | A1  | 1/2018 | Sumitomo et al. |

FOREIGN PATENT DOCUMENTS

| JP | 2005-056912 A | 3/2005 |
| JP | 2016-115847 A | 6/2016 |
| JP | 2016-157934 A | 9/2016 |

* cited by examiner

*Primary Examiner* — Charles D Garber
*Assistant Examiner* — Steven M Christopher
(74) *Attorney, Agent, or Firm* — Studebaker & Brackett PC

(57) ABSTRACT

A semiconductor substrate includes a first-conductivity drift layer, a first-conductivity first impurity layer, a second-conductivity base layer, and a first-conductivity first emitter region. The first impurity layer is provided on the drift layer, and has impurity concentration higher than impurity concentration of the drift layer. The base layer is provided on the first impurity layer. The first emitter region is provided on the base layer. The first impurity layer connects between trenches. The plurality of trenches are formed in the semiconductor substrate covered by a gate insulation film. The gate insulation film has a first thickness between a gate electrode and the drift layer in a side wall surface, and has a second thickness between the gate electrode and the drift layer in a bottom surface. The second thickness is larger than the first thickness.

5 Claims, 46 Drawing Sheets

F I G. 7
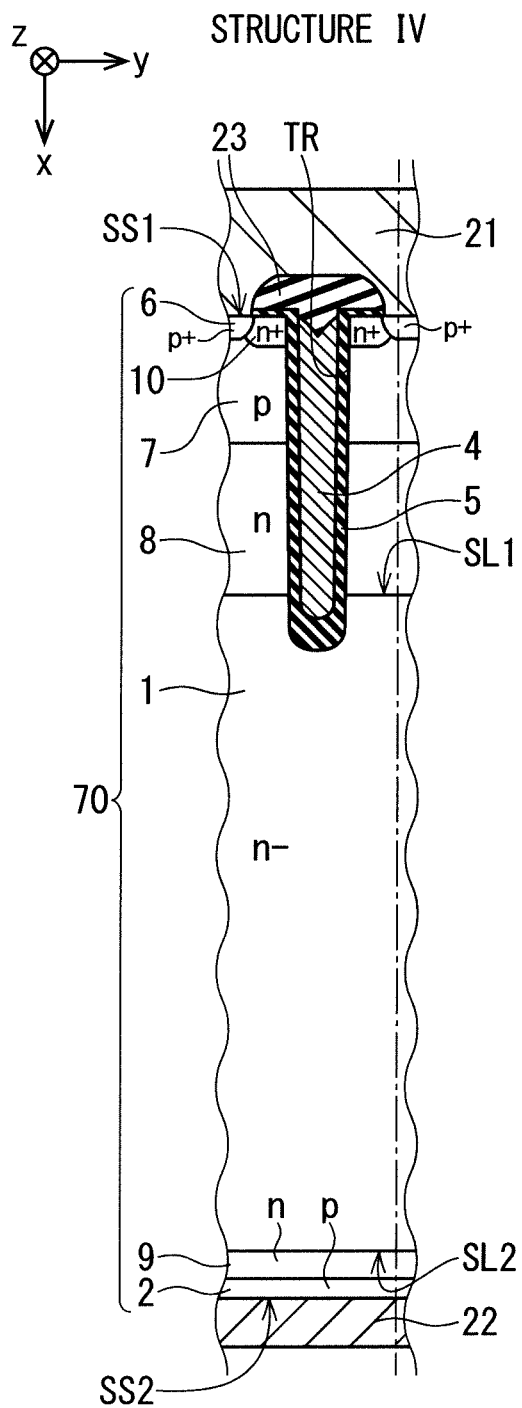

F I G. 5 0
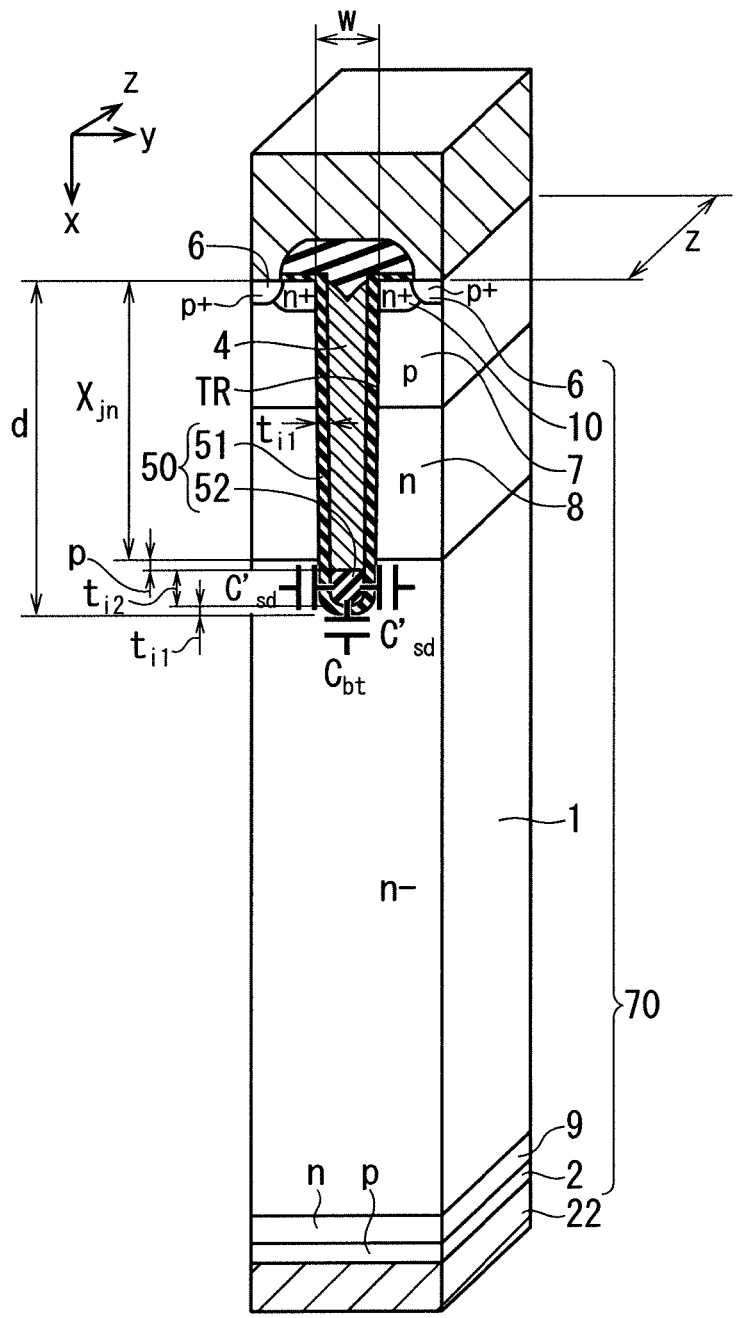

$t_{i1} + t_{i2} = d - X_{jn} - p$ $C_{bt} = (C_{i1} \cdot C_{i2}) / (C_{i1} + C_{i2}) = wx \cdot [\varepsilon_{ef} \varepsilon_0 / (d - X_{jn} - p)]$ $C_{sd} = C'_{sd} + C'_{sd}$ $C_{total} = C_{bt} + C_{sd}$ F I G. 5 5
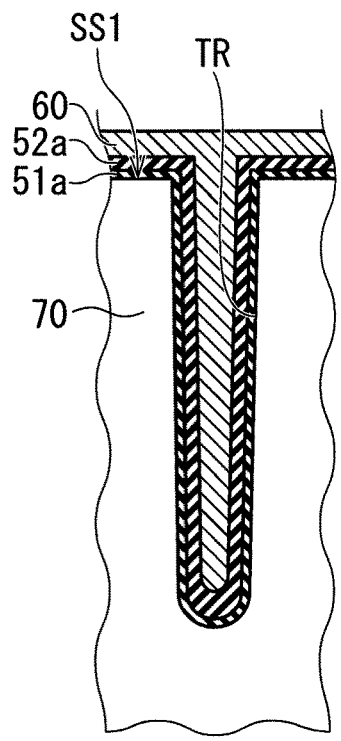
F I G. 5 6
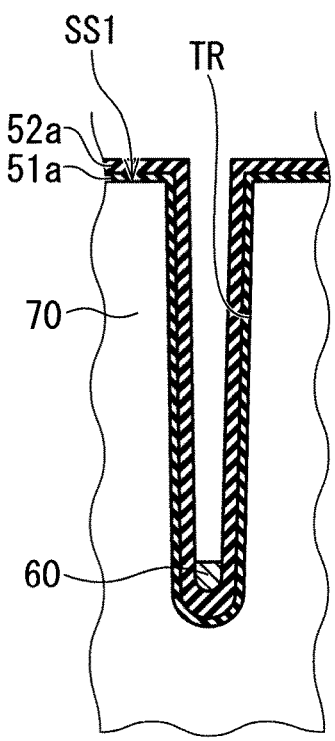

SEMICONDUCTOR DEVICE AND POWER CONVERTER

BACKGROUND OF THE INVENTION

Field of the Invention

The present invention relates to a semiconductor device and a power converter, and more particularly to a power semiconductor device and a power converter using the power semiconductor device.

Description of the Background Art

For an insulated gate bipolar transistor (IGBT) applied as a switching device in a power converter, a high breakdown voltage, low power loss, and satisfactory switching characteristics are required.

According to Japanese Patent Application Laid-Open No. 2005-56912, a trench gate structure is disclosed as a gate structure of a transistor. The thickness of an insulation film on a side wall of a trench is set to be larger than the thickness of the insulation film on a bottom portion of the trench. According to Japanese Patent Application Laid-Open No. 2005-56912 above, owing to the structure, it is assumed that a breakdown voltage can be maintained to be high even when a trench is deeply formed.

One IGBT disclosed in Japanese Patent Application Laid-Open No. 2016-115847 has a p-type embedded region in a bottom portion of a trench formed in an n-type drift layer. Further, another IGBT disclosed in Japanese Patent Application Laid-Open No. 2016-115847 has a p-type column region between adjacent trenches formed in an n-type drift layer. The above-mentioned p-type embedded region or p-type column region may contribute to enhancement in breakdown voltage through alleviation of electric field concentration.

Power loss of an IGBT is roughly divided into on-steady loss and switching loss. The on-steady loss is proportional to a saturation voltage in the on state, that is, an on-voltage. Therefore, the on-steady loss can be reduced by suppressing the on-voltage. For a switching operation, a high speed in switching and suppression in an oscillation phenomenon and a snap-off phenomenon are required as well as lowness in switching loss. As a method of enhancing switching characteristics, there is known a method of reducing impurity concentration in a collector region to suppress carrier concentration on the collector side. However, suppression in carrier concentration involves adverse influence of increase in on-voltage. The on-voltage can be suppressed through reduction in thickness of a drift layer. However, in view of securing a breakdown voltage and a safety operating area (SOA), application of the method of excessively reducing the thickness of the drift layer is limited.

According to Japanese Patent Application Laid-Open No. 2016-157934, there is disclosed a trench gate IGBT that is intended to suppress reduction in switching controllability along with reduction in on-voltage. This IGBT has a carrier storage layer for reducing the on-voltage. The carrier storage layer is a high-concentration impurity layer of a first conductivity type that is formed on a drift layer of a first conductivity type. The carrier storage layer has a peak position where its impurity concentration is the highest. The thickness of a gate insulation film on a side surface of a trench is set to be larger on the collector layer side with respect to the above-mentioned peak position than on the opening side of the trench with respect to the above-mentioned peak position. According to Japanese Patent Application Laid-Open No. 2016-157934, even when carriers are stored in the vicinity of the side surface of the trench positioned near the carrier storage layer at the time of transition from the off state to the on state, such a thick gate insulation film is formed in at least a part of the side surface of the trench. Therefore, it is assumed that change in gate potential due to the carriers can be suppressed in the portion having the thick gate insulation film and that reduction in switching controllability can be thereby suppressed.

The above-mentioned p-type embedded region that is expected to be effective for enhancement in breakdown voltage may impair the on-voltage reducing effect obtained by the above-mentioned carrier storage layer. This is because electron injection from the carrier storage layer into the drift layer along the side wall of the trench is inhibited by the p-type embedded region. Reduction in efficiency of electron injection into the drift layer suppresses increase in hole concentration corresponding to the electron injection. Therefore, carrier concentration in the drift layer is reduced, thus increasing the on-voltage. In a case where the above-mentioned p-type column region that is expected to be effective for enhancement in breakdown voltage is provided, the carrier storage layer cannot be widely formed in a manner of connecting adjacent trenches in the in-plane direction. As a result, in a potential barrier formed in the interface of the carrier storage layer and the drift layer, the storage amount of holes injected from the collector side is reduced. As a result, carrier concentration in the drift layer is reduced, thus increasing the on-voltage. As described above, there usually is a tradeoff relationship between enhancement in the breakdown voltage and suppression in the on-voltage.

In a case where the thickness of the gate insulation film on the side surface of the trench is set to be larger in a portion on the collector layer side with respect to the above-mentioned peak position with the intention of suppressing reduction in switching controllability, capacitance formed by a gate electrode and a semiconductor region that are opposed to each other with intermediation of the portion is reduced, and therefore electrons stored in the vicinity of the portion are reduced. As a result, efficiency of electron injection into the drift layer is reduced, and hence increase in hole concentration corresponding to the electron injection is suppressed. Therefore, carrier concentration in the drift layer is reduced, thus increasing the on-voltage.

SUMMARY

The structure of providing a thick insulation film on the bottom surface of the trench is, according to the investigation made by the inventor of the present invention, does not bring about major improvement in switching characteristics by simply applying the structure to the trench formed in the drift layer. Note that, although detailed description will be given later, the inventor of the present invention has found out that the structure does bring about major improvement in switching characteristics under combination with another specific structure, and the inventor of the present invention thereby arrived at the present invention.

The present invention has been made in order to solve the problems as described above, and has an object to provide a semiconductor device and a power converter that are capable of improving switching characteristics while adverse influence on other important electrical characteristics is suppressed.

A semiconductor device of the present invention includes a semiconductor substrate, a gate insulation film, and a gate electrode. The semiconductor substrate has a first substrate surface and a second substrate surface that is opposite to the first substrate surface.

The semiconductor substrate has a drift layer, a first impurity layer, a second impurity layer, a base layer, a first emitter region, a second emitter region, and a collector region. The drift layer has a first surface and a second surface that is opposite to the first surface, and has a first conductivity type. The first impurity layer is provided on the first surface of the drift layer, has the first conductivity type, and has impurity concentration higher than impurity concentration of the drift layer. The second impurity layer is provided on the first surface of the drift layer, and has a second conductivity type different from the first conductivity type. The base layer is provided on the first impurity layer, and has the second conductivity type. The first emitter region is provided on the base layer, partially forms the first substrate surface, and has the first conductivity type. The second emitter region is provided on the base layer, partially forms the first substrate surface, and has the second conductivity type. The collector region is provided directly or indirectly on the second surface of the drift layer, at least partially forms the second substrate surface, and has the second conductivity type.

A plurality of trenches are formed in the first substrate surface of the semiconductor substrate. The plurality of trenches each have an inner surface in which a bottom surface and a side wall surface are provided. The plurality of trenches each have a main portion extending along the first substrate surface, and an end portion extending along the first substrate surface to be connected to the main portion. The bottom surface is formed of the drift layer in the main portion and is formed of the second impurity layer in the end portion. The first impurity layer connects between the plurality of trenches in an in-plane direction of the first substrate surface.

A gate insulation film covers the inner surface of the plurality of trenches. A gate electrode is embedded in the plurality of trenches with intermediation of the gate insulation film. The gate insulation film has a first thickness between the gate electrode and the drift layer in the side wall surface, and has a second thickness between the gate electrode and the drift layer in the bottom surface. The second thickness is larger than the first thickness.

According to the present invention, switching characteristics can be improved while adverse influence on other important electrical characteristics is suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a partial cross-sectional view illustrating a configuration of Structure IV, which is one of structures for simulating characteristics of the semiconductor device.

FIG. 50 is a partial cross-sectional perspective view illustrating the definition of dimensions in a trench gate structure of the semiconductor device.

FIG. 55 is a partial cross-sectional view illustrating a third process in the example of the manufacturing method for a trench gate structure of the semiconductor device of FIG. 47.

FIG. 56 is a partial cross-sectional view illustrating a fourth process in the example of the manufacturing method for a trench gate structure of the semiconductor device of FIG. 47.

DESCRIPTION OF THE PREFERRED EMBODIMENTS

Figure 1:
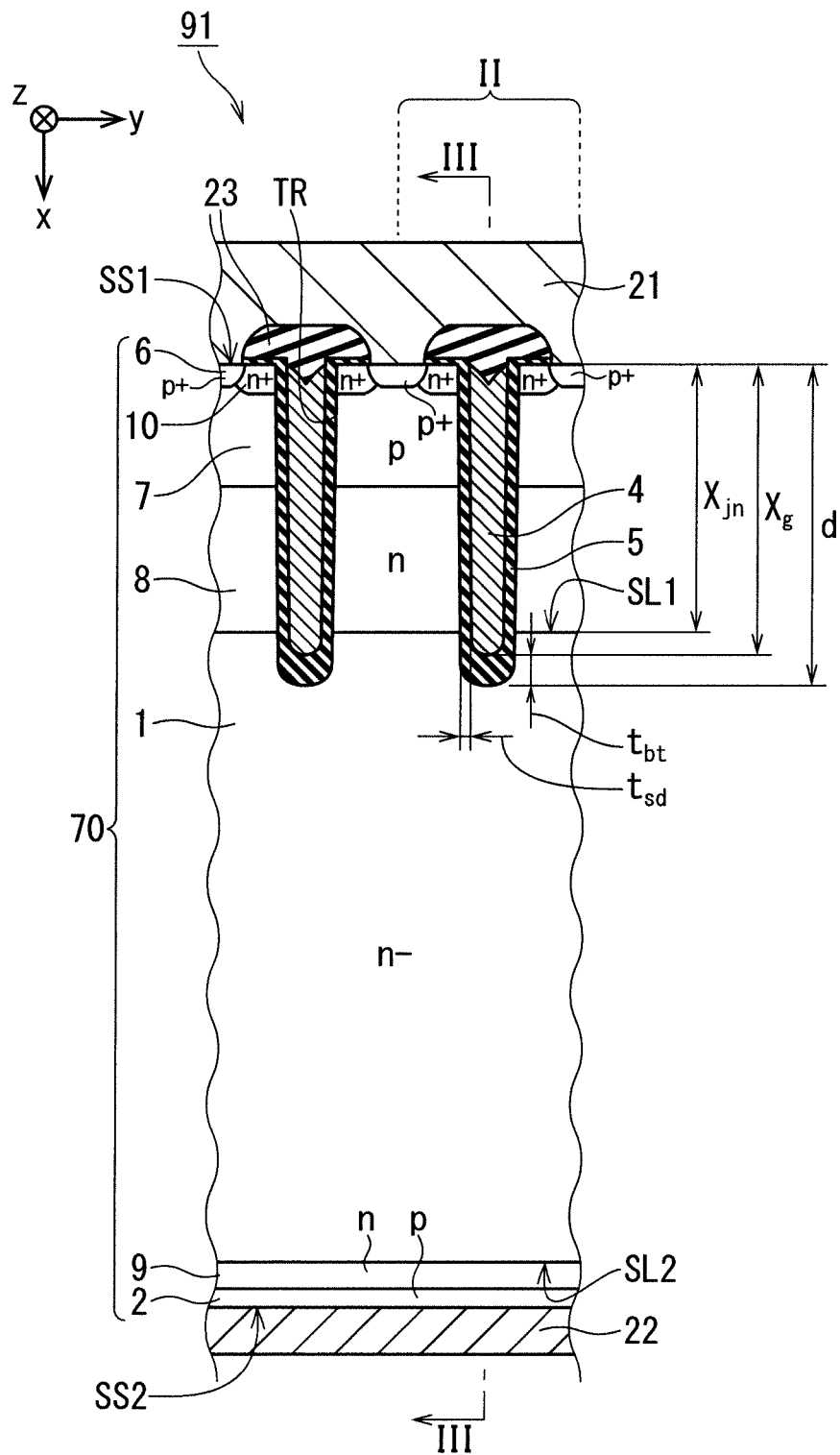
FIG. 1 is a partial cross-sectional view schematically illustrating a configuration of a semiconductor device according to a first preferred embodiment of the present invention.

Description is given below of preferred embodiments of the present invention on the basis of the drawings. Note that, in the drawings below, the same or corresponding components are denoted by the same reference numbers to omit repeated description.

<First Preferred Embodiment>

(Gist of Configuration)

Figure 2:
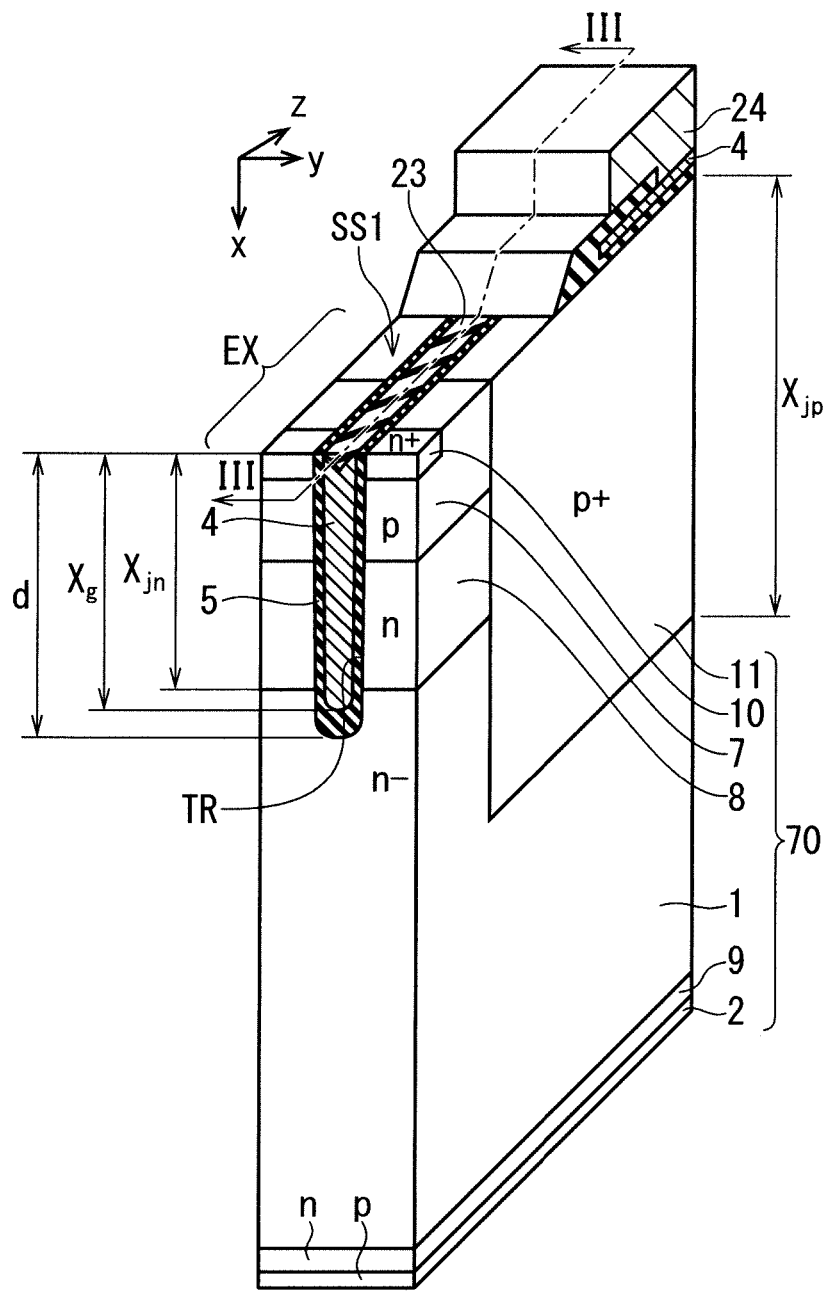
FIG. 2 is a cross-sectional perspective view of the region II of FIG. 1.
Figure 3:
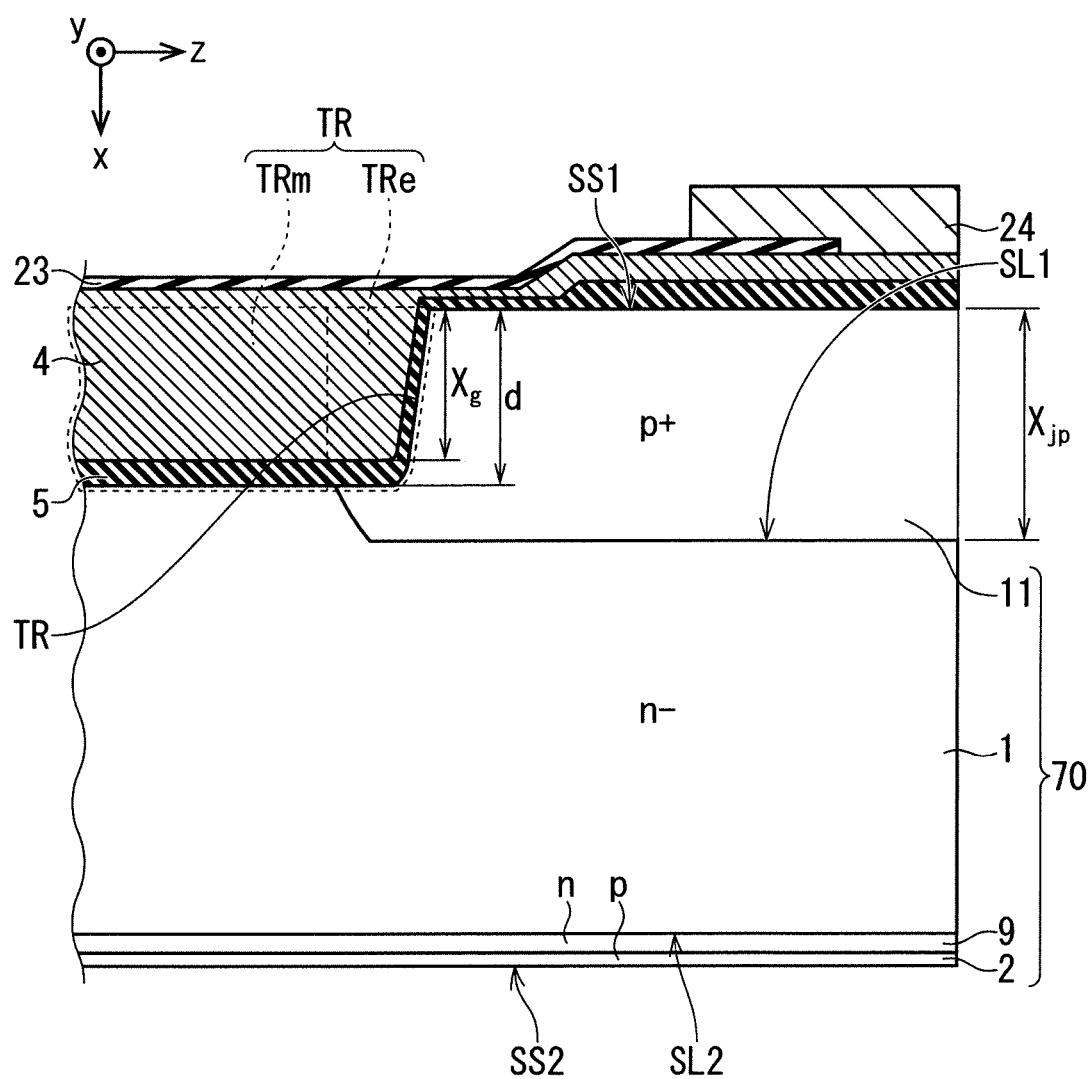
FIG. 3 is a partial cross-sectional view taken along the line III-III of FIG. 1.

FIG. 1 is a partial cross-sectional view schematically illustrating a configuration of an IGBT 91 (semiconductor device) according to this first preferred embodiment. FIG. 2 is a cross-sectional perspective view of the region II of FIG. 1. FIG. 3 is a partial cross-sectional view taken along the line III-III of FIG. 1. Note that, in the region EX of FIG. 2, in order to make an upper substrate surface SS1 (first substrate surface) of a semiconductor substrate 70 more easily visible, illustration of the configuration above the upper substrate surface SS1 is omitted.

The IGBT 91 includes the semiconductor substrate 70, a gate insulation film 5, a gate electrode 4, an emitter electrode 21, a collector electrode 22, an interlayer insulation film 23, and a gate wire layer 24. The semiconductor substrate 70 has the upper substrate surface SS1 and a lower substrate surface SS2 (second substrate surface opposite to the first substrate surface). A plurality of trenches TR are formed on the upper substrate surface SS1 of the semiconductor substrate 70. The semiconductor substrate 70 has an n$^-$-type drift layer 1, an n-type impurity layer 8 (first impurity layer), an n-type buffer layer 9, a p$^+$-type impurity layer 11 (second impurity layer), a p-type base layer 7, an n$^+$-type emitter region 10 (first emitter region), a p$^+$-type emitter region 6 (second emitter region), and a p-type collector region 2.

The n$^-$-type drift layer 1 has an upper surface SL1 (first surface) and a lower surface SL2 (second surface opposite to the first surface). The n$^-$-type drift layer 1 may be formed of a monocrystal substrate. The n$^-$-type drift layer 1 has an n type (first conductivity type). Impurity concentration of the n$^-$-type drift layer 1 may be substantially uniform.

The n-type impurity layer 8 is provided partially on the upper surface SL1 of the n$^-$-type drift layer 1. The n-type impurity layer 8 has impurity concentration higher than impurity concentration of the n$^-$-type drift layer 1. It is preferred that the impurity concentration of the n-type impurity layer 8 be $1 \times 10^2$ times or more and $1 \times 10^4$ times or less of the impurity concentration of the n$^-$-type drift layer 1. The impurity concentration of the n-type impurity layer 8 may have a peak value in the depth direction (x-direction in the drawing), and in that case, the peak value may be regarded as impurity concentration of the n-type impurity layer 8. The n-type impurity layer 8 connects between the trenches TR in the in-plane direction of the upper substrate surface SS1.

The p-type base layer 7 is provided on the n-type impurity layer 8, and has a p type. The n$^+$-type emitter region 10 is provided on the p-type base layer 7, and partially forms the upper substrate surface SS1. The n$^+$-type emitter region 10 has an n type. The p$^+$-type emitter region 6 is provided on the p-type base layer 7, and partially forms the upper substrate surface SS1. The p$^+$-type emitter region 6 has a p type (second conductivity type different from the first conductivity type).

The n-type buffer layer 9 is provided on the lower surface SL2 of the n$^-$-type drift layer 1. The n-type buffer layer 9 has an n type, and has impurity concentration higher than impurity concentration of the n$^-$-type drift layer 1. The n-type buffer layer 9 may be omitted. The p-type collector region 2 is provided directly or indirectly on the lower surface SL2 of the n$^-$-type drift layer 1, and is provided indirectly on the lower surface SL2 of the n$^-$-type drift layer 1 with intermediation of the n-type buffer layer 9 in this preferred embodiment. Note that, in a case where the n-type buffer layer 9 is omitted, the p-type collector region 2 is provided directly on the lower surface SL2 of the n$^-$-type drift layer 1. The p-type collector region 2 at least partially forms the lower substrate surface SS2, and forms the entire lower substrate surface SS2 in FIG. 1. Note that, the lower substrate surface SS2 may partially be formed of an n-type region.

The p$^+$-type impurity layer 11 is provided partially on the upper surface SL1 of the n$^-$-type drift layer 1. In a plan view (viewed from the top in FIG. 2), the n$^+$-type emitter region 10 is not provided in a region where the p$^+$-type impurity layer 11 is formed, and the p$^+$-type impurity layer 11 typically reaches the upper substrate surface SS1.

The plurality of trenches TR are typically arrayed periodically. Each trench TR has an inner surface in which a bottom surface and a side wall surface are provided. As illustrated in FIG. 3, each TR has a main portion TRm extending along the upper substrate surface SS1 (along the horizontal direction in the drawing) and an end portion TRe extending along the upper substrate surface SS1 to be connected to the main portion TRm. The bottom surface of the trench TR is formed of the n⁻-type drift layer 1 in the main portion TRm, and is formed of the p⁺-type impurity layer 11 in the end portion TRe. The main portion TRm reaches the n⁻-type drift layer 1 passing through the p-type base layer 7 on which the n⁺-type emitter region 10 and the p⁺-type emitter region 6 are provided and through the n-type impurity layer 8. Therefore, the side wall surface of the main portion TRm has a portion in which the n⁺-type emitter region 10, the p-type base layer 7, and the n-type impurity layer 8 are continuous, and the portion forms a channel controlled by an electric field from the gate electrode 4. In other words, the side wall surface of the main portion TRm forms a metal-insulator-semiconductor (MIS) transistor structure together with the gate insulation film 5 and the gate electrode 4. The side wall surface of the end portion TRe does not have the n⁺-type emitter region 10, and is typically formed only of the p⁺-type impurity layer 11. Therefore, the end portion TRe does not form a channel. In other words, the side wall surface of the end portion TRe does not form the MIS transistor structure.

The gate insulation film 5 covers the inner surface of the trench TR. The gate insulation film 5 has a thickness $t_{sd}$ (first thickness) between the gate electrode 4 and the n⁻-type drift layer 1 in each side wall surface of the trench TR, and has a second thickness $t_{bt}$ (second thickness) between the gate electrode 4 and the n⁻-type drift layer 1 in each bottom surface of the trench TR. The thickness $t_{bt}$ is larger than the thickness $t_{sd}$. Therefore, a portion of the gate insulation film 5 that is opposed to the bottom surface of the trench TR has a thickness larger than a thickness of a portion of the gate insulation film 5 that is opposed to the side wall surface of the trench TR and is opposed to the n⁻-type drift layer 1. The thickness $t_{sd}$ may be substantially uniform on the side wall surface of the trench TR. The gate insulation film 5 may be made of a single material. Particularly in a case where the gate insulation film 5 is an oxide film formed through thermal oxidation, satisfactory interfacial characteristics of the gate insulation film are easily attained. Specifically, defect density in the interface is reduced, thus reducing gate leakage.

The gate electrode 4 is embedded in the plurality of trenches TR with intermediation of the gate insulation film 5. The gate electrode 4 is made of conductive polysilicon, for example.

The emitter electrode 21 is electrically connected, ohmically connected to be specific, to the n⁺-type emitter region 10 and the p⁺-type emitter region 6. The emitter electrode 21 may be in direct contact with the n⁺-type emitter region 10 and the p⁺-type emitter region 6. The emitter electrode 21 is made of aluminum, for example, and the interface of the emitter electrode 21 and the semiconductor substrate 70 may be processed to be a silicide. The collector electrode 22 is electrically connected, ohmically connected to be specific, to the p-type collector region 2. The emitter electrode 21 may be in direct contact with the p-type collector region 2. The collector electrode 22 is made of aluminum, for example, and the interface of the collector electrode 22 and the semiconductor substrate 70 may be processed to be a silicide.

Next, description is given below of the gist of a preferred structural parameter, that is, preferred dimensions of elements of the IGBT 91, according to this preferred embodiment. Note that, in the description below, "depth" means a depth position taken from the upper substrate surface SS1 of the semiconductor substrate 70 along the x-direction.

The depth of the interface of the gate insulation film 5 and the gate electrode 4 is defined as $X_g$. The depth of the interface of the n⁻-type drift layer 1 and the n-type impurity layer 8 is defined as $X_{jn}$. The depth of the bottom surface of the trench TR is defined as a depth d. The width of the trench TR is defined as w. The depth of the interface of the n⁻-type drift layer 1 and the p⁺-type impurity layer 11 is defined as $X_{jp}$. The ratio of the depth $X_g$ to the depth $X_{jn}$, that is, $X_g/X_{jn}$, is defined as a ratio r.

The depth $X_g$ is larger than the depth $X_{jn}$. The depth d is larger than the depth $X_{jn}$, and is smaller than the depth $X_{jp}$. Further, it is preferred that Expression (1.7) and Expression (1.13) described later be satisfied.

(Comparative Examination on Structures of IGBT)

In an IGBT, there usually is a tradeoff relationship between an on-voltage and switching loss. For this reason, comparison described later is made under the condition that the on-voltage is fixed. The on-voltage is adjusted by concentration of the p-type collector region 2. When the concentration of the p-type collector region 2 is increased, carrier concentration in the vicinity of the lower substrate surface SS2 at the time of starting a turn-off is also increased.

FIG. 4 to FIG. 7 are partial cross-sectional views illustrating configurations of Structure I to Structure IV for simulating characteristics of the IGBT, respectively. Structure IV (FIG. 7) has a structure corresponding to the IGBT 91 of this preferred embodiment. Structure III (FIG. 6) is a structure obtained by omitting the n-type impurity layer 8 from Structure IV. Structure II (FIG. 5) has, in place of the gate insulation film 5 of Structure IV, a gate insulation film 5Z having an equal thickness on the bottom surface and the side wall surface of the trench. Similarly, Structure I (FIG. 4) has, in place of the gate insulation film 5 of Structure III, the gate insulation film 5Z.

Figure 8:
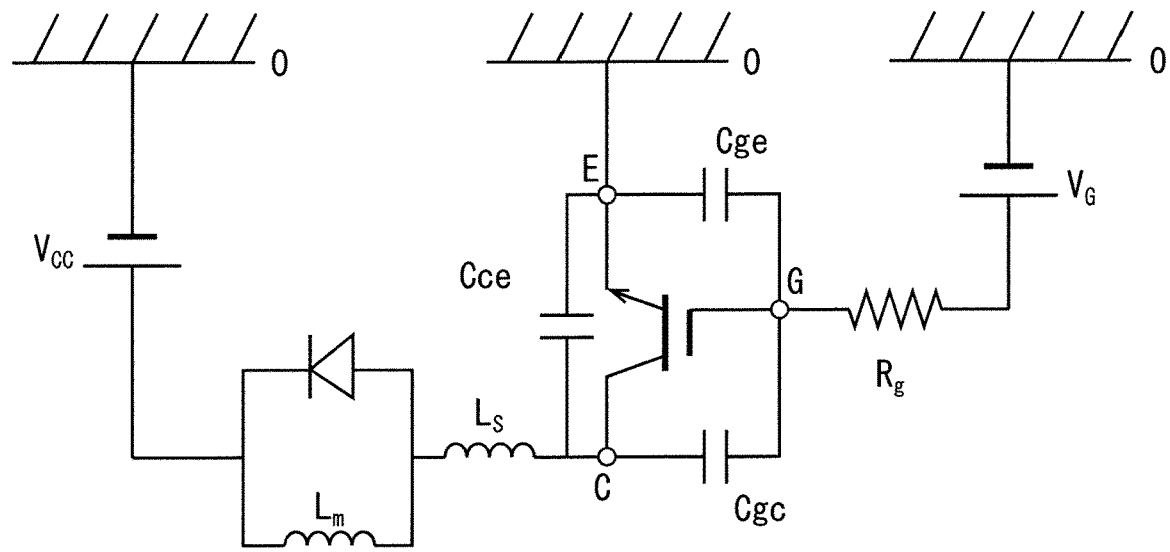
FIG. 8 is a diagram illustrating an equivalent circuit of the semiconductor device in which a switching operation is performed.

FIG. 8 is a diagram illustrating an equivalent circuit of the IGBT in which a switching operation is performed. The equivalent circuit has load inductance Lm, gate resistance Rg, circuit parasitic inductance Ls, gate-emitter parasitic capacitance Cge, emitter-collector parasitic capacitance Cce, and gate-collector parasitic capacitance Cgc. The capacitance Cgc is proportional to the reciprocal of the thickness $t_{bt}$ on the bottom surface of the trench TR of the gate insulation film 5. Therefore, when the thickness $t_{bt}$ is increased, the gate-emitter parasitic capacitance Cgc is reduced. The parasitic capacitance and the parasitic inductance are related to the device internal condition (carrier concentration and electric field intensity) at the time of a switching operation, and hence result in affecting an oscillation phenomenon and a snap-off phenomenon at the time of a switching operation of the IGBT. In the simulation described later, the condition of a power supply voltage Vcc=1800 V, temperature=423 K, a gate voltage $V_G$=±15 V, and the inductance $L_s$=2.47 µH is used.

Figure 9:
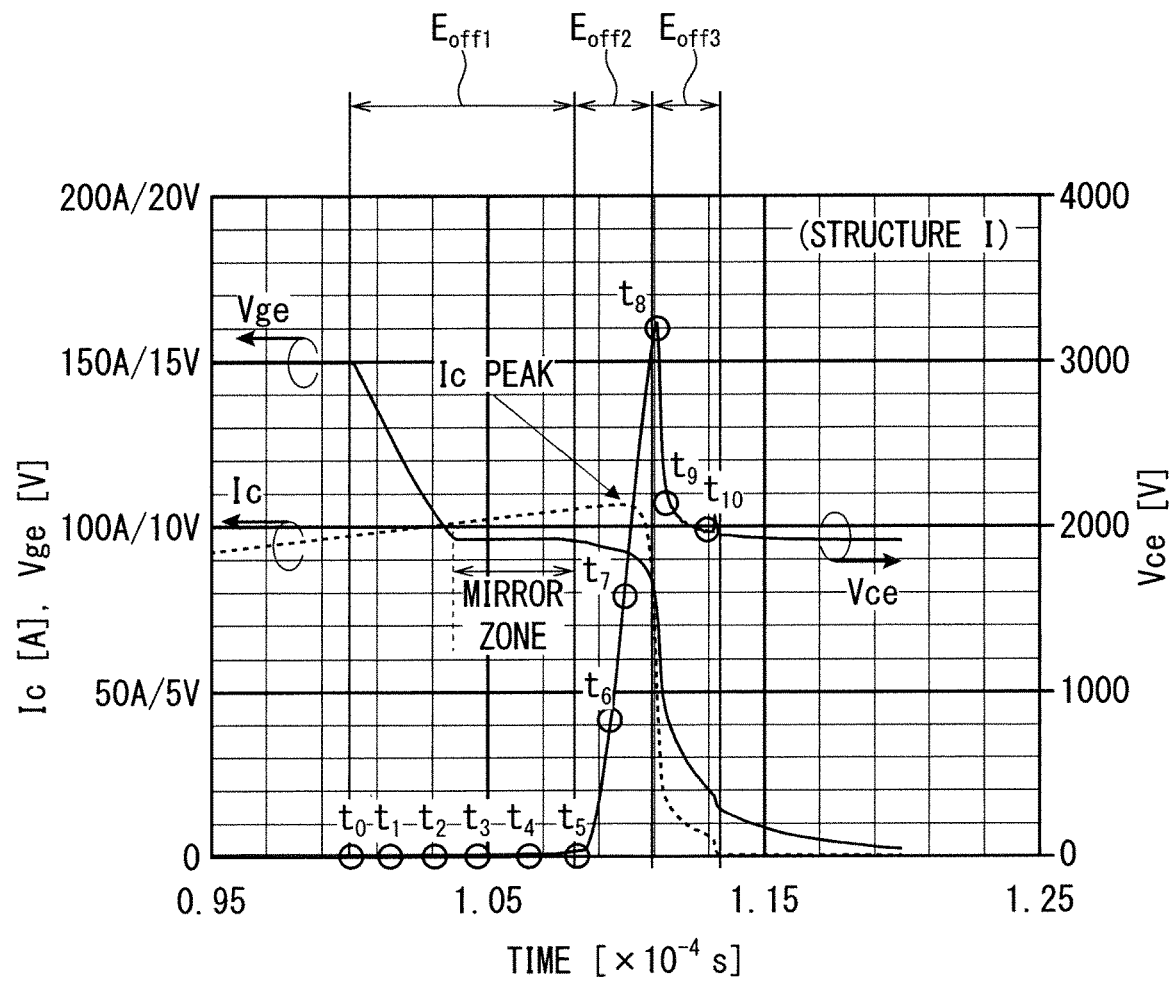
FIG. 9 is a graph showing simulation results of turn-off waveforms of Structure I.

FIG. 9 is a graph showing turn-off waveforms of Structure I obtained by a simulation. Turn-off loss $E_{off}$ is divided into the following three loss components $E_{off1}$, $E_{off2}$, and $E_{off3}$.

The loss component $E_{off1}$ is a loss in a time period from the start of a turn-off of a gate signal until completion of electric discharge in a mirror zone. In this time period, a current Ic is increased, and a collector-emitter voltage Vce starts to be increased (although it may be hard to determine from the shown graph). When the parasitic capacitance Cgc is reduced, a time period of the mirror zone is reduced.

Figure 10:
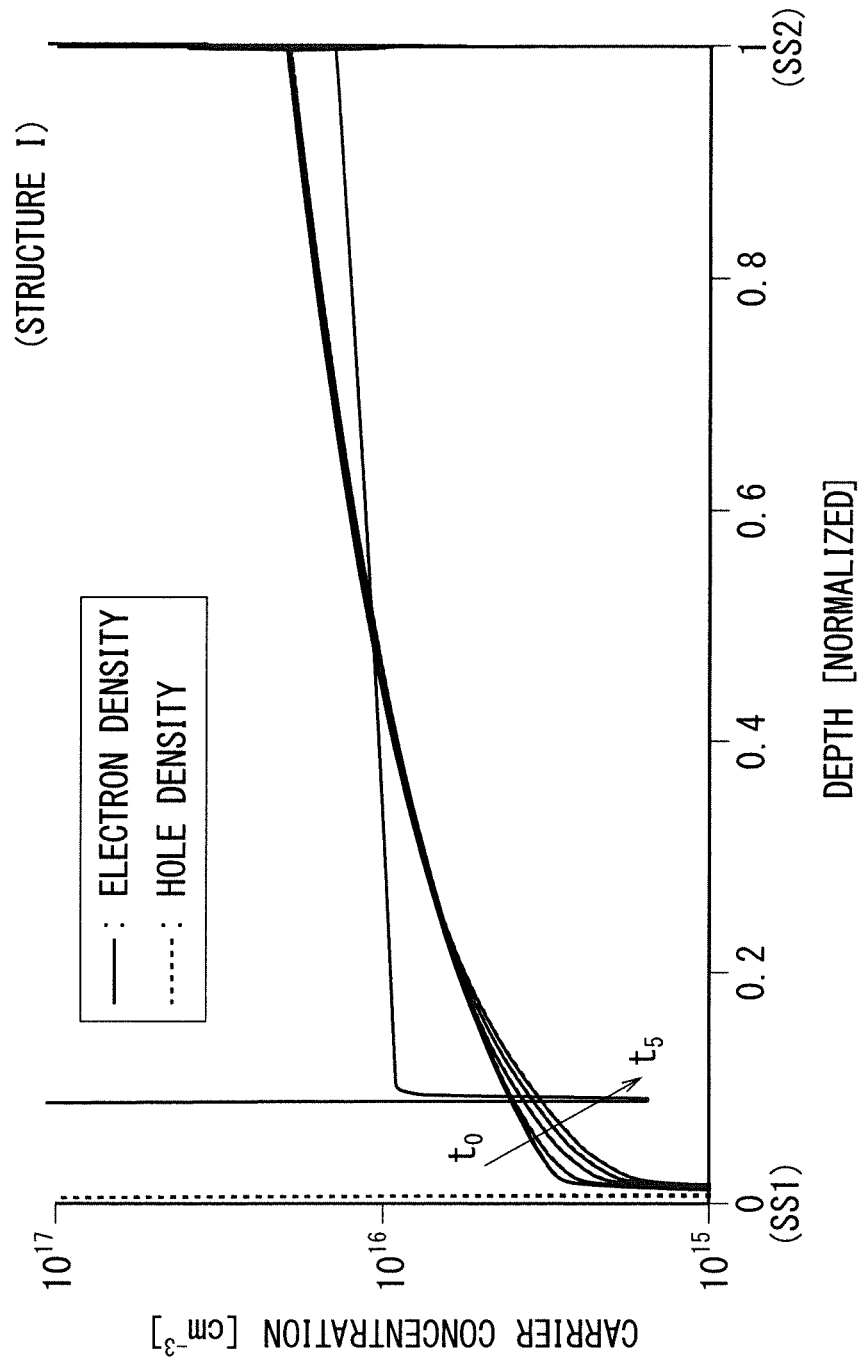
FIG. 10 is a graph showing simulation results of a time-dependent change of carrier concentration distribution from times $t_0$ to $t_5$ that are included in a time period corresponding to a loss component $E_{off1}$ illustrated in FIG. 9 in the cross-section taken along the one-dot chain line of FIG. 4 (Structure I).

Based on the relationship of energy loss=∫IVdt, as a time period of the mirror zone is reduced, the loss component $E_{off1}$ is reduced. Further, when carrier concentration on the emitter side at the time of starting a turn-off is increased, depletion is inhibited, and therefore an increasing rate dV/dt of the collector-emitter voltage Vce is reduced. As the increasing rate dV/dt is reduced, a value of the collector-emitter voltage Vce is reduced, and therefore the loss component $E_{off1}$ is reduced. FIG. 10 is a graph showing a time-dependent change of carrier concentration distribution from times $t_0$ to $t_5$ that are included in a time period corresponding to the loss component $E_{off1}$ (FIG. 9) of the turn-off loss $E_{off}$ in the cross-section taken along the one-dot chain line FIG. 4.

Figure 11:
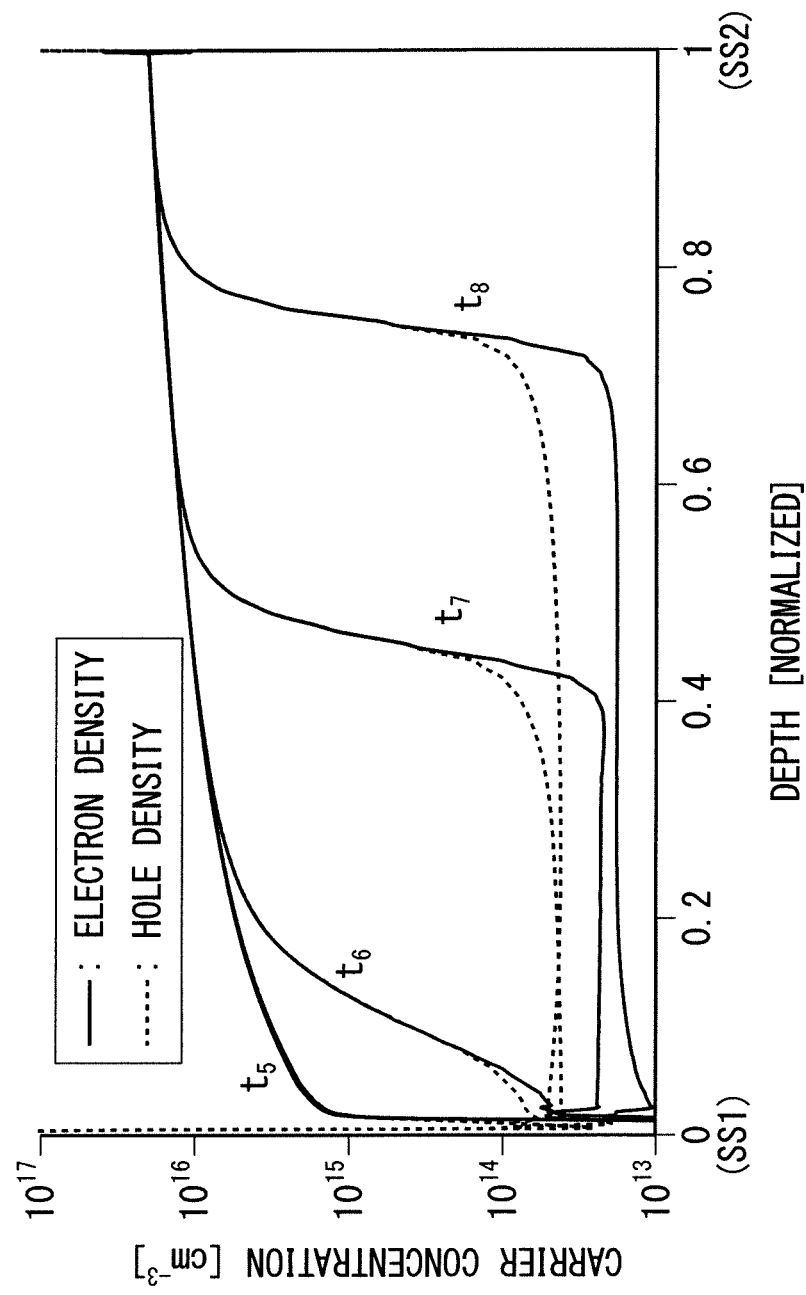
FIG. 11 is a graph showing simulation results of a time-dependent change of carrier concentration distribution from times $t_5$ to $t_8$ that are included in a time period corresponding to a loss component $E_{off2}$ illustrated in FIG. 9 in the cross-section taken along the one-dot chain line of FIG. 4 (Structure I).

The loss component $E_{off2}$ (FIG. 9) is a loss in a time period from completion of electric discharge of a gate-emitter voltage Vge in the mirror zone until the collector-emitter voltage Vce reaches its peak. In this time period, the collector-emitter voltage Vce is increased sharply, and the collector current Ic is sharply reduced after being increased. The loss component $E_{off2}$ takes up the half or more of the entire turn-off loss $E_{off}$. When a peak value of the collector current Ic is raised, loss is increased. Further, when dV/dt of the collector-emitter voltage Vce in this time period is reduced, the switching time period is prolonged, thus increasing loss. FIG. 11 is a graph showing a time-dependent change of carrier concentration distribution from times $t_5$ to $t_8$ that are included in a time period corresponding to the loss component $E_{off2}$ illustrated in FIG. 9 in the cross-section taken along the one-dot chain line of FIG. 4.

Figure 12:
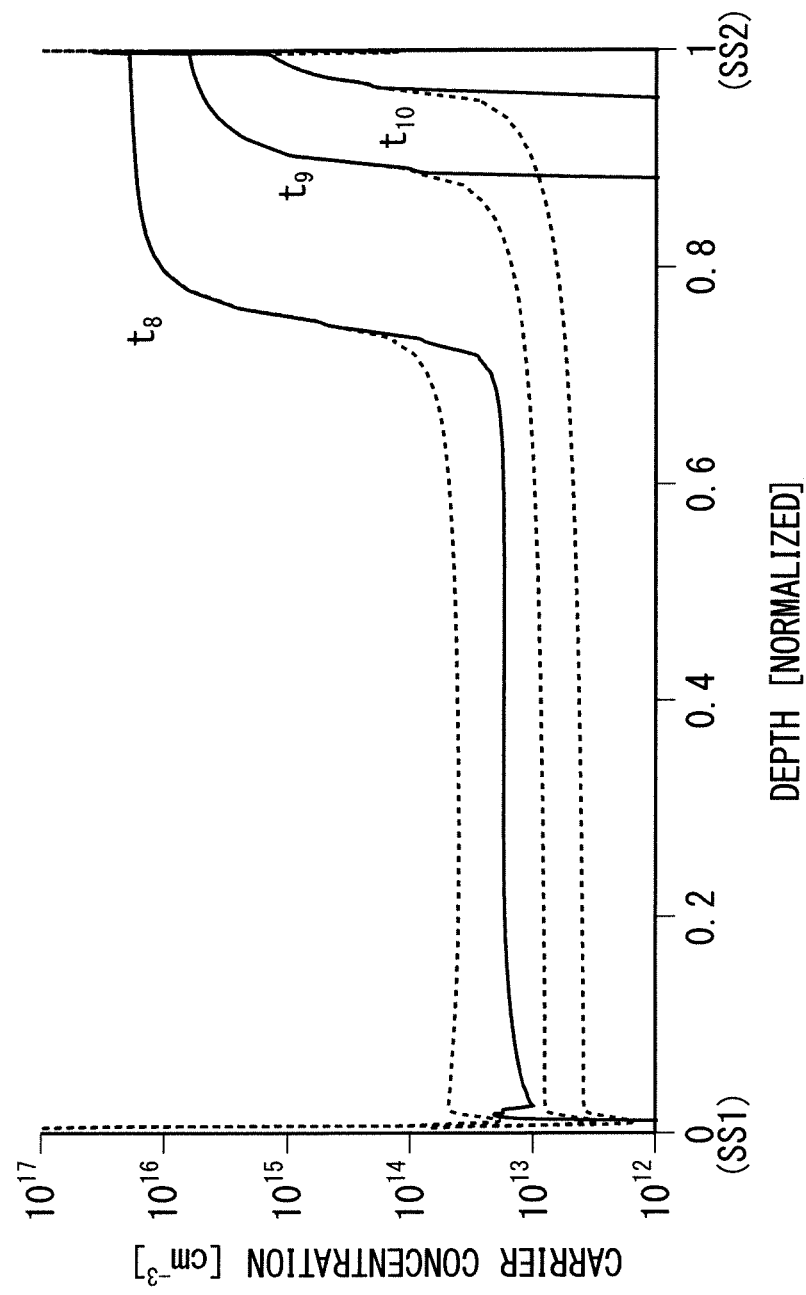
FIG. 12 is a graph showing simulation results a time-dependent change of carrier concentration distribution from times $t_8$ to $t_{10}$ that are included in a time period corresponding to a loss component $E_{off3}$ illustrated in FIG. 9 in the cross-section taken along the one-dot chain line of FIG. 4 (Structure I).

The loss component $E_{off3}$ (FIG. 9) is a loss in a time period from the point of time of the peak of the collector-emitter voltage Vce until complete disappearance of the collector current Ic. In this time period, the collector-emitter voltage Vce is reduced to the power supply voltage Vcc to be substantially fixed thereafter, and the collector current Ic is more gently reduced. In Structure I, the loss component $E_{off3}$ takes up slightly less than the half of the entire turn-off loss $E_{off}$. When carrier concentration on the collector side is reduced, a tail current of the collector current Ic is reduced. Hence, a time period in which the loss component $E_{off3}$ is generated is reduced, thus reducing the loss component $E_{off3}$. FIG. 12 is a graph showing a time-dependent change of carrier concentration distribution from times $t_8$ to $t_{10}$ that are included in a time period corresponding to the loss component $E_{off3}$ illustrated in FIG. 9 in the cross-section taken along the one-dot chain line of FIG. 4.

Now, a switching-time period reducing effect, a turn-off loss reducing effect, and an oscillation suppressing effect according to this preferred embodiment are examined by comparing turn-off waveforms of Structure I to Structure IV (FIG. 4 to FIG. 7) through a simulation. Although detailed description will be given later, in conclusion, Structure IV corresponding to this preferred embodiment particularly reduces the loss component $E_{off1}$ and the loss component $E_{off3}$ out of the turn-off loss $E_{off}$, and therefore the turn-off loss $E_{off}$ can be reduced in total.

Figure 4:
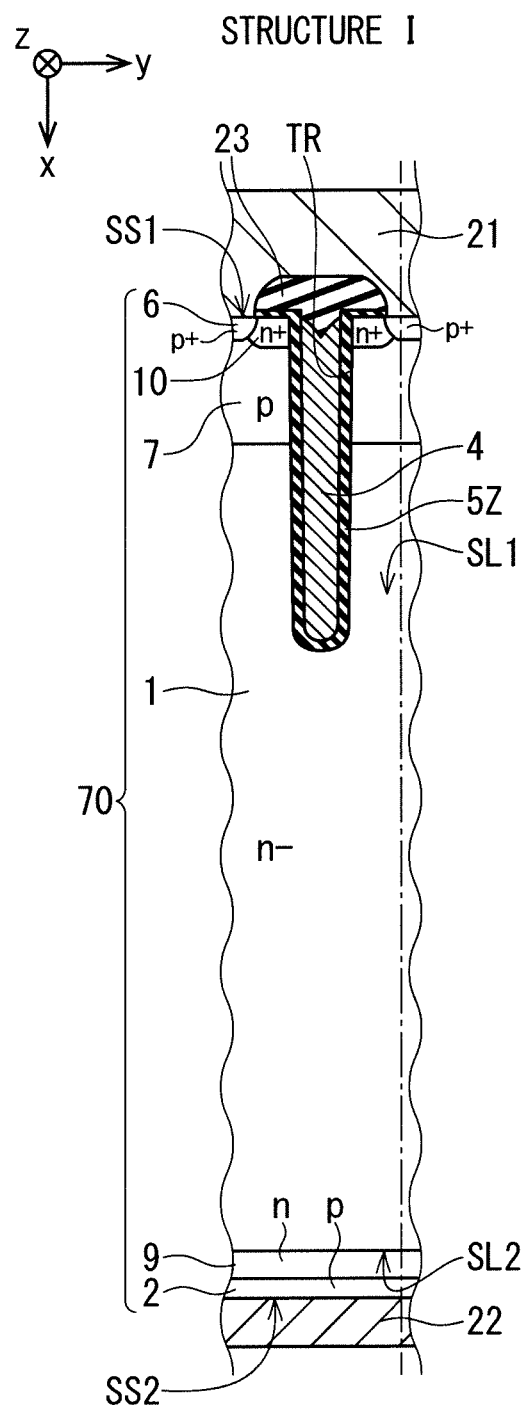
FIG. 4 is a partial cross-sectional view illustrating a configuration of Structure I, which is one of structures for simulating characteristics of the semiconductor device.
Figure 5:
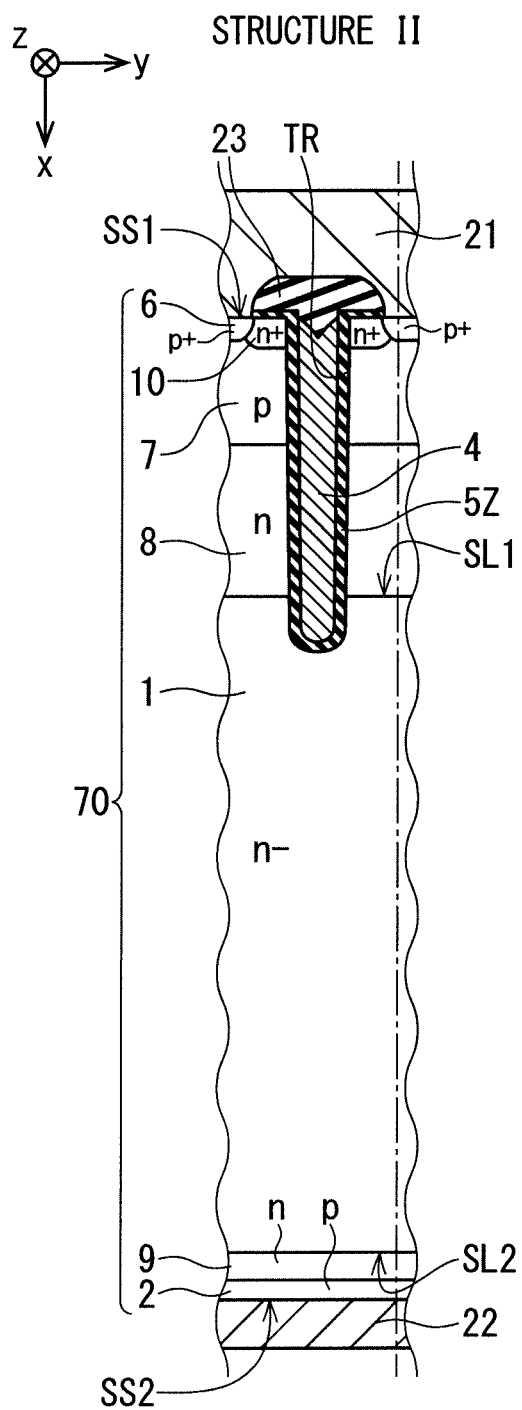
FIG. 5 is a partial cross-sectional view illustrating a configuration of Structure II, which is one of structures for simulating characteristics of the semiconductor device.
Figure 13A:
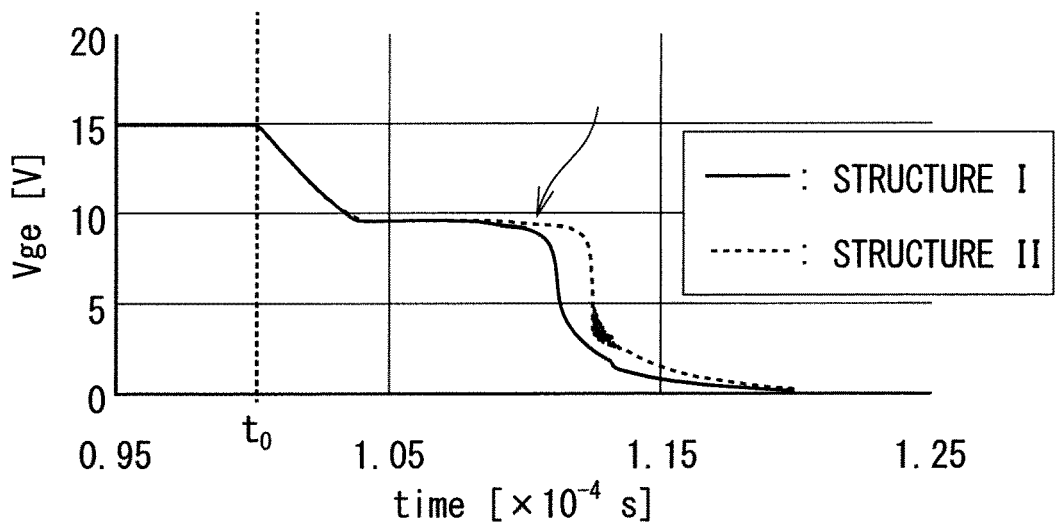
FIGS. 13A to 13C are a graph showing simulation results of a waveform of a gate-emitter voltage Vge, a graph showing simulation results of a waveform of a collector current Ic, and a graph showing simulation results of a waveform of a collector-emitter voltage Vce, respectively, in a turn-off operation of Structure I (FIG. 4) and Structure II (FIG. 5).
Figure 13B:
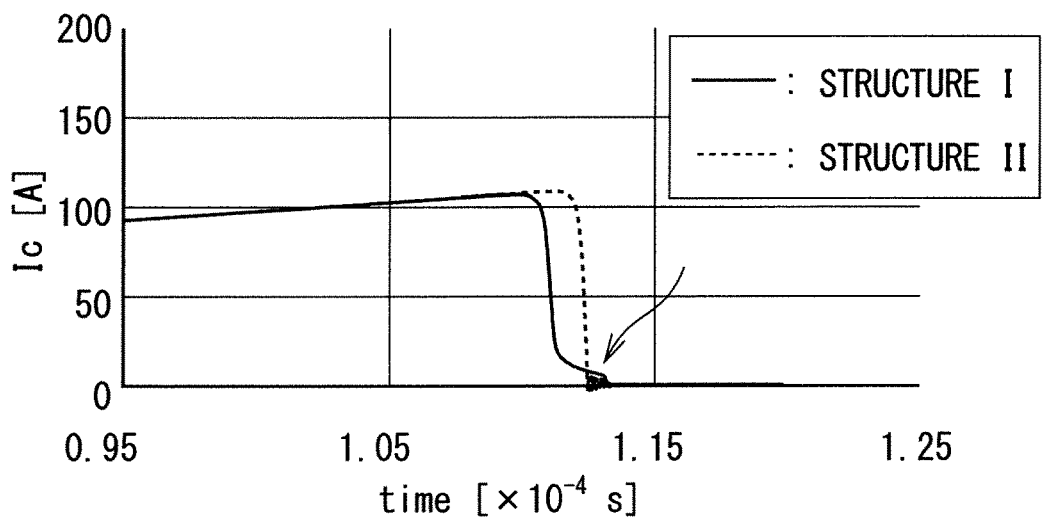
Figure 13C:
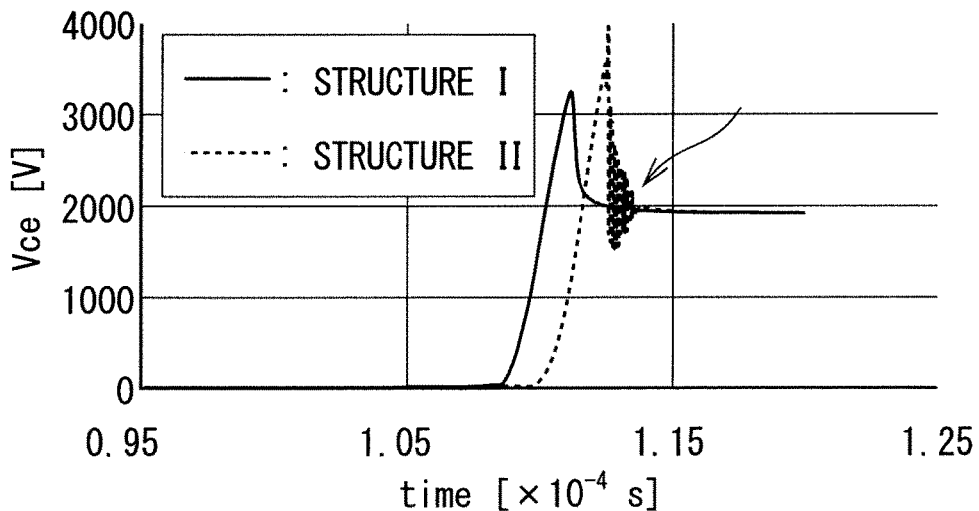

FIGS. 13A to 13C are a graph showing a waveform of the gate-emitter voltage Vge, a graph showing a waveform of the collector current Ic, and a graph showing a waveform of the collector-emitter voltage Vce, respectively, in a turn-off operation of Structure I (FIG. 4) and Structure II (FIG. 5).

Referring to FIG. 13A, Structure II (FIG. 5) has the n-type impurity layer 8, and hence, as compared to Structure I, a mirror zone of a time period corresponding to the loss component $E_{off1}$ (FIG. 9) is prolonged (refer to the arrow in FIG. 13A). Therefore, referring to FIG. 13B, a peak value of the collector current Ic of a time period corresponding to the loss component $E_{off1}$ is raised.

Figure 14:
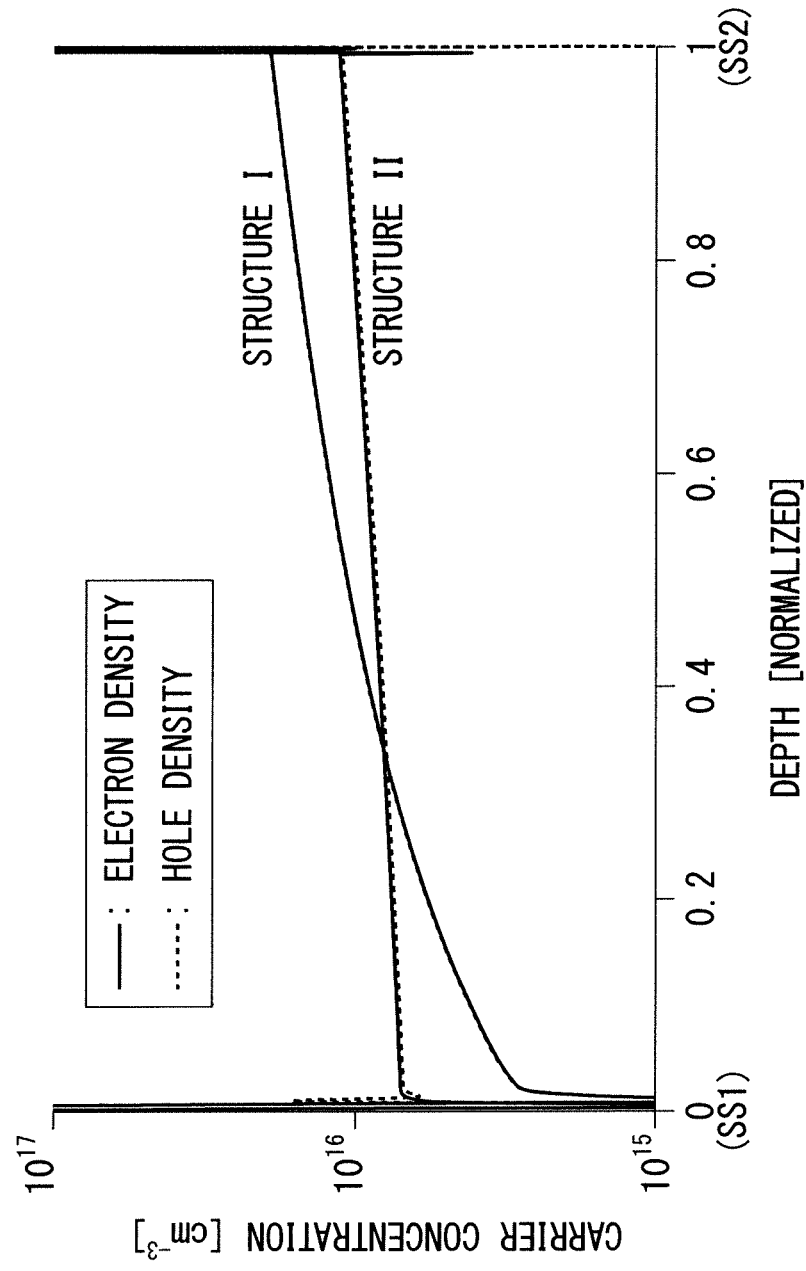
FIG. 14 is a graph showing simulation results of carrier concentration distribution at the time of starting a turn-off in the cross-section taken along each of the one-dot chain lines of FIG. 4 (Structure I) and FIG. 5 (Structure II).

FIG. 14 is a graph showing simulation results of carrier concentration distribution at the time of starting a turn-off in the cross-section taken along each of the one-dot chain lines of FIG. 4 (Structure I) and FIG. 5 (Structure II). As is shown, Structure II has carrier concentration on the emitter side (upper substrate surface SS1 side) higher than that of Structure I. As in the above description of FIG. 9, as carrier concentration on the emitter side is increased, the mirror zone is prolonged and dV/dt in a time period of the loss component $E_{off1}$ is reduced. Therefore, the loss component $E_{off1}$ and the loss component $E_{off2}$ of Structure II are larger than those of Structure I. On the other hand, Structure II has carrier concentration on the collector side (lower substrate surface SS2 side) lower than that of Structure I. As in the above description of FIG. 9, a tail current in a time period the loss component $E_{off3}$ is hardly generated (refer to the arrow in FIG. 13B). Therefore, the loss component $E_{off3}$ of Structure II is smaller than that of Structure I. As the sum total, the turn-off loss $E_{off}$ of Structure II is smaller than that of Structure I. However, the snap-off phenomenon is generated at the time of a turn-off in Structure II, and after that, an oscillation phenomenon is also generated (refer to the arrow in FIG. 13C).

With the above-mentioned details being incorporated, simulation results of the loss component $E_{off1}$ to the loss component $E_{off3}$, the turn-off loss $E_{off}$ being the sum thereof, and the degree of the oscillation phenomenon and the snap-off phenomenon in each of Structure I to Structure IV are shown in the table below.

TABLE 1

| Structure | $E_{off1}$ | $E_{off2}$ | $E_{off3}$ | $E_{off}$ | Oscillation | Snap-off |
|---|---|---|---|---|---|---|
| I | 10% | 50% | 40% | 100% | None | None |
| II | 15% | 55% | 10% | 80% | Large | Large |
| III | 7% | 49% | 40% | 96% | None | None |
| IV | 8% | 50% | 10% | 68% | Small | Small |

Note that, in the table above, the turn-off loss $E_{off}$ of Structure I is normalized to be 100%.

Figure 6:
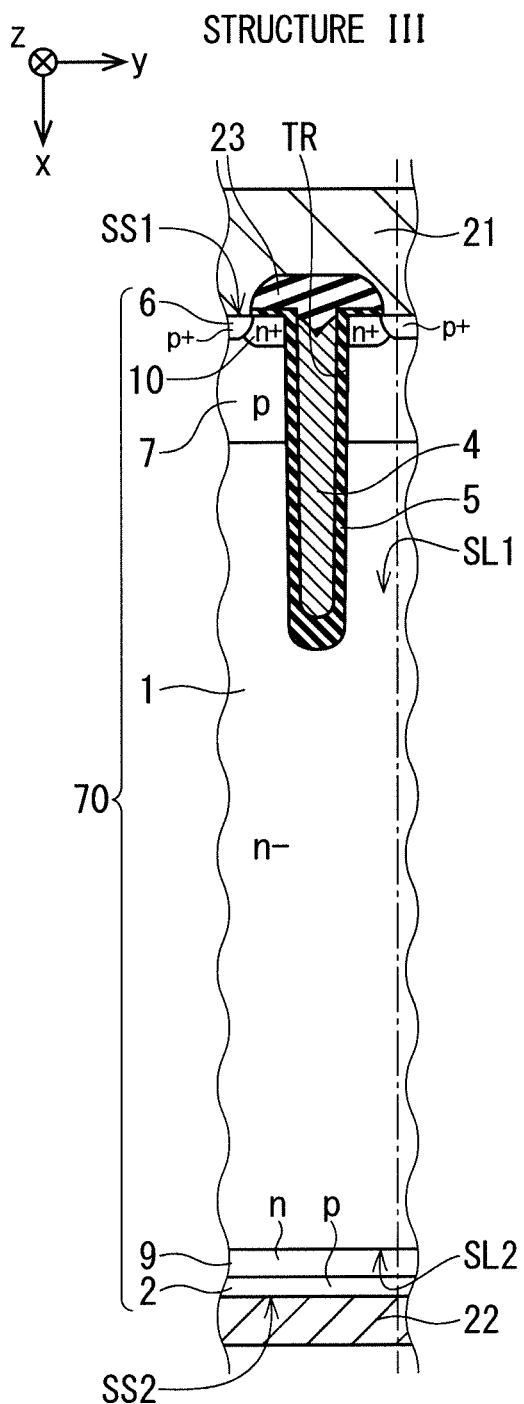
FIG. 6 is a partial cross-sectional view illustrating a configuration of Structure III, which is one of structures for simulating characteristics of the semiconductor device.
Figure 15A:
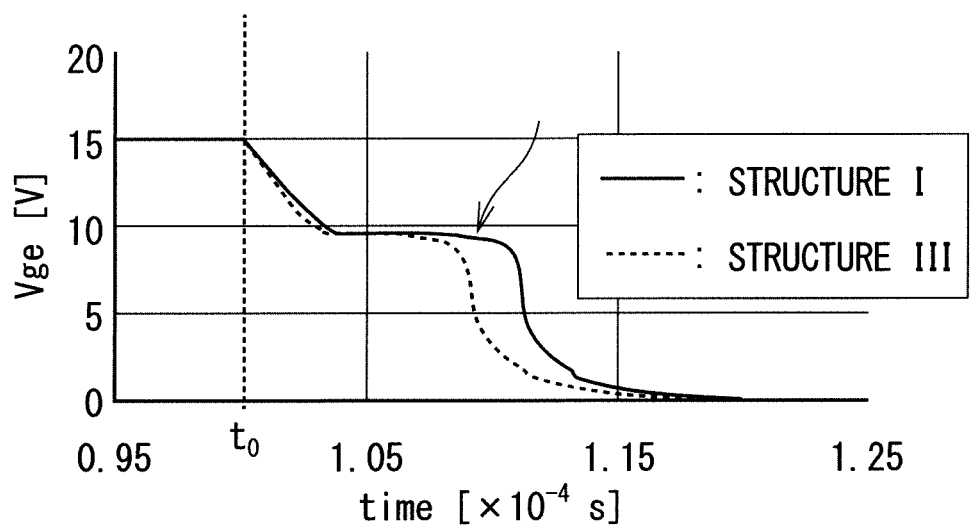
FIGS. 15A to 15C are a graph showing simulation results of a waveform of the gate-emitter voltage Vge, a graph showing simulation results of a waveform of the collector current Ic, and a graph showing simulation results of a waveform of the collector-emitter voltage Vce, respectively, in a turn-off operation of Structure I (FIG. 4) and Structure III (FIG. 6).
Figure 15B:
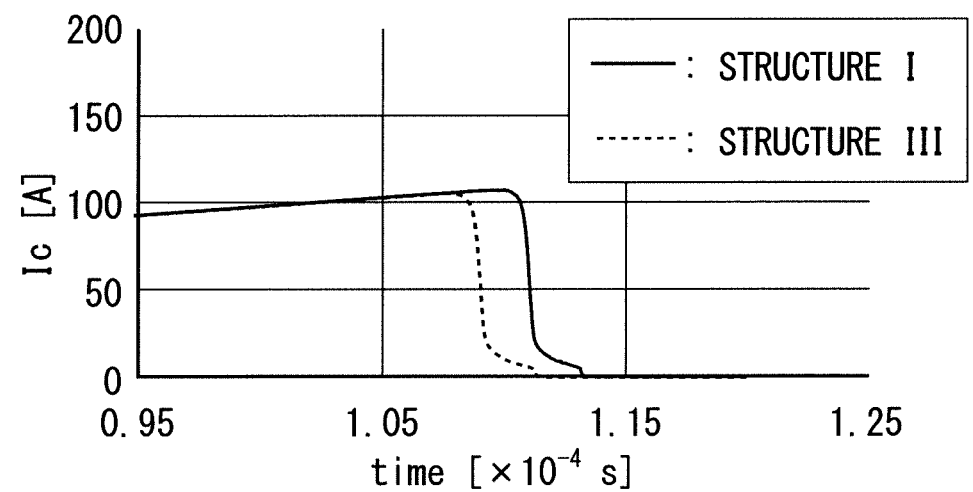
Figure 15C:
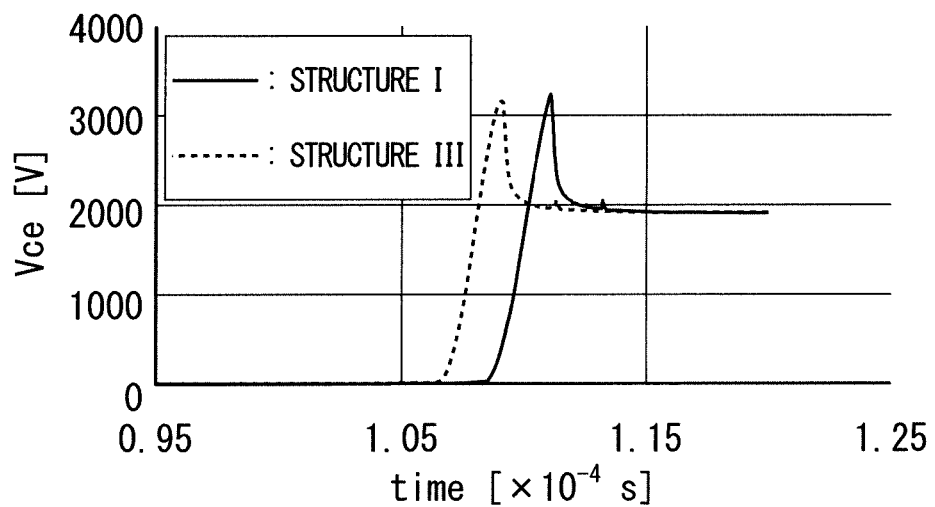

FIGS. 15A to 15C are a graph showing simulation results of a waveform of the gate-emitter voltage Vge, a graph showing simulation results of a waveform of the collector current Ic, and a graph showing simulation results of a waveform of the collector-emitter voltage Vce, respectively, in a turn-off operation of Structure I (FIG. 4) and Structure III (FIG. 6). Structure III (FIG. 6) has the thick gate insulation film 5 on the bottom surface of the trench TR, and hence the mirror zone in a time period of the loss component $E_{off1}$ is shortened (refer to the arrow in FIG. 15A). Due to the influence thereof, a current peak in a time period of the loss component $E_{off2}$ is lowered (refer to FIG. 15B). Structure III and Structure I have almost no difference in turn-off waveforms other than the part described above. As described above, Structure III and Structure I have only small difference in waveforms, and as shown in the table above, values of the turn-off loss $E_{off}$ are also substantially equal to each other. Further, neither Structure III nor Structure I is oscillated. From the above, it is understood that major improvement in turn-off characteristics may not be attained by only increasing the thickness of the gate insulation film on the bottom surface of the trench TR.

Figure 16A:
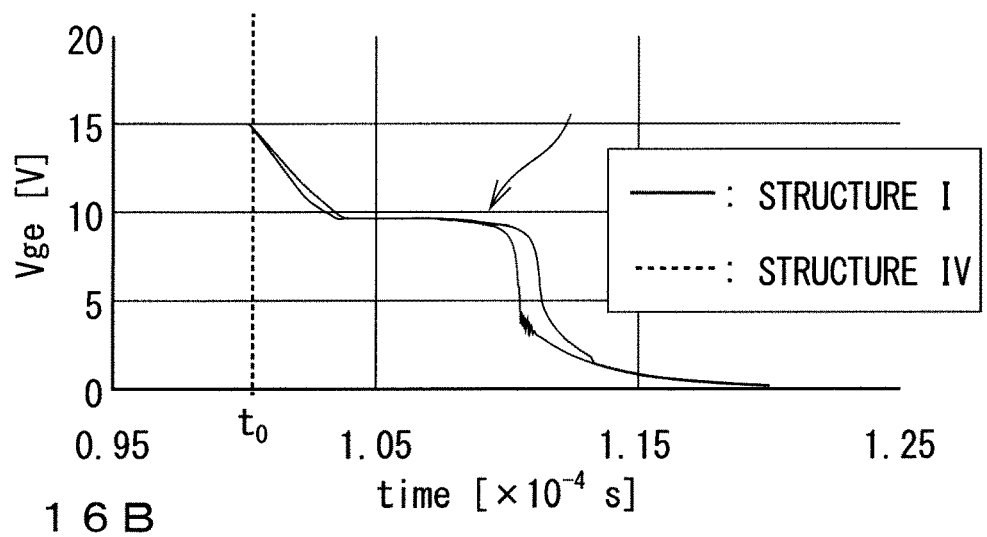
FIGS. 16A to 16C are a graph showing simulation results of a waveform of the gate-emitter voltage Vge, a graph showing simulation results of a waveform of the collector current Ic, and a graph showing simulation results of a waveform of the collector-emitter voltage Vce, respectively, in a turn-off operation of Structure I (FIG. 4) and Structure IV (FIG. 7).
Figure 16B:
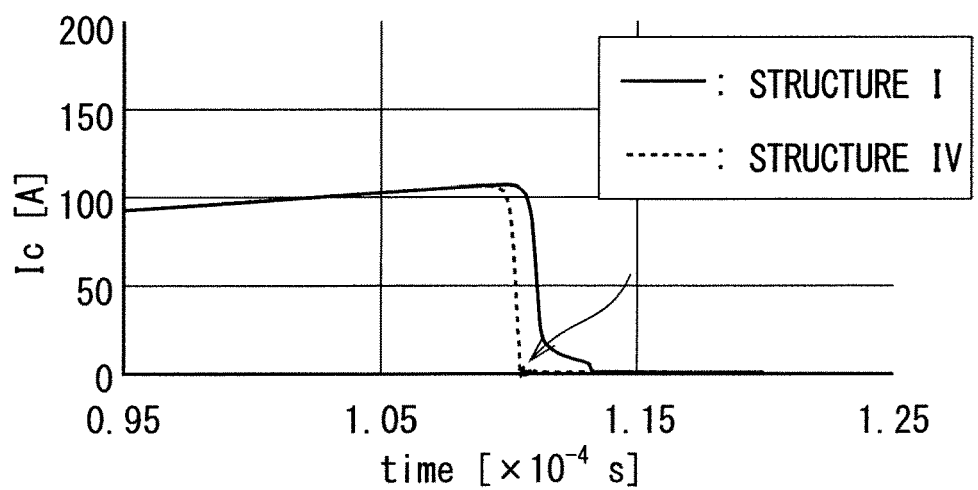
Figure 16C:
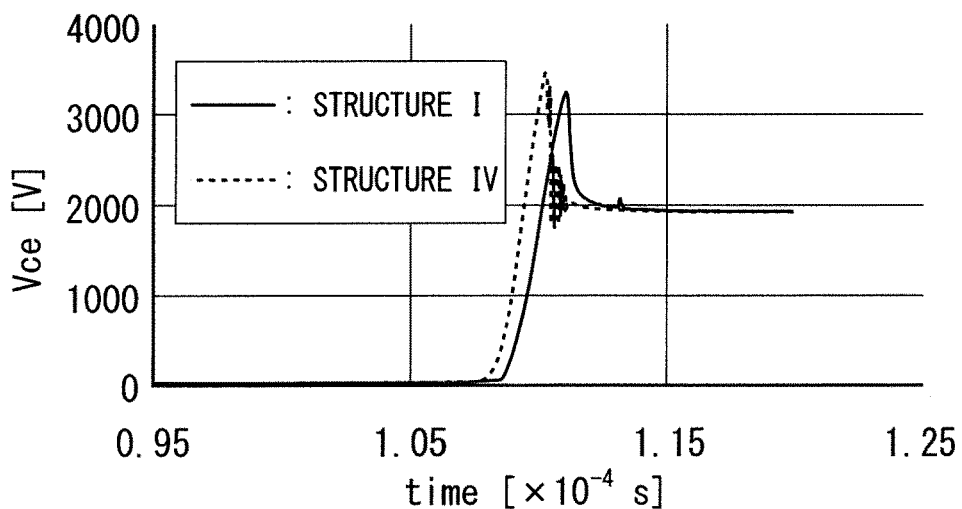
Figure 17:
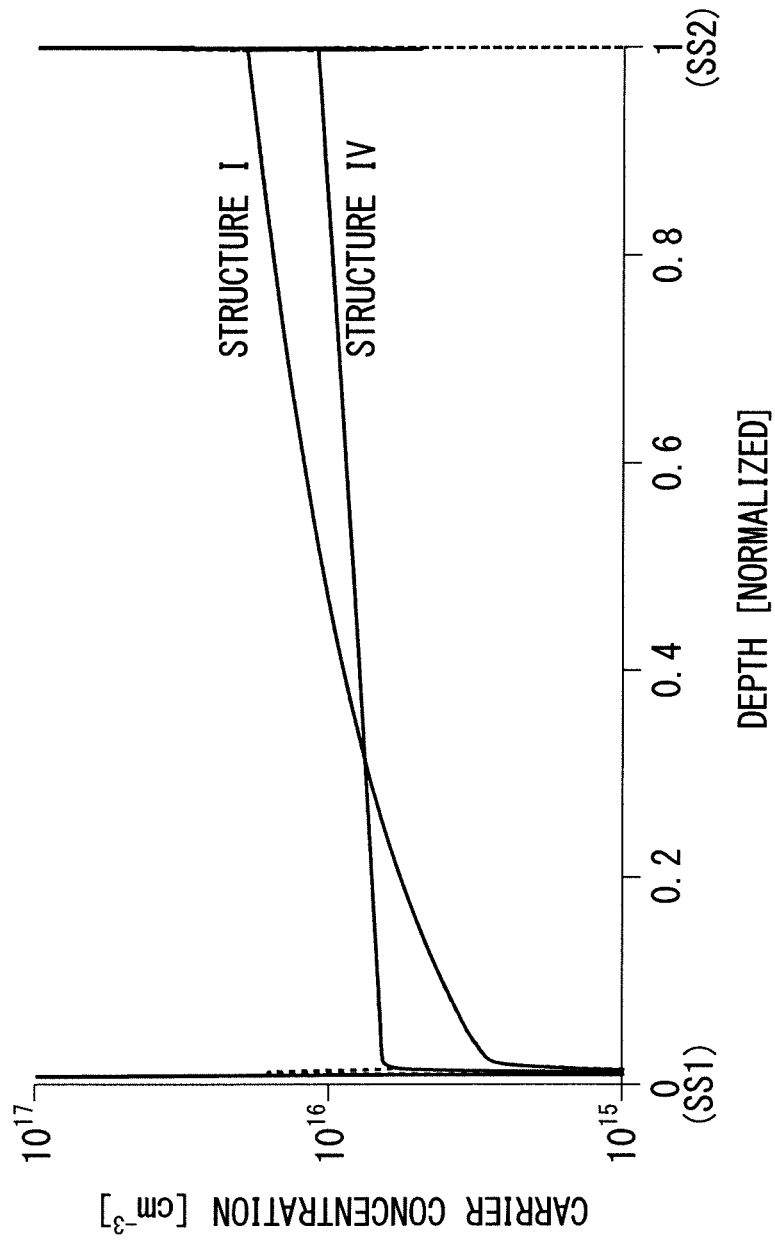
FIG. 17 is a graph showing simulation results of carrier concentration distribution at the time of starting a turn-off in the cross-section taken along each of the one-dot chain lines of FIG. 4 (Structure I) and FIG. 7 (Structure IV).

FIGS. 16A to 16C are a graph showing simulation results of a waveform of the gate-emitter voltage Vge, a graph showing simulation results of a waveform of the collector current Ic, and a graph showing simulation results of a waveform of the collector-emitter voltage Vce, respectively, in a turn-off operation of Structure I (FIG. 4) and Structure IV (FIG. 7). Although Structure IV (FIG. 7) has the n-type impurity layer 8, it also has the thick gate insulation film 5 on the bottom surface of the trench TR. Hence, the mirror zone in a time period of the loss component $E_{off1}$ is shortened (refer to the arrow in FIG. 16A). Due to the influence thereof, the loss component $E_{off1}$ is reduced. FIG. 17 is a graph showing simulation results of carrier concentration distribution at the time of starting a turn-off in the cross-section taken along each of the one-dot chain lines of FIG. 4 (Structure I) and FIG. 7 (Structure IV). Structure IV has carrier concentration higher on the emitter side upper substrate surface SS1 side), and hence, as in the above description of FIG. 9, dV/dt in a time period of the loss component $E_{off1}$ is small. As a result, the loss component $E_{off1}$ is further reduced. Further, concentration in the p-type collector region 2 provided on the collector side (lower substrate surface SS2 side) of Structure IV is low, and therefore similarly to Structure II, a tail current is hardly generated in a time period of the loss component $E_{off3}$, thus reducing the loss component $E_{off3}$.

Figure 18A:
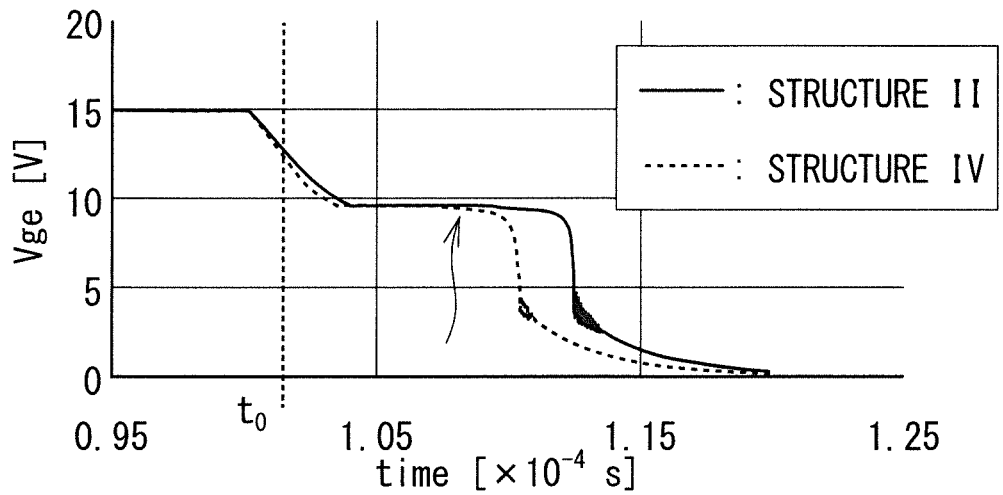
FIGS. 18A to 18C are a graph showing simulation results of a waveform of the gate-emitter voltage Vge, a graph showing simulation results of a waveform of the collector current Ic, and a graph showing simulation results of a waveform of the collector-emitter voltage Vce, respectively, in a turn-off operation of Structure II (FIG. 5) and Structure IV (FIG. 7).
Figure 18B:
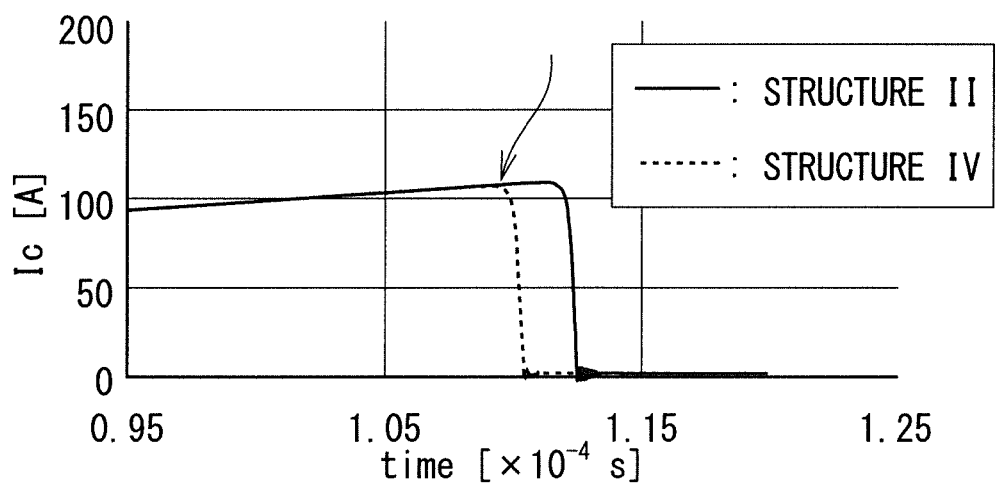
Figure 18C:
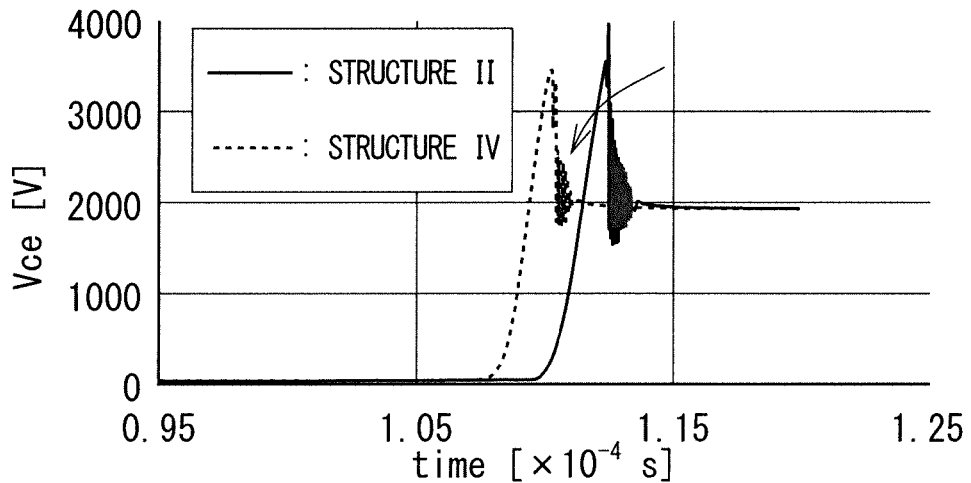

FIGS. 18A to 18C are a graph showing simulation results of a waveform of the gate-emitter voltage Vge, a graph showing simulation results of a waveform of the collector current Ic, and a graph showing simulation results of a waveform of the collector-emitter voltage Vce, respectively, in a turn-off operation of Structure II (FIG. 5) and Structure IV (FIG. 7). A mirror zone of Structure IV (FIG. 7) is shorter than that of Structure II (FIG. 5) (refer to the arrow in FIG. 18A). For this reason, according to Structure IV, a current peak in a time period of the loss component $E_{off2}$ is lowered, thus reducing the loss component $E_{off1}$ and the loss component $E_{off2}$. Further, Structure IV (FIG. 7) has the thick gate insulation film 5 on the bottom surface of the trench TR, and hence the gate-collector parasitic capacitance Cgc (FIG. 8) is reduced, thereby suppressing the oscillation phenomenon and the snap-off phenomenon.

As is apparent from the above description, as shown in the table above, according to Structure IV corresponding to this preferred embodiment, the lowest turn-off loss $E_{off}$ can be realized and the oscillation phenomenon and the snap-off phenomenon can be suppressed.

(Characteristics Other than Switching Characteristics)

Figure 19A:
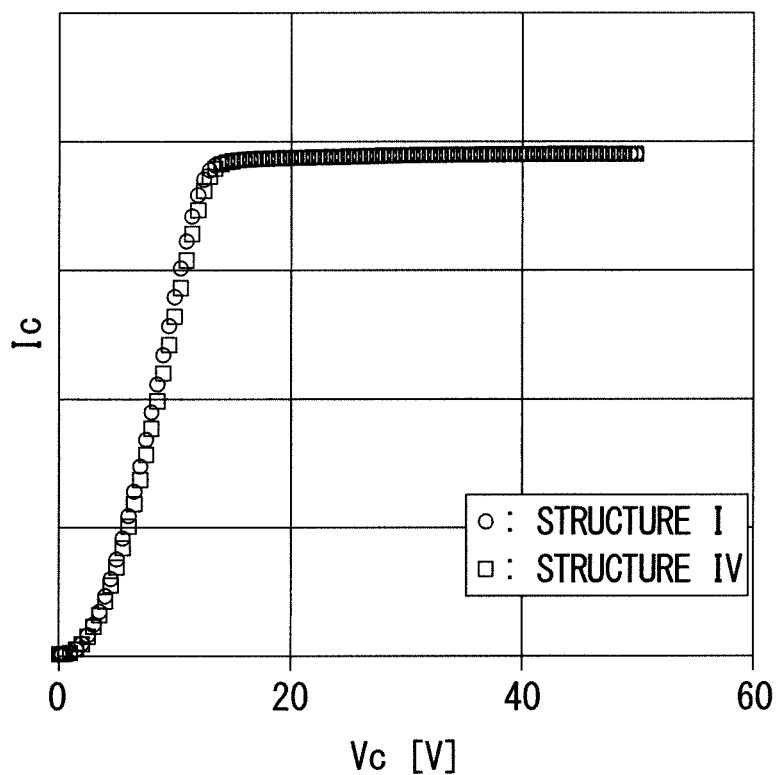
FIGS. 19A and 19B are a graph showing simulation results of the relationship between a collector voltage Vc and the collector current Ic and a graph showing simulation results of the relationship between the gate-emitter voltage Vge and the collector current Ic, respectively, in each of Structure I (FIG. 4) and Structure IV (FIG. 7).
Figure 19B:
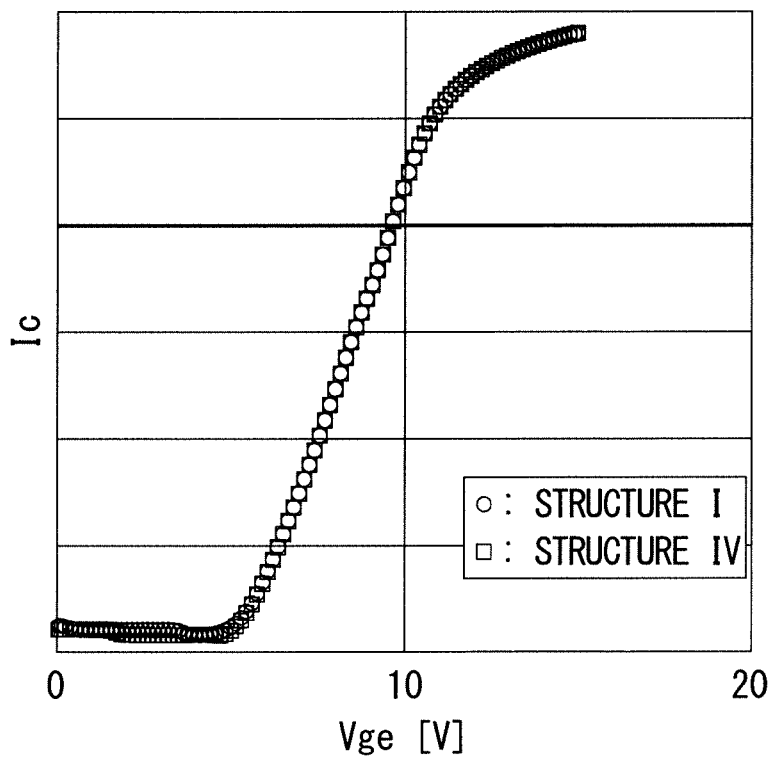

FIGS. 19A and 19B are a graph showing simulation results of the relationship between a collector voltage Vc and the collector current Ic and a graph showing simulation results of the relationship between the gate-emitter voltage Vge and the collector current Ic, respectively, in each of Structure I (FIG. 4) and Structure IV (FIG. 7). Structure IV corresponding to this preferred embodiment has, as compared to Structure I, similar characteristics in respect of Ic-Vc characteristics and Ic-Vge characteristics.

(Relationship Between Depth d and Depth $X_{jn}$)

Figure 20:
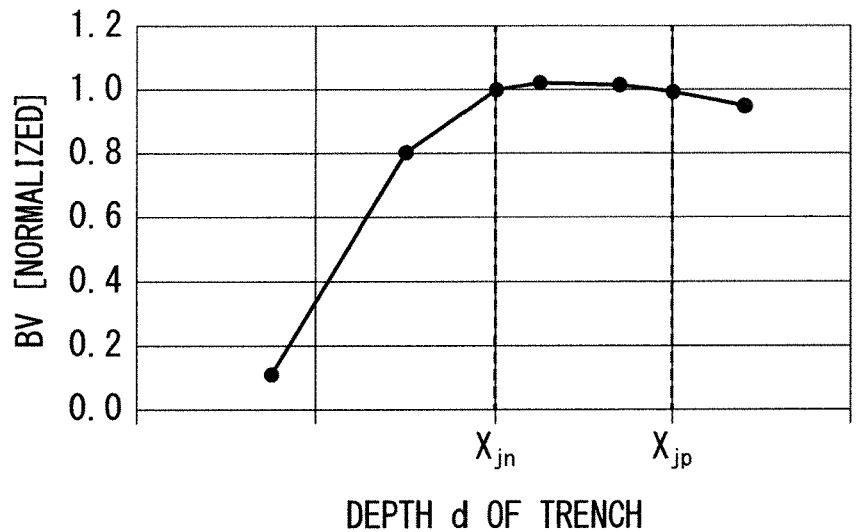
FIG. 20 is a graph showing simulation results of the relationship between a depth of a trench and a breakdown voltage.

FIG. 20 is a graph showing simulation results of the relationship between the depth d (FIG. 2) of the trench TR and a breakdown voltage BV. Note that, in a horizontal axis representing the depth d, a value of the depth $X_{jn}$ of the n-type impurity layer 8 and a value of the depth $X_{jp}$ of the p$^+$-type impurity layer 11 are shown as reference indications. Further, the breakdown voltage BV is normalized by a value obtained when the depth d is equal to the depth $X_{jn}$.

When the depth d is smaller than the depth $X_{jn}$, the breakdown voltage BV is reduced. The reason is considered that a field plate effect of the trench TR is reduced. Further, when the depth d of the trench is larger than the depth $X_{jp}$ of the p$^+$-type impurity layer 11, the breakdown voltage BV is reduced. The reason is considered that electric field intensity of the end portion TRe (FIG. 3) of the trench TR on the bottom surface is increased. From the above, in order to obtain a high breakdown voltage BV, it is preferred that the depth d satisfy the relationship of Expression (1.1) below.

$$X_{jn} < d < X_{jp} \tag{1.1}$$

(Preferred Value of Ratio $r = X_g/X_{jn}$)

Figure 21:
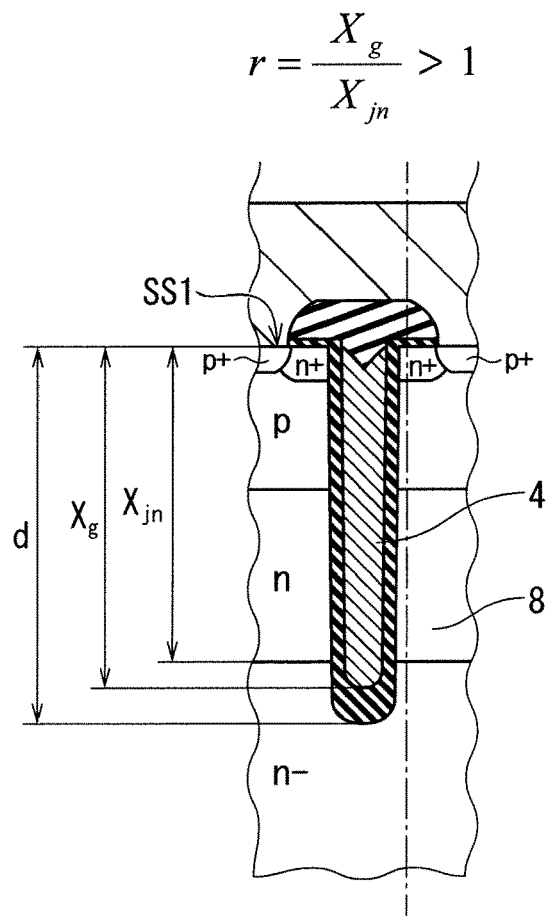
FIG. 21 is a partial cross-sectional view schematically illustrating a configuration of Structure IV (FIG. 7) on an emitter side in a case where a ratio $r=X_g/X_{jn}$ is larger than 1.
Figure 22:
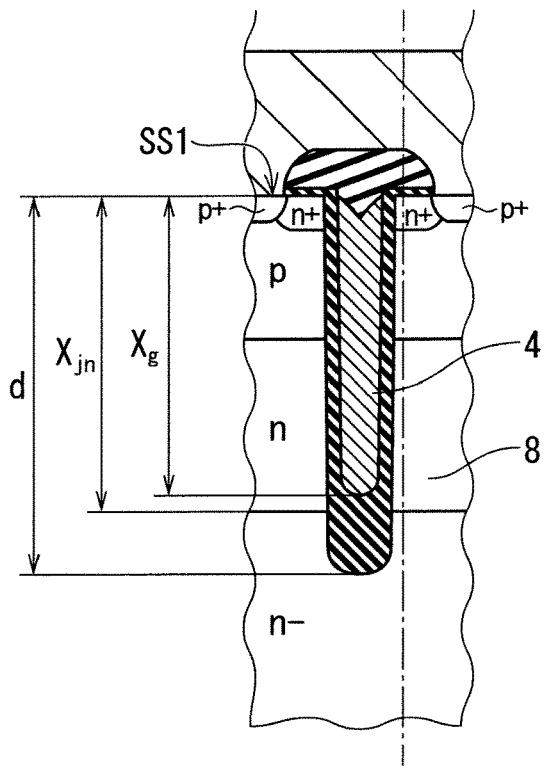
FIG. 22 is a partial cross-sectional view schematically illustrating a configuration of Structure IV (FIG. 7) on the emitter side in a case where the ratio $r=X_g/X_{jn}$ is smaller than 1.

FIG. 21 and FIG. 22 are partial cross-sectional views schematically illustrating configurations of Structure IV on the emitter side in cases where the ratio $r = X_g/X_{jn}$ is larger than 1 and smaller than 1, respectively, under the condition that the depth d of the trench TR is fixed. As described above, the ratio r is a ratio of the depth $X_g$ of the gate electrode 4 to the depth $X_{jn}$ of the n-type impurity layer 8 (refer to FIG. 1). Note that, in order to form Structure IV (FIG. 7) under the condition that the depth d is fixed, the ratio r needs to be smaller than an upper limit value, and when the ratio r reaches the upper limit value, Structure II (FIG. 5) is formed instead of Structure IV.

Figure 23:
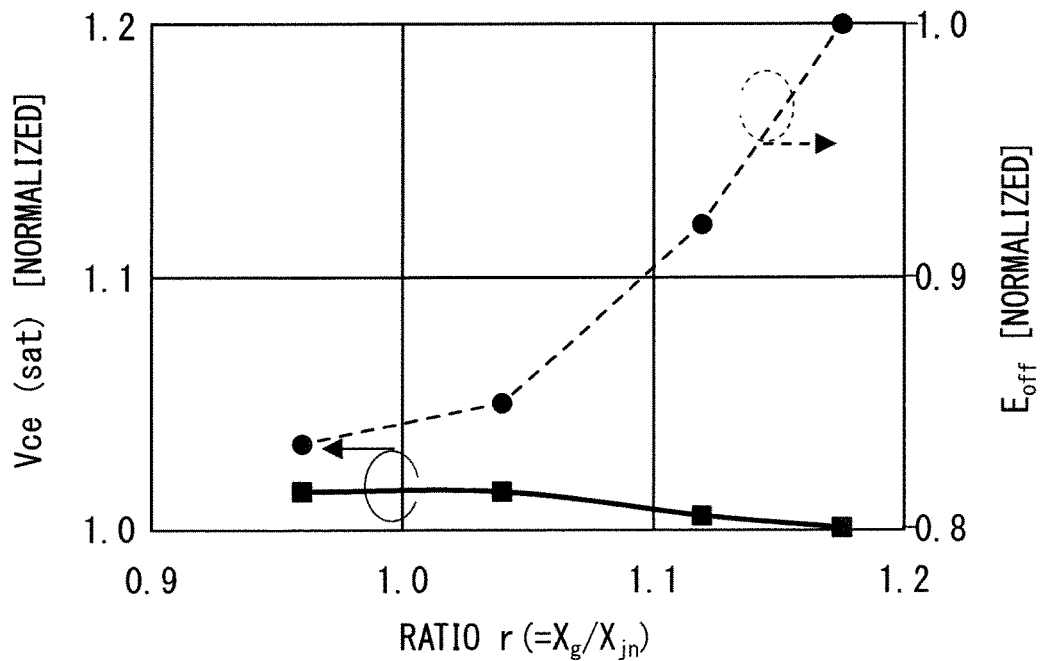
FIG. 23 is a graph showing simulation results of the relationship between the ratio $r=X_g/X_{jn}$ and each of an on-voltage Vce(sat) and turn-off loss $E_{off}$.

FIG. 23 is a graph showing simulation results of the relationship between the ratio r and each of an on-voltage Vce(sat) and the turn-off loss $E_{off}$. Note that, vertical axes of the graph are normalized by the value of the rightmost of the plots that correspond to Structure II. When the ratio r is changed from the largest value in the graph (corresponding to Structure II) to a smaller value (Structure IV), the turn-off loss $E_{off}$ can be largely suppressed, and accompanying increase in the on-voltage Vce(sat) is only slight. For example, when the ratio r is changed from the largest value to the smallest value in the graph, the turn-off loss $E_{off}$ can be suppressed by approximately 17%, and accompanying increase in the on-voltage Vce(sat) is as slight as approximately 1%. From the above, the ratio r needs to be a value smaller than a value corresponding to Structure II.

Figure 24:
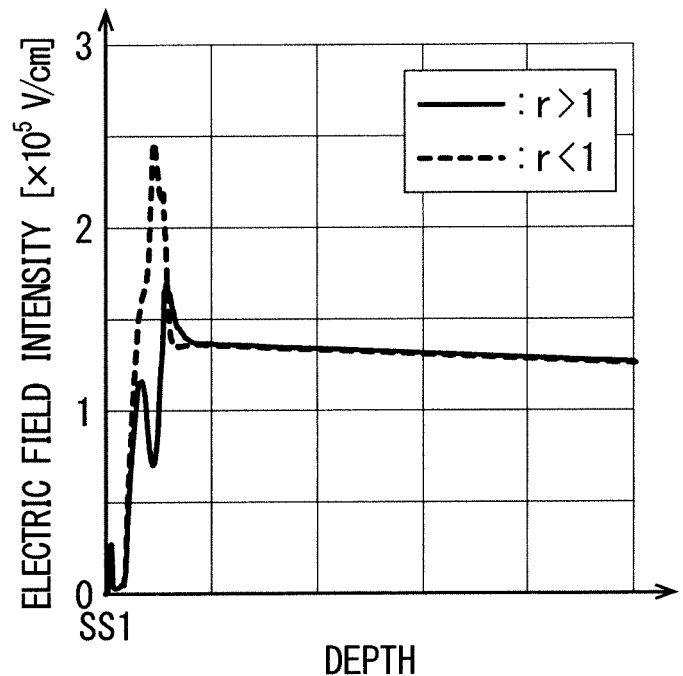
FIG. 24 is a graph showing simulation results of the relationship between the depth from a first substrate surface of a semiconductor substrate and electric field intensity along each of the one-dot chain lines of FIG. 21 and FIG. 22.
Figure 25:
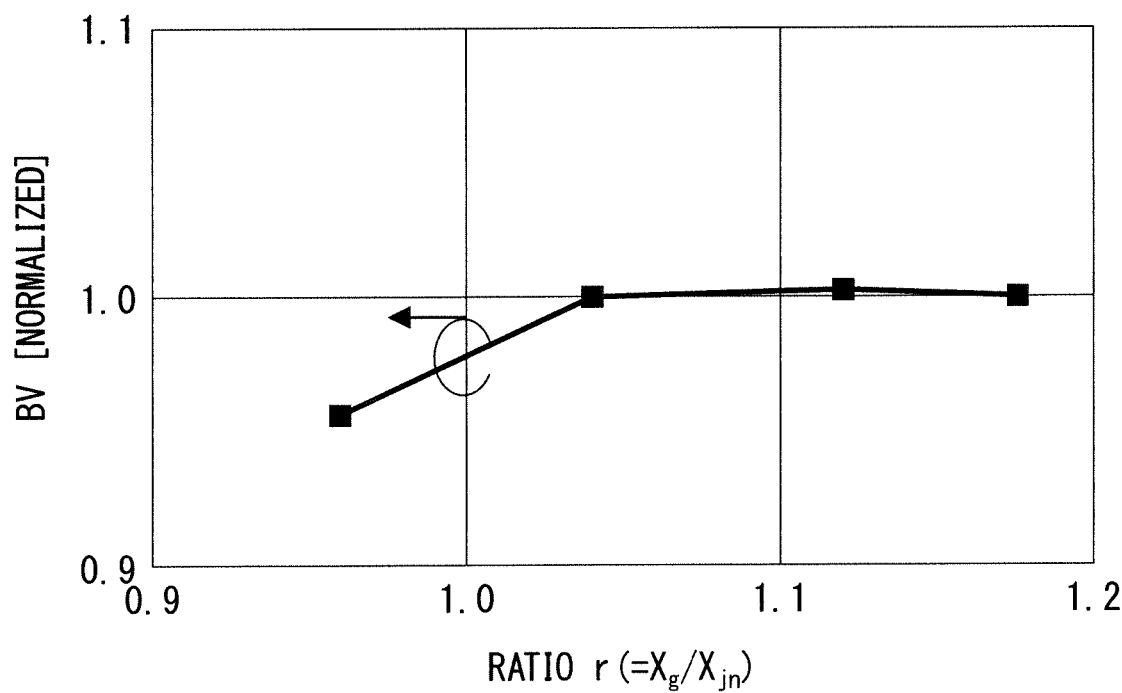
FIG. 25 is a graph showing simulation results of the relationship between the ratio $r=X_g/X_{jn}$ and a breakdown voltage BV.

FIG. 24 is a graph showing simulation results of the relationship between the depth from the upper substrate surface SS1 and electric field intensity along each of the one-dot chain lines of FIG. 21 and FIG. 22. Note that, the collector-emitter voltage is fixed. In a case where the ratio r<1, that is, in a case where the depth d is smaller than the depth $X_{jn}$, a field plate effect of the trench TR is reduced, and hence electric field intensity on the emitter side (upper substrate surface SS1 side) is increased. As a result, the breakdown voltage is reduced. FIG. 25 is a graph showing simulation results of the relationship between the ratio r and the breakdown voltage BV. In a case where the ratio r<1, it is understood that the breakdown voltage BV is reduced. From the above, in order to secure a high breakdown voltage, it is preferred that the ratio $r = X_g/X_{jn}$ satisfy the relationship below.

$$r > 1 \tag{1.2}$$

(Correlation between Depth $X_g$, Depth $X_{jn}$, Width w, and Thickness $t_{sd}$)

Figure 26:
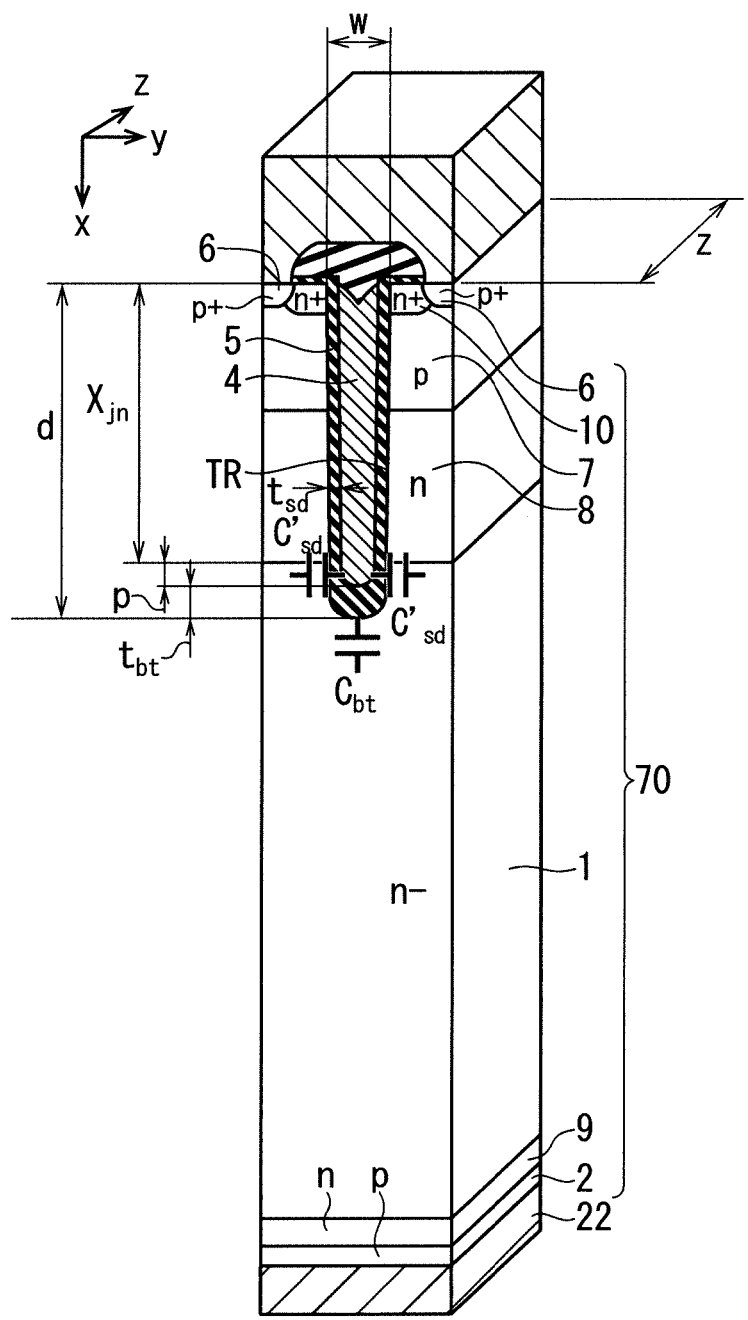
FIG. 26 is a partial cross-sectional perspective view illustrating the definition of dimensions in a trench gate structure of the semiconductor device.

FIG. 26 is a partial cross-sectional perspective view illustrating the definition of dimensions in a trench gate structure of the IGBT 91. The trench TR has a width w as a dimension in the y-axis direction in the drawing. Further, the trench TR has a length z as a dimension in the z-axis direction in the drawing. Further, the gate electrode 4 is provided until the position deeper than the depth $X_{jn}$ of the n-type impurity layer 8 by a dimension p. The definition of other dimensions is as described above. The depth-related dimensions have, based on each definition thereof, the relationship below.

$$t_{bt} = d - X_{jn} - p \quad (1.3)$$

In this preferred embodiment, a premise is made that the gate insulation film 5 has the dimensional relationship below.

$$t_{bt} > t_{sd} \quad (1.4)$$

Based on Expression (1.3) and Expression (1.4), the expression below is satisfied.

$$d - X_{jn} - p > t_{sd} \quad (1.5)$$

Through modification of the expression above, the expression below is deduced.

$$d - X_{jn} - p > t_{sd} \quad (1.6)$$
$$\therefore X_{jn} + p < d - t_{sd}$$
$$\therefore \frac{X_{jn} + p}{X_{jn}} < \frac{d - t_{sd}}{X_{jn}}$$

Here, the depth $X_g$ of the gate electrode 4 is the sum of the depth $X_{jn}$ of the n-type impurity layer 8 and the dimension p, and hence the ratio r is expressed also by the expression below.

$$r = \frac{p + X_{jn}}{X_{jn}}$$

Based on the expression above and Expression (1.6) above, the expression below is deduced.

$$r < \frac{d - t_{sd}}{X_{jn}} \quad (1.7)$$

Figure 27:
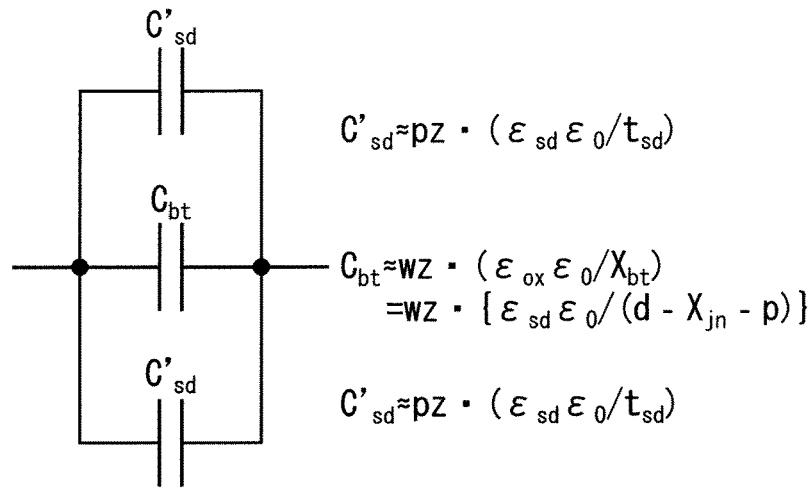
FIG. 27 is an explanatory diagram illustrating an equivalent circuit of parasitic capacitance of FIG. 26.

FIG. 27 is an explanatory diagram illustrating an equivalent circuit of parasitic capacitance of FIG. 26. Between a portion of the gate electrode 4 having the dimension p and the n⁻-type drift layer 1, a pair of parasitic capacitances $C'_{sd}$ and parasitic capacitance $C_{bt}$ are formed. The pair of parasitic capacitances $C'_{sd}$ corresponds to each parasitic capacitance on the right side and on the left side of the side wall surface of the trench TR in the drawing. Those parasitic capacitances are connected in parallel, and hence a total of those parasitic capacitances makes total parasitic capacitance $C_{total}$. Further, a total of the pair of parasitic capacitances $C'_{sd}$, that is, a double of the parasitic capacitance $C'_{sd}$, is defined as $C_{sd}$. When relative permittivity of the gate insulation film 5 is defined as $\varepsilon_{ox}$ and permittivity in a vacuum as $\varepsilon_0$, the parasitic capacitance $C_{bt}$ and the parasitic capacitance $C_{sd}$ are expressed as below.

$$C_{bt} \approx w \cdot z \cdot \frac{\varepsilon_{ox}\varepsilon_0}{t_{bt}} \quad (1.8)$$
$$= w \cdot z \cdot \frac{\varepsilon_{ox}\varepsilon_0}{d - X_{jn} - p}$$

$$C_{sd} \approx 2p \cdot z \cdot \frac{\varepsilon_{ox}\varepsilon_0}{t_{sd}} \quad (1.9)$$

Based on Expression (1.8), the parasitic capacitance $C_{bt}$ and the dimension p have the reciprocal of the linear function, and has correlation with d, $X_{jn}$, and w. Further, based on Expression (1.9), the parasitic capacitance $C_{sd}$ is in direct proportion to the dimension p.

In this preferred embodiment, switching characteristics are made further excellent through reduction of the parasitic capacitance $C_{bt}$ formed in the bottom surface of the trench TR. Specifically, a parameter is selected so as to satisfy the relationship of $C_{bt} < C_{sd}$ for the reason to be described later in detail. This relationship is expressed as below through use of Expression (1.8) and Expression (1.9).

$$w \cdot z \cdot \frac{\varepsilon_{ox}\varepsilon_0}{d - X_{jn} - p} < 2p \cdot z \cdot \frac{\varepsilon_{ox}\varepsilon_0}{t_{sd}} \quad (1.10)$$
$$\therefore \frac{w}{d - X_{jn} - p} < \frac{2p}{t_{sd}}$$
$$\therefore w \cdot t_{sd} < 2p \cdot (d - X_{jn} - p)$$
$$2p^2 - 2(d - X_{jn})p + w \cdot t_{sd} < 0$$

Based on Expression (1.10), the dimension p falls within the range below.

$$\frac{(d - X_{jn}) - \sqrt{(d - X_{jn})^2 - 2w \cdot t_{sd}}}{2} < \quad (1.11)$$
$$p < \frac{(d - X_{jn}) + \sqrt{(d - X_{jn})^2 - 2w \cdot t_{sd}}}{2}$$

Figure 28:
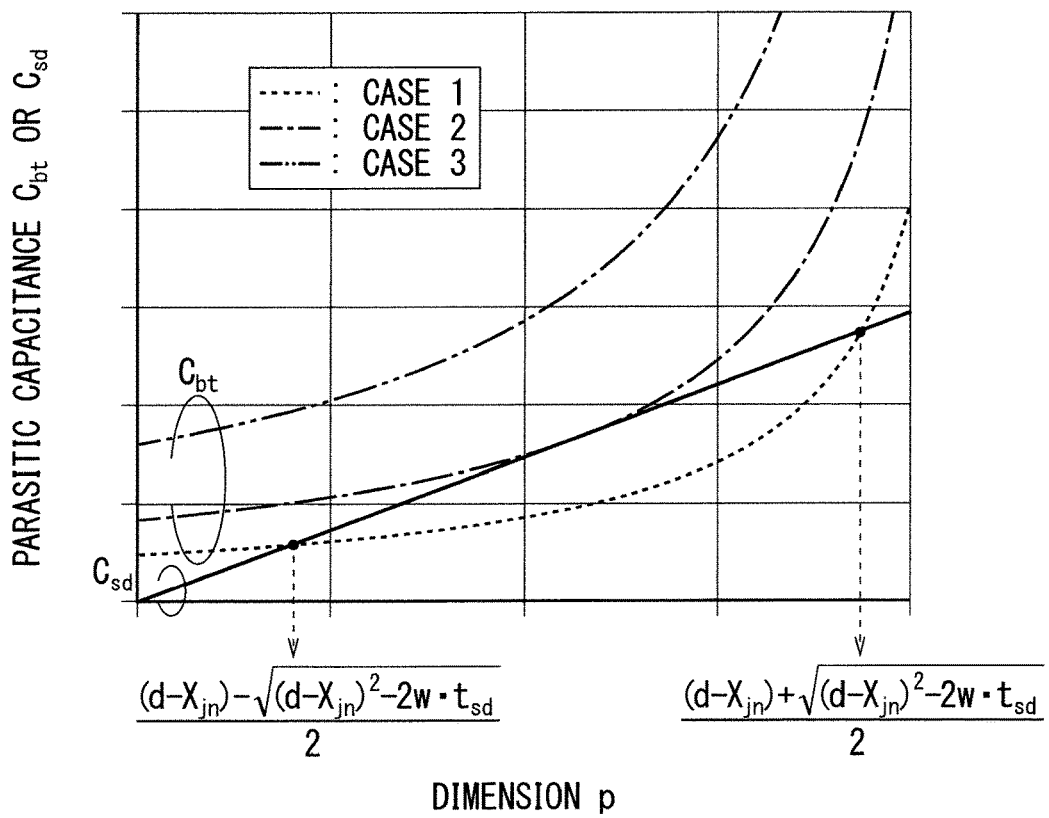
FIG. 28 is a graph showing the relationship between a dimension p and the parasitic capacitance under the condition that a dimension $t_{sd}$ of FIG. 26 is fixed.

FIG. 28 is a graph showing the relationship between the dimension p and the parasitic capacitance under the condition that the thickness $t_{sd}$ is fixed. As described above, the parasitic capacitance $C_{sd}$ is in direct proportion to the dimension p. On the other hand, the parasitic capacitance $C_{bt}$ is expressed by Expression (1.11), and hence is shown in divided Cases 1 to 3 below.

$$(d - X_{jn})^2 - 2w \cdot t_{sd} > 0 \quad \text{Case 1:}$$
$$(d - X_{jn})^2 - 2w \cdot t_{sd} = 0 \quad \text{Case 2:}$$
$$(d - X_{jn})^2 - 2w \cdot t_{sd} < 0 \quad \text{Case 3:}$$

In view of the graph of FIG. 28, in order to satisfy the above-mentioned relationship of $C_{bt} < C_{sd}$, Case 1 needs to be adopted. That is, the expression below needs to be satisfied.

$$(d - X_{jn})^2 - 2w \cdot t_{sd} > 0$$

Through modification of the expression above, the expression below is obtained.

$$(d - X_{jn})^2 > 2w \cdot t_{sd} \quad (1.12)$$

Under the condition of Expression (1.12), the relationship between the depth $X_{jn}$ and the sum of the dimension p and the depth $X_{jn}$ (that is, the depth $X_g$ of the gate electrode 4) is expressed as below based on Expression (1.11).

$$\frac{(d - X_{jn}) - \sqrt{(d - X_{jn})^2 - 2w \cdot t_{sd}}}{2} + X_{jn} <$$
$$p + X_{jn} < \frac{(d - X_{jn}) + \sqrt{(d - X_{jn})^2 - 2w \cdot t_{sd}}}{2} + X_{jn}$$

-continued $$\therefore \frac{(d-X_{jn}) - \sqrt{(d-X_{jn})^2 - 2w \cdot t_{sd}}}{2X_{jn}} + 1 < \frac{p+X_{jn}}{X_{jn}} <$$

$$\frac{(d-X_{jn}) + \sqrt{(d-X_{jn})^2 - 2w \cdot t_{sd}}}{2X_{jn}} + 1$$

Based on the relationship above, it is preferred that the ratio $r=(p+X_{jn})/X_{jn}$ fall within the range below.

$$r_{min} < r < r_{max} \quad (1.13)$$

$$r_{min} = \frac{(d-X_{jn}) - \sqrt{(d-X_{jn})^2 - 2w \cdot t_{sd}}}{2 \cdot X_{jn}} + 1$$

$$r_{max} = \frac{(d-X_{jn}) + \sqrt{(d-X_{jn})^2 - 2w \cdot t_{sd}}}{2 \cdot X_{jn}} + 1$$

Based on the above, in this first preferred embodiment, it is preferred that the ratio r satisfy Expression (1.2), Expression (1.7), and Expression (1.13) at the same time.

(Relationship of $C_{bt} < C_{sd}$ Between Parasitic Capacitances)

The reason that the above-mentioned relationship of $C_{bt} < C_{sd}$ is preferred to be satisfied is described below.

The parasitic capacitance $C_{bt}$ is expressed by Expression (1.8) above, and the parasitic capacitance $C_{sd}$ is expressed by Expression (1.9) above. Through adjustment of a structural parameter in those expressions, values of the parasitic capacitance $C_{bt}$ and the parasitic capacitance $C_{sd}$ are determined. Now, simulation results in two cases are described.

Figure 29A:
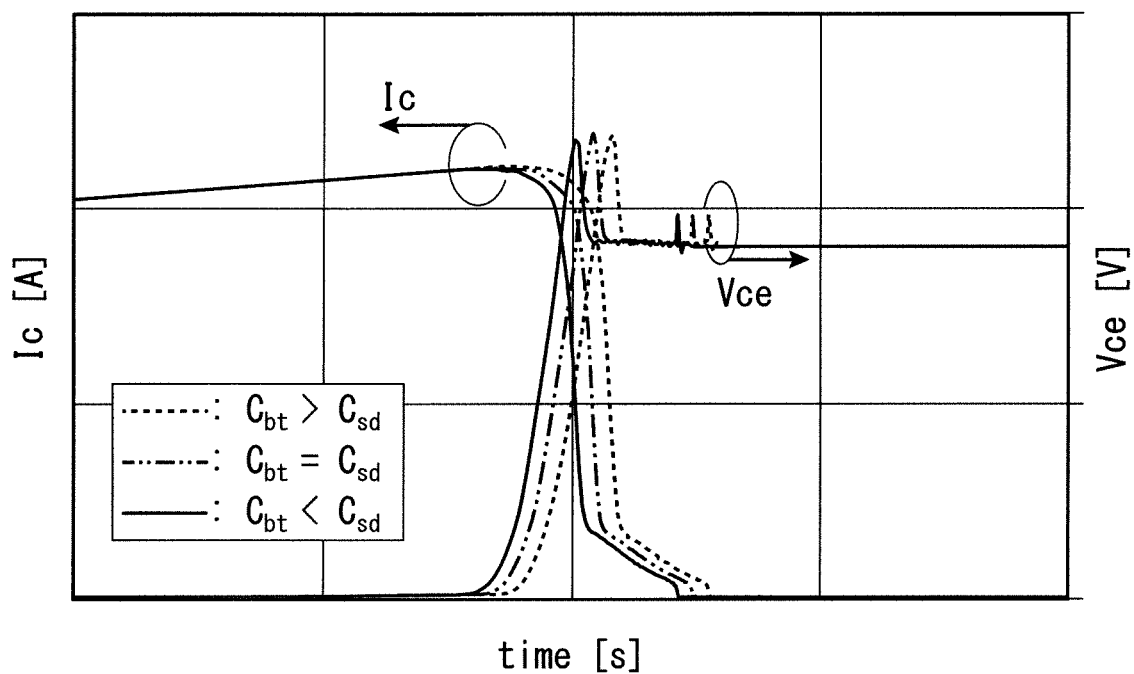
FIGS. 29A and 29B are a graph showing simulation results of turn-off waveforms of the collector current and the collector-emitter voltage and a graph showing simulation results of turn-off waveforms of the gate-emitter voltage and power loss, respectively, in a case where the relationship between parasitic capacitance on a bottom surface of the trench and parasitic capacitance on a side wall surface of the trench are adjusted by changing the depth of the trench under the condition that dimensions between the trenches are fixed.
Figure 29B:
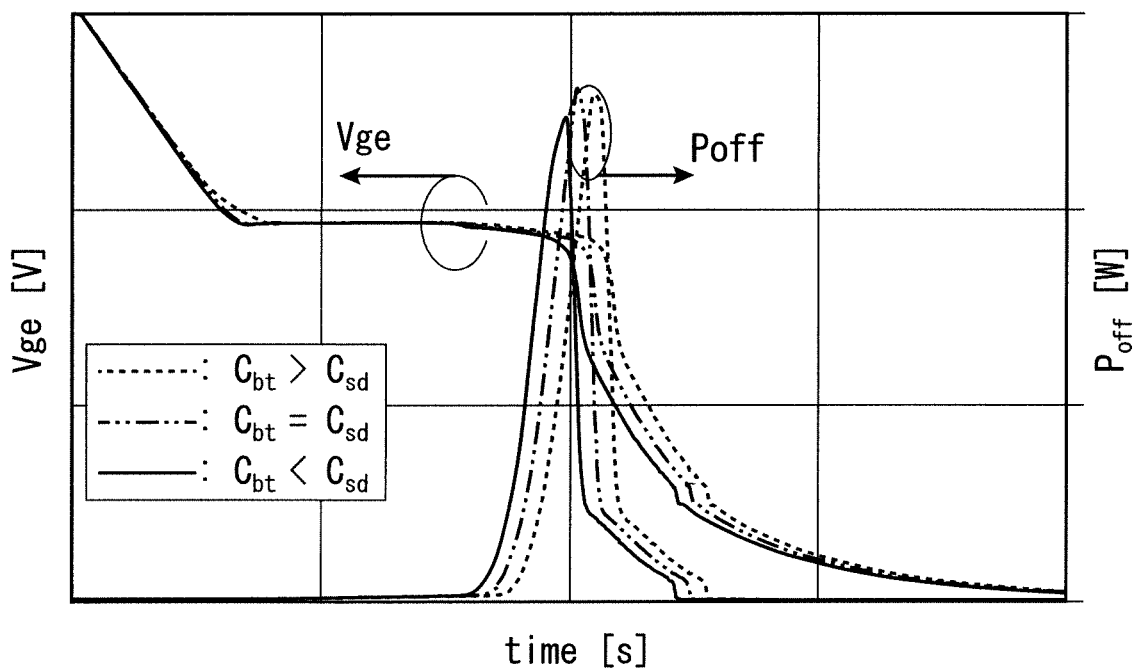

As the first case, FIGS. 29A and 29B are a graph showing simulation results of turn-off waveforms of the collector current Ic and the collector-emitter voltage Vce and a graph showing simulation results of turn-off waveforms of the gate-emitter voltage Vge and power loss $P_{off}$, respectively, in a case where the relationship between the parasitic capacitance $C_{bt}$ in the bottom surface of the trench TR and the parasitic capacitance $C_{sd}$ in the side wall surface of the trench TR are adjusted by changing the depth d of the trench TR under the condition that dimensions between the trenches TR are fixed. A case of $C_{bt} > C_{sd}$, a case of $C_{bt} = C_{sd}$, and a case of $C_{bt} < C_{sd}$ are simulated. Among above, in the case of $C_{bt} < C_{sd}$, dynamic characteristics are most satisfactory and turn-off loss is also smallest.

Figure 30A:
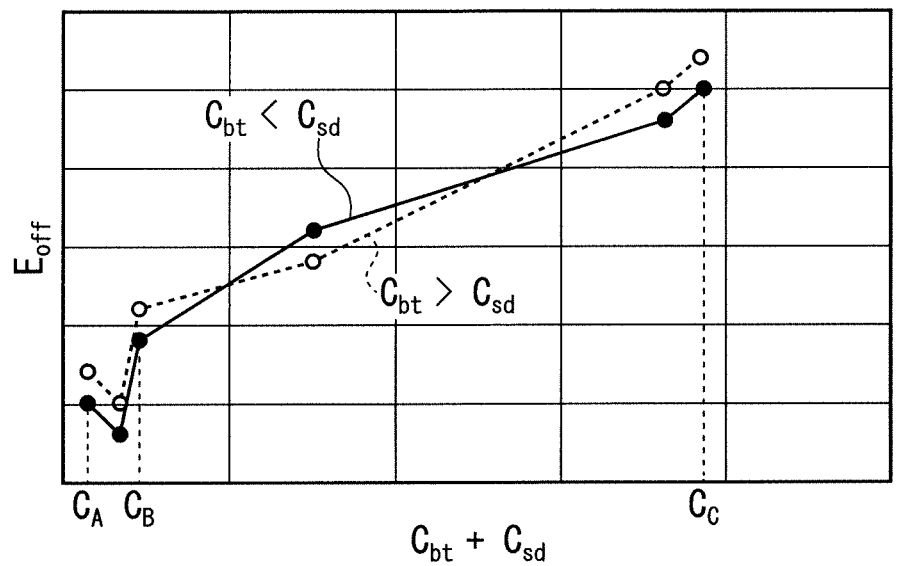
FIGS. 30A and 30B are a graph showing simulation results of the relationship between total parasitic capacitance and the turn-off loss and a graph showing simulation results of the relationship between the total parasitic capacitance and a collector-emitter peak voltage, respectively, in a case where the relationship between the parasitic capacitance on the bottom surface of the trench and the parasitic capacitance on the side wall surface of the trench are adjusted by setting a combination of a width w of the trench and the dimension p under the condition that the depth of the trench and a pitch of the trench are fixed.
Figure 30B:
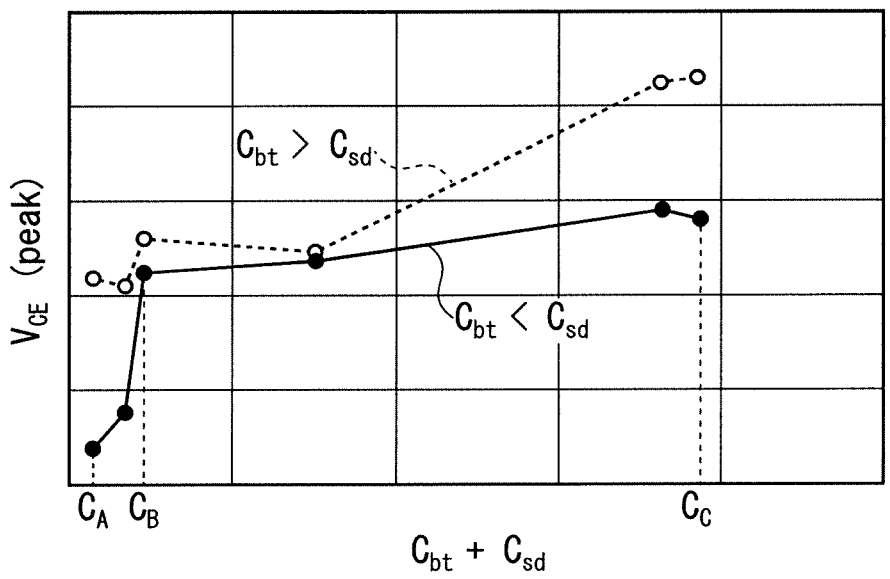

As the second case, FIGS. 30A and 30B are a graph showing simulation results of the relationship between the total parasitic capacitance $C_{bt}+C_{sd}$ and the turn-off loss $E_{off}$ and a graph showing simulation results of the relationship between the total parasitic capacitance $C_{bt}+C_{sd}$ and a collector-emitter peak voltage $V_{CE}(\text{peak})$, respectively, in a case where the relationship between the parasitic capacitance $C_{bt}$ in the bottom surface of the trench TR and the parasitic capacitance $C_{sd}$ in the side wall surface of the trench TR are adjusted by setting a combination of the width w of the trench TR and the dimension p under the condition that the depth d of the trench TR and a pitch of the trench TR are fixed. Note that, in this simulation, the depth $X_{jn}$ of the n-type impurity layer 8, the thickness $t_{sd}$ of the gate insulation film 5 on the side wall surface of the trench TR, the relative permittivity $\varepsilon_{ox}$ of the gate insulation film 5, the length z of the trench TR, and the thickness of the n⁻-type drift layer 1 are fixed. Further, impurity concentration profile of each element is fixed.

As is illustrated, concerning each of total parasitic capacitances $C_{bt}+C_{sd}$ in six magnitudes, the case of $C_{bt} < C_{sd}$ (Condition 1) and the case of $C_{bt} > C_{sd}$ (Condition 2) are simulated. As illustrated in FIG. 30A, when $C_{bt}+C_{sd}$ is increased, the turn-off loss $E_{off}$ is increased. When $C_{bt}+C_{sd}$ is equal, difference in the turn-off loss $E_{off}$ is small between the case of $C_{bt} < C_{sd}$ and the case of $C_{bt} > C_{sd}$. On the other hand, the collector-emitter peak voltage $V_{CE}(\text{peak})$ is smaller in the case of $C_{bt} < C_{sd}$ than in the case of $C_{bt} > C_{sd}$.

Figure 31A:
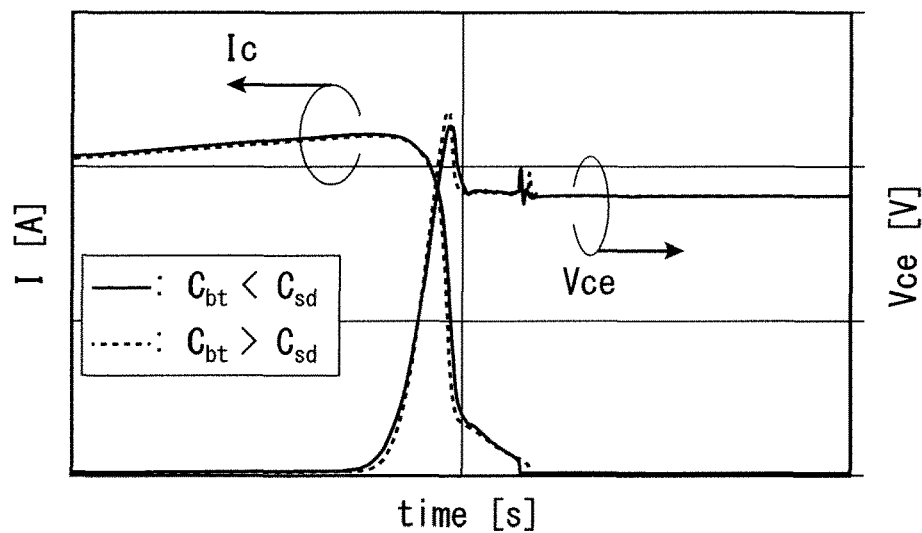
FIGS. 31A to 31C are graphs showing simulation results of turn-off waveforms of the collector current and the collector-emitter voltage in the case of $C_{bt}+C_{sd}=C_A$ (FIG. 30A and FIG. 30B), in the case of $C_{bt}+C_{sd}=C_B$ (FIG. 30A and FIG. 30B), and in the case of $C_{bt}+C_{sd}=C_C$ (FIG. 30A and FIG. 30B), respectively.
Figure 31B:
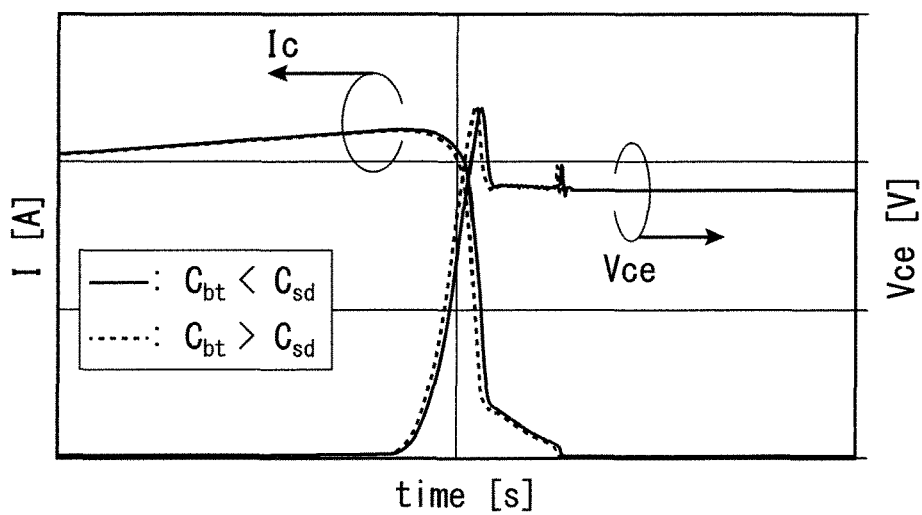
Figure 31C:
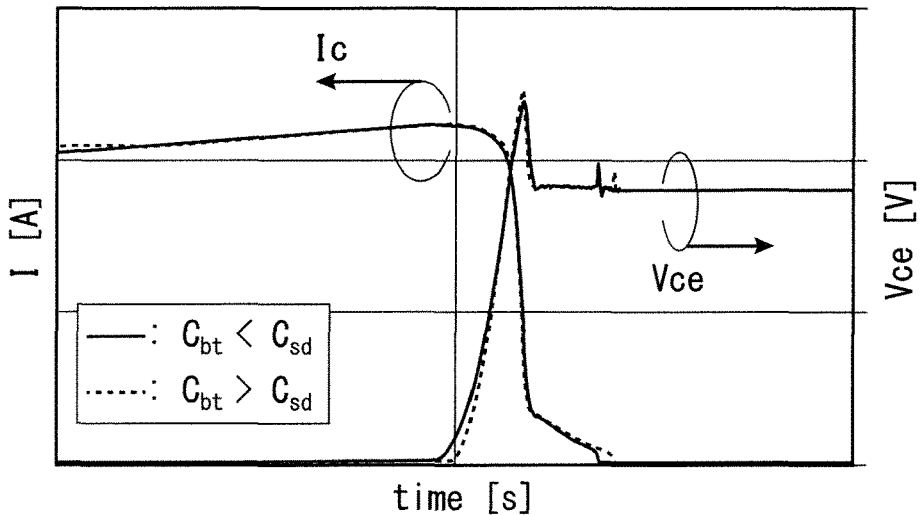
Figure 32A:
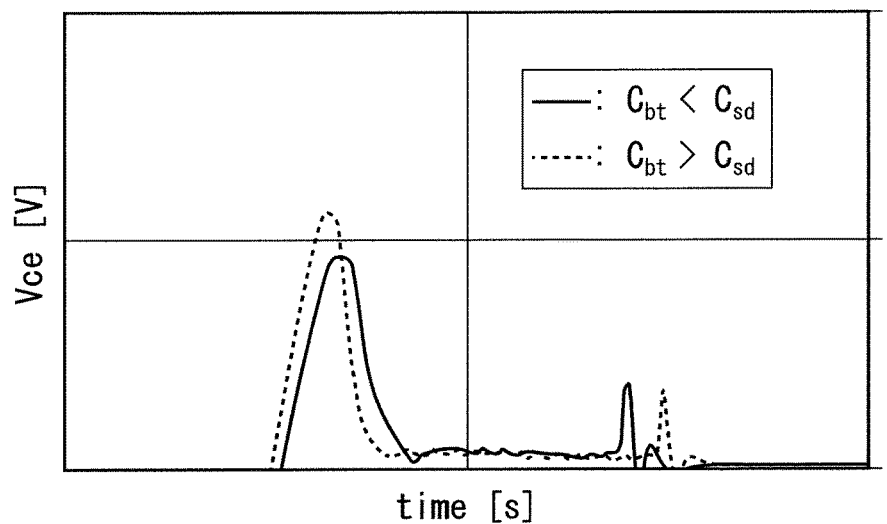
FIGS. 32A to 32C are an enlarged view of FIG. 31A, an enlarged view of FIG. 31B, and an enlarged view of FIG. 31C, respectively.
Figure 32B:
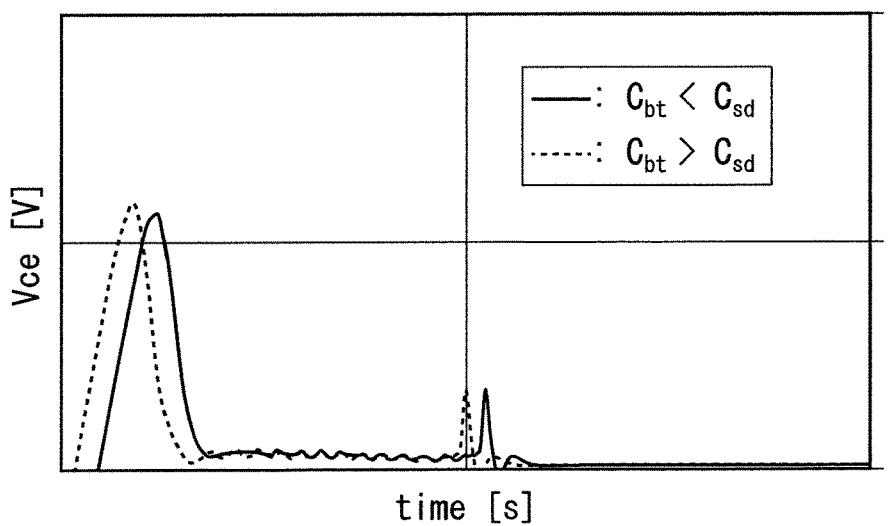
Figure 32C:
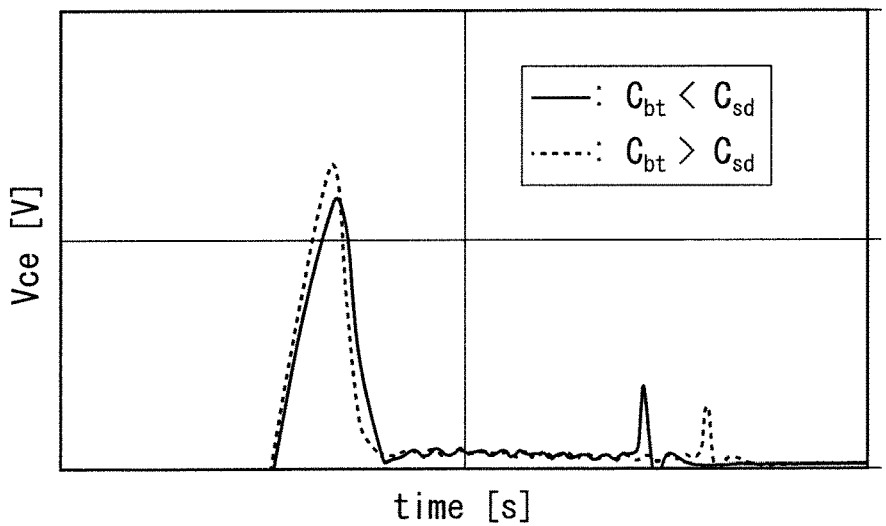
Figure 33A:
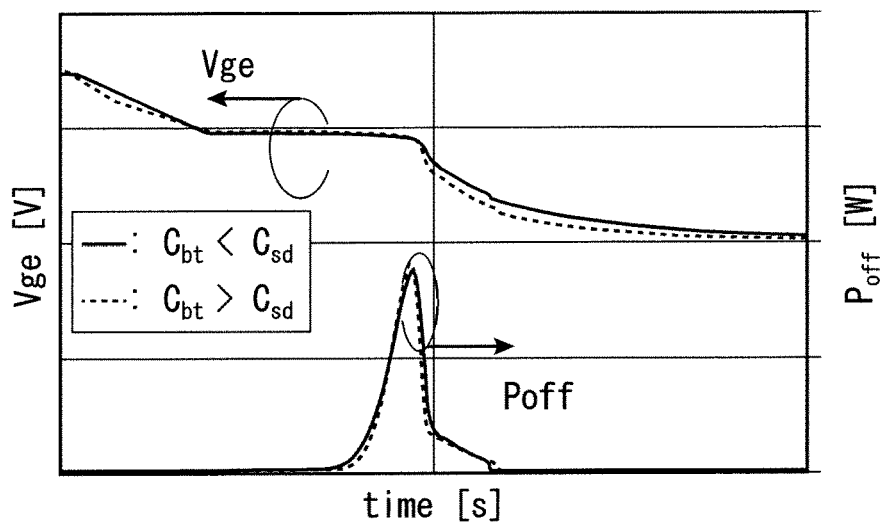
FIGS. 33A to 33C are graphs showing simulation results of turn-off waveforms of the gate-emitter voltage and the power loss in the case of $C_{bt}+C_{sd}=C_A$ (FIG. 30A and FIG. 30B), in the case of $C_{bt}+C_{sd}=C_B$ (FIG. 30A and FIG. 30B), and in the case of $C_{bt}+C_{sd}=C_C$ (FIG. 30A and FIG. 30B), respectively.
Figure 33B:
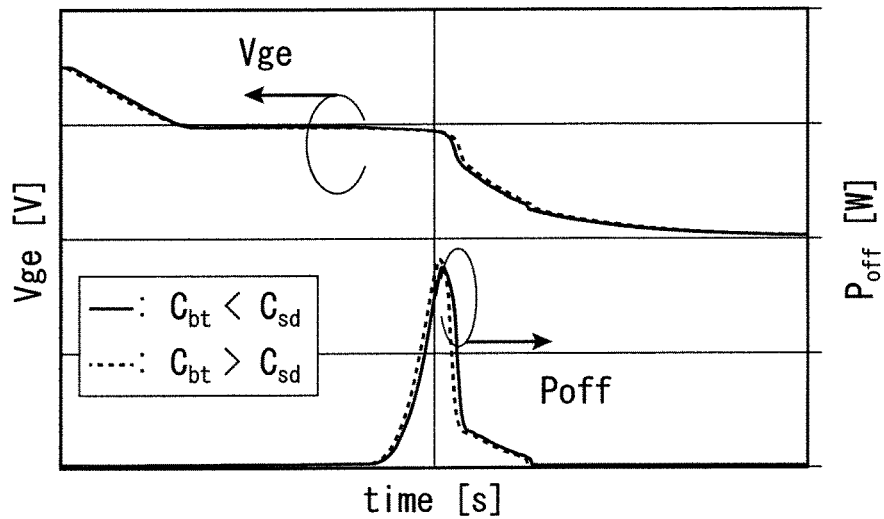
Figure 33C:
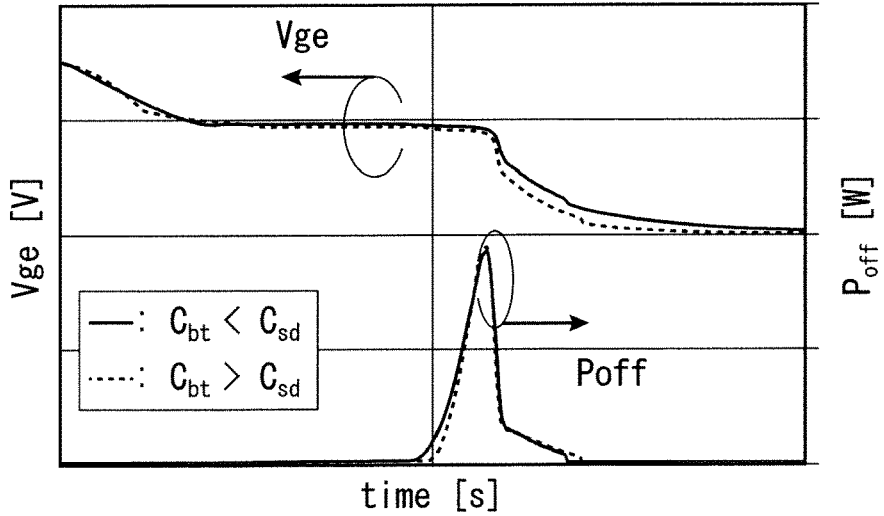
Figure 34A:
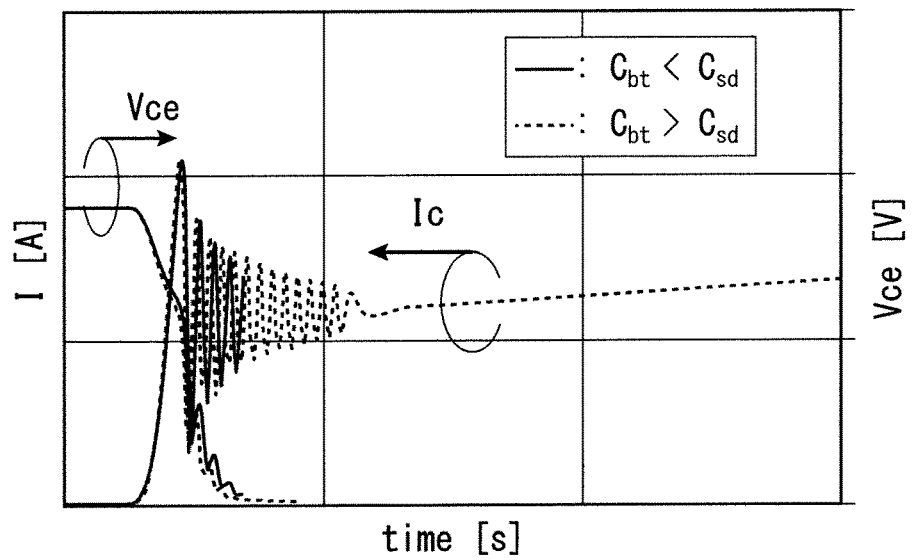
FIGS. 34A to 34C are graphs showing simulation results of turn-on waveforms of the collector current and the collector-emitter voltage in the case of $C_{bt}+C_{sd}=C_A$ (FIG. 30A and FIG. 30B), in the case of $C_{bt}+C_{sd}=C_B$ (FIG. 30A and FIG. 30B), and in the case of $C_{bt}+C_{sd}=C_C$ (FIG. 30A and FIG. 30B), respectively.
Figure 34B:
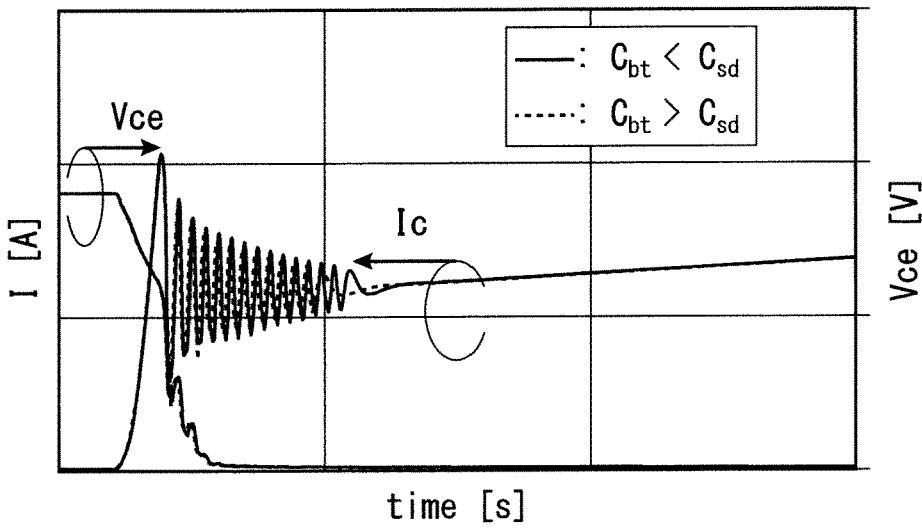
Figure 34C:
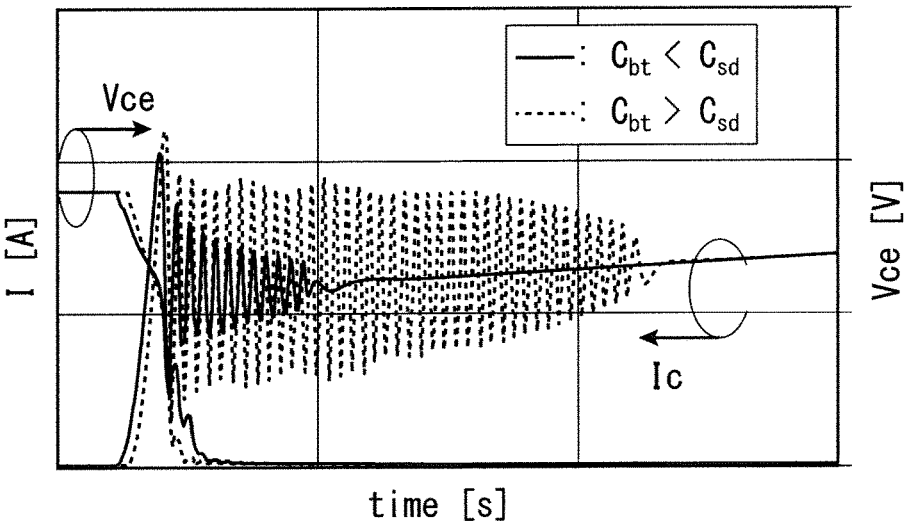
Figure 35A:
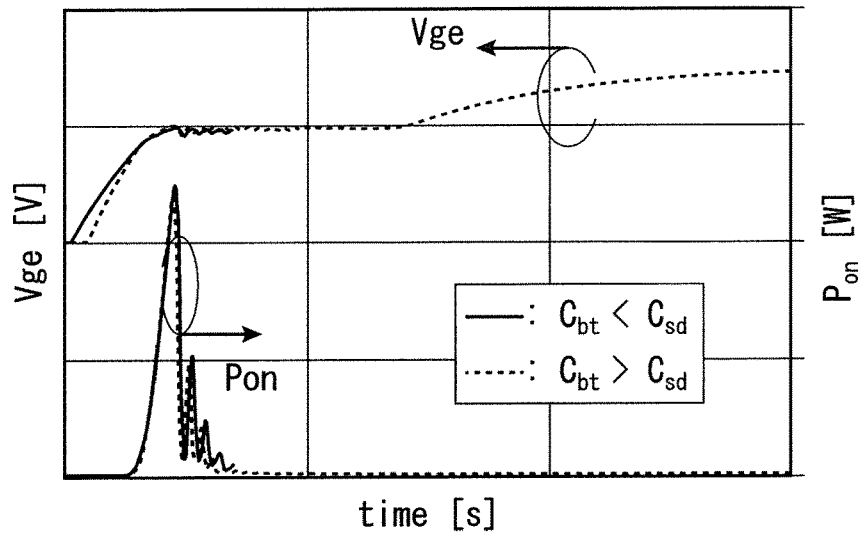
FIGS. 35A to 35C are graphs showing simulation results of turn-on waveforms of the gate-emitter voltage and the power loss in the case of $C_{bt}+C_{sd}=C_A$ (FIG. 30A and FIG. 30B), in the case of $C_{bt}+C_{sd}=C_B$ (FIG. 30A and FIG. 30B), and in the case of $C_{bt}+C_{sd}=C_C$ (FIG. 30A and FIG. 30B), respectively.
Figure 35B:
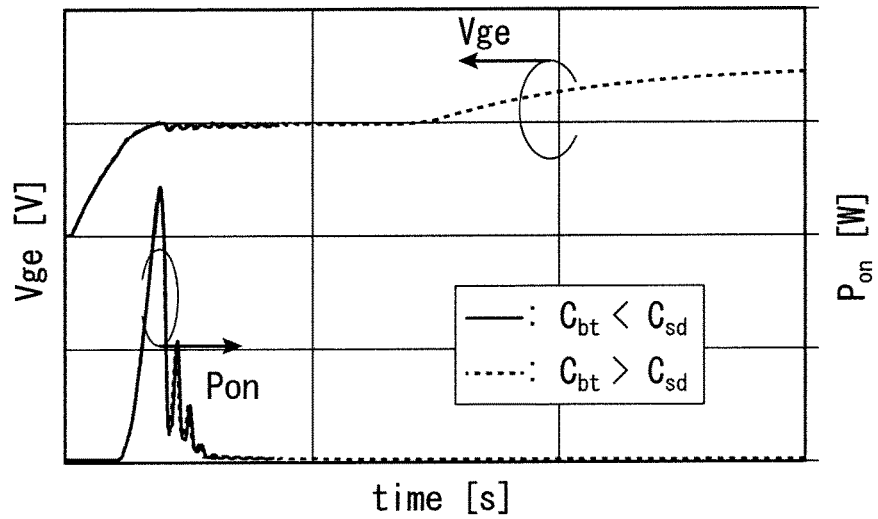
Figure 35C:
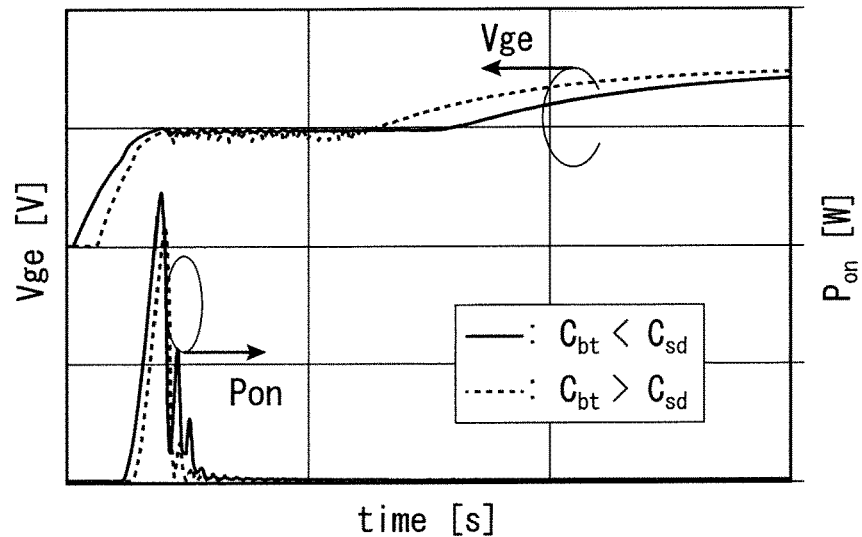

FIGS. 31A to 31C are graphs showing simulation results of turn-off waveforms of the collector current Ic and the collector-emitter voltage Vce in the case of $C_{bt}+C_{sd}=C_A$ (FIG. 30A and FIG. 30B), in the case of $C_{bt}+C_{sd}=C_B$ (FIG. 30A and FIG. 30B), and in the case of $C_{bt}+C_{sd}=C_C$ (FIG. 30A and FIG. 30B), respectively. FIGS. 32A to 32C are an enlarged view of FIG. 31A, an enlarged view of FIG. 31B, and an enlarged view of FIG. 31C, respectively. FIGS. 33A to 33C are graphs showing simulation results of turn-off waveforms of the gate-emitter voltage Vge and the power loss $P_{off}$ in the case of $C_{bt}+C_{sd}=C_A$ (FIG. 30A and FIG. 30B), in the case of $C_{bt}+C_{sd}=C_B$ (FIG. 30A and FIG. 30B), and in the case of $C_{bt}+C_{sd}=C_C$ (FIG. 30A and FIG. 30B), respectively. FIGS. 34A to 34C are graphs showing simulation results of turn-on waveforms of the collector current Ic and the collector-emitter voltage Vce in the case of $C_{bt}+C_{sd}=C_A$ (FIG. 30A and FIG. 30B), in the case of $C_{bt}+C_{sd}=C_B$ (FIG. 30A and FIG. 30B), and in the case of $C_{bt}+C_{sd}=C_C$ (FIG. 30A and FIG. 30B), respectively. FIGS. 35A to 35C are graphs showing simulation results of turn-on waveforms of the gate-emitter voltage Vge and the power loss $P_{on}$ in the case of $C_{bt}+C_{sd}=C_A$ (FIG. 30A and FIG. 30B), in the case of $C_{bt}+C_{sd}=C_B$ (FIG. 30A and FIG. 30B), and in the case of $C_{bt}+C_{sd}=C_C$ (FIG. 30A and FIG. 30B), respectively.

The waveform of the gate-emitter voltage Vge is roughly the same between the case of $C_{bt} < C_{sd}$ and the case of $C_{bt} > C_{sd}$. On the other hand, as shown in FIG. 32A to FIG. 32C, the peak of the collector-emitter voltage Vce is further suppressed in the case of $C_{bt} < C_{sd}$ than in the case of $C_{bt} > C_{sd}$. Further, as shown in FIG. 34C, in a case where large $C_{bt}+C_{sd}$ is adopted, strong oscillation is generated in the case of $C_{bt} > C_{sd}$, but the oscillation is suppressed in the case of $C_{bt} < C_{sd}$. From the above, it is understood that the case of $C_{bt} < C_{sd}$ has more excellent dynamic characteristic than the case of $C_{bt} > C_{sd}$.

As in the above, it is understood, from the both of the simulation results of the two cases, why a structural parameter is preferred to be selected so as to satisfy the relationship of $C_{bt} < C_{sd}$ from the viewpoint of dynamic characteristic.

Note that, in the simulation shown in FIGS. 30A and 30B, $p_1$ and $w_1$ are used as the dimension p and the width w in the case of Condition 1 and $p_2$ and $w_2$ in the case of Condition 2, and values of those $p_1$, $w_1$, $P_2$, and $w_2$ are set through the steps of (1) to (8) below.

(Step 1) Such an appropriate dimension $p_1$ as to be capable of satisfying the above-mentioned preferred condition according to this preferred embodiment is set.

(Step 2) Based on Expression (1.9), $C_{sd1}$ being $C_{sd}$ of Condition 1 is calculated.

(Step 3) Based on $p_1$ and $C_{sd1}$, and on Expression (1.8), a width $w_1$ that satisfies the relationship of $C_{bt1} < C_{sd1}$ is set. Note that, a lower limit of a settable width w is a value obtained by adding a double of the thickness $t_{sd}$ of the gate insulation film on the side wall surface of the trench TR to a width capable of embedding the gate electrode 4 from the viewpoint of processing. Further, an upper limit of a settable width w is a value obtained by deducting the smallest dimension between the trenches TR allowable from the viewpoint of processing (that is, dimension of a mesa portion of the semiconductor substrate 70 between the trenches TR) from a pitch dimension of the trench TR.

(Step 4) Based on $p_1$ and $w_1$ above, and on Expression (1.8), $C_{bt1}$ being $C_{bt}$ of Condition 1 is calculated.

(Step 5) A dimension $p_2$ that satisfies the relationship of $p_2 < p_1$ is set.

(Step 6) Based on Expression (1.9), $C_{sd2}$ being $C_{sd}$ of Condition 2 is calculated.

(Step 7) $C_{bt2}$ being $C_{bt}$ of Condition 2 is calculated based on the expression of $C_{bt2}=C_{bt1}+C_{sd1}-C_{sd2}$ so that $C_{bt}+C_{sd}$ is equal between Condition 1 and Condition 2.

(Step 8) Based on $C_{bt2}$ and $p_2$ above, and on Expression (1.8), $w_2$ is calculated.

(Manufacturing Method for Trench Gate Structure)

FIG. 36 to FIG. 45 are partial cross-sectional views illustrating a first to tenth processes in an example of a manufacturing method for a trench gate structure of the IGBT 91, respectively.

Figure 36:
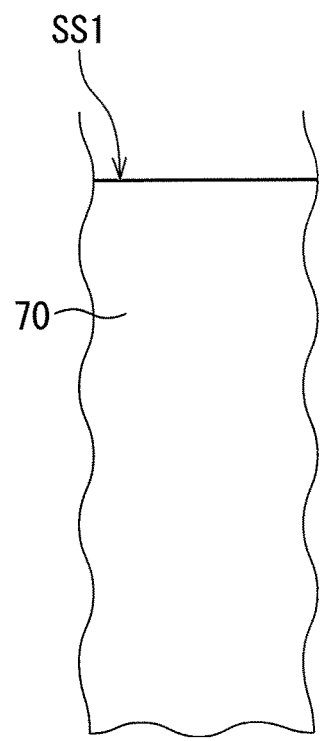
FIG. 36 is a partial cross-sectional view illustrating a first process in an example of a manufacturing method for a trench gate structure of the semiconductor device of FIG. 1.
Figure 37:
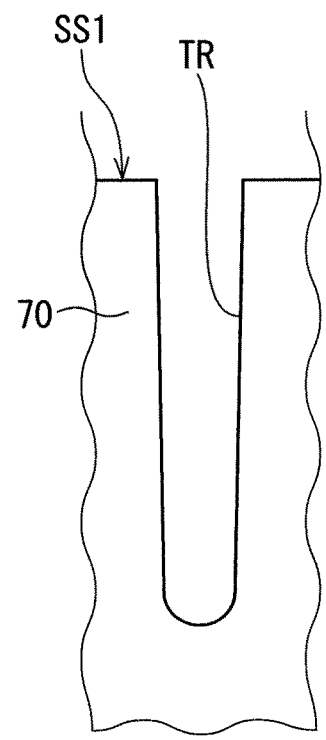
FIG. 37 is a partial cross-sectional view illustrating a second process in the example of the manufacturing method for a trench gate structure of the semiconductor device of FIG. 1.
Figure 38:
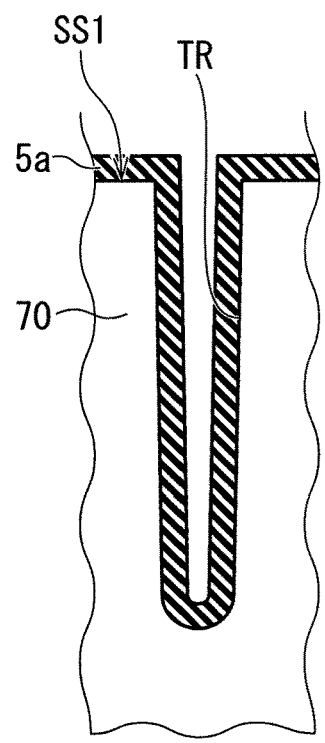
FIG. 38 is a partial cross-sectional view illustrating a third process in the example of the manufacturing method for a trench gate structure of the semiconductor device of FIG. 1.
Figure 39:
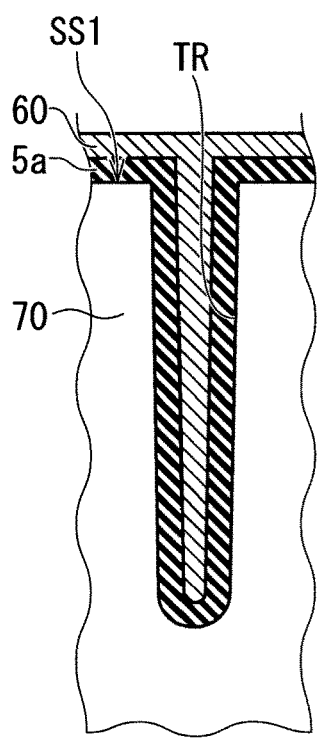
FIG. 39 is a partial cross-sectional view illustrating a fourth process in the example of the manufacturing method for a trench gate structure of the semiconductor device of FIG. 1.
Figure 40:
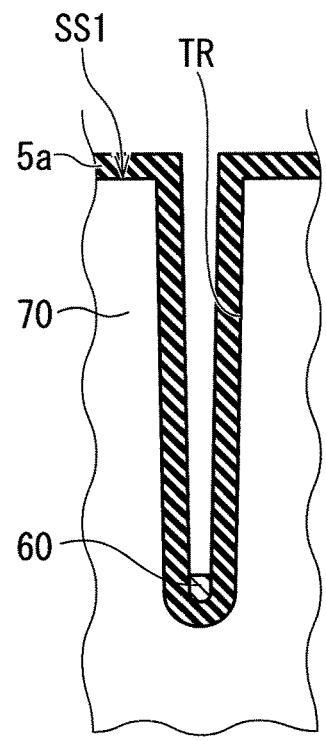
FIG. 40 is a partial cross-sectional view illustrating a fifth process in the example of the manufacturing method for a trench gate structure of the semiconductor device of FIG. 1.
Figure 41:
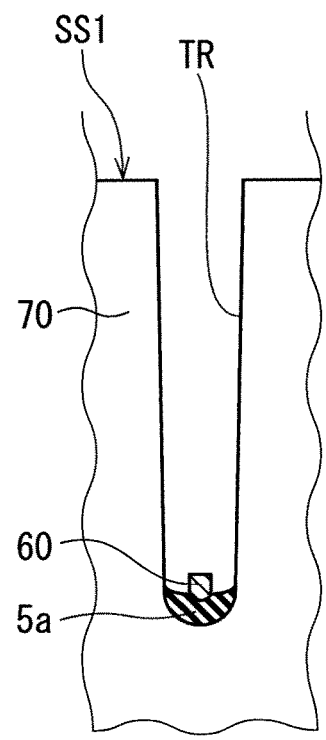
FIG. 41 is a partial cross-sectional view illustrating a sixth process in the example of the manufacturing method for a trench gate structure of the semiconductor device of FIG. 1.

Referring to FIG. 36, firstly, the semiconductor substrate 70 is prepared. Referring to FIG. 37, deep etching using reactive ion etching (RIE) is performed on the upper substrate surface SS1 of the semiconductor substrate 70, thereby forming the trench TR. Referring to FIG. 38, through thermal oxidation, a thermal oxidation film 5a is formed on the upper substrate surface SS1 including the inner surface of the trench TR. Referring to FIG. 39, a polysilicon layer 60 to fill the trench TR is formed with intermediation of the thermal oxidation film 5a. Referring to FIG. 40, etch back is performed with wet etching on the polysilicon layer 60, thereby reserving the polysilicon layer 60 only on the bottom surface of the trench TR. Referring to FIG. 41, wet etching using the polysilicon layer 60 as a mask is performed, thereby reserving the thermal oxidation film 5a only on the bottom surface of the trench TR.

Figure 42:
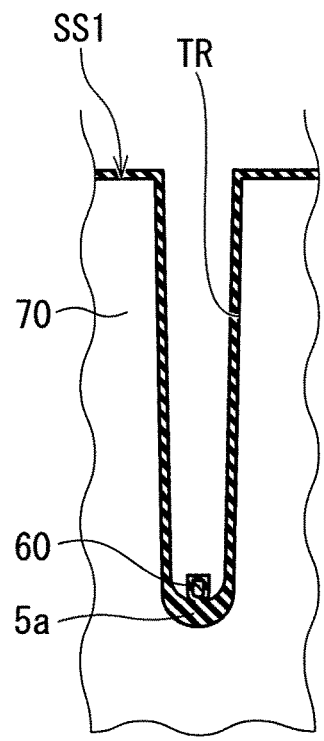
FIG. 42 is a partial cross-sectional view illustrating a seventh process in the example of the manufacturing method for a trench gate structure of the semiconductor device of FIG. 1.
Figure 43:
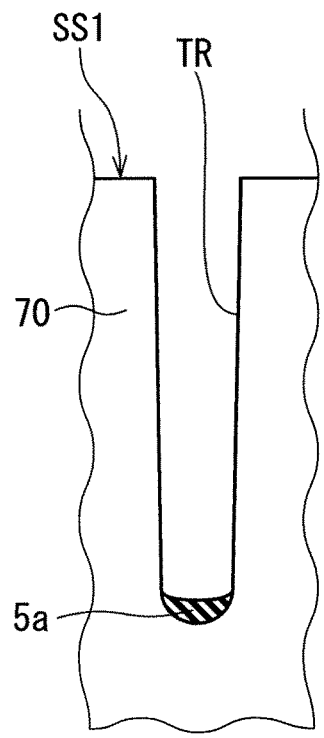
FIG. 43 is a partial cross-sectional view illustrating an eighth process in the example of the manufacturing method for a trench gate structure of the semiconductor device of FIG. 1.

Referring to FIG. 42, a sacrificial layer is formed through thermal oxidation, thereby further forming a thermal oxidation film 5a on an exposed inner surface of the trench TR. Next, the thermal oxidation film 5a not covered by the polysilicon layer 60 is removed by wet etching. Next, the polysilicon layer 60 is removed by wet etching. With this, referring to FIG. 43, the thermal oxidation film 5a is reserved only on the bottom surface of the trench TR.

Figure 44:
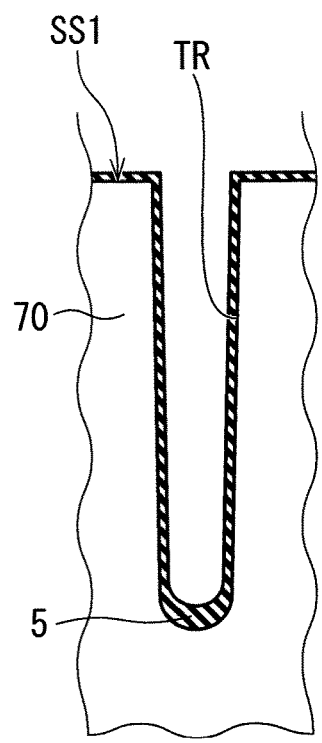
FIG. 44 is a partial cross-sectional view illustrating a ninth process in the example of the manufacturing method for a trench gate structure of the semiconductor device of FIG. 1.

Referring to FIG. 44, the inner surface of the trench TR is thermally oxidized. With this, the gate insulation film 5 that is formed of a thermal oxidation film including the thermal oxidation film 5a (FIG. 42) is formed. A portion of the gate insulation film 5 on the bottom surface of the trench TR includes the thermal oxidation film 5a, and therefore has a thickness larger than other portions.

Figure 45:
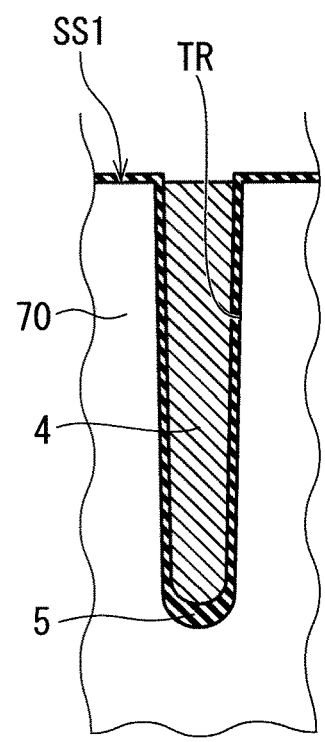
FIG. 45 is a partial cross-sectional view illustrating a tenth process in the example of the manufacturing method for a trench gate structure of the semiconductor device of FIG. 1.

Referring to FIG. 45, a polysilicon layer is deposited on the upper substrate surface SS1 so as to fill the trench TR with intermediation of the gate insulation film 5. Through etch back, a portion of the polysilicon layer outside of the trench TR is removed, thereby forming the gate electrode 4. With this, a trench gate structure of the IGBT 91 is obtained.

(Summary of Effects)

According to this preferred embodiment, switching characteristics can be improved while adverse influence on other important electrical characteristics is suppressed. Specifically, turn-off/turn-on loss can be reduced through reduction of a mirror zone appearing in a gate waveform at the time of a turn-off/turn-on. Further, an oscillation phenomenon and a snap-off phenomenon can be suppressed.

The depth $X_g$ of the interface of the gate insulation film 5 and the gate electrode 4 is larger than the depth $X_{jn}$ of the interface of the n⁻-type drift layer 1 and the n-type impurity layer 8. Further, the depth d of the bottom surface of the trench TR is larger than the depth $X_{jn}$ of the interface of the n⁻-type drift layer 1 and the n-type impurity layer 8, and is smaller than the depth $X_{jp}$ of the interface of the n⁻-type drift layer 1 and the p⁺-type impurity layer 11. With this, a breakdown voltage can be secured further sufficiently.

The gate insulation film 5 is made of a single material, typically of a thermal oxidation film. With this, a manufacturing method is simplified as compared to the case where the gate insulation film 5 is made of a plurality of materials.

When Expression (1.13) is satisfied, the relationship of $C_{bt} < C_{sd}$ concerning the parasitic capacitance can be satisfied. According to the above-mentioned simulation results, when the relationship is satisfied, a low on-voltage and satisfactory switching characteristics can be more easily attained.

The parasitic capacitance $C_{sd}$ taken into consideration in the above-mentioned relationship is capacitance formed by the n⁻-type drift layer 1 on the side wall surface of the trench TR in which the gate electrode 4 is embedded, and is a parameter that can be adjusted without largely affecting the on-voltage. Therefore, according to this preferred embodiment, dynamic characteristic are easily enhanced without largely affecting an on-voltage. If a large adjustment is made to parasitic capacitance formed by the n-type impurity layer 8 (instead of the n⁻-type drift layer 1) on the side wall surface of the trench TR in which the gate electrode 4 is embedded, adverse influence on an on-voltage is liable to increased.

Figure 46:
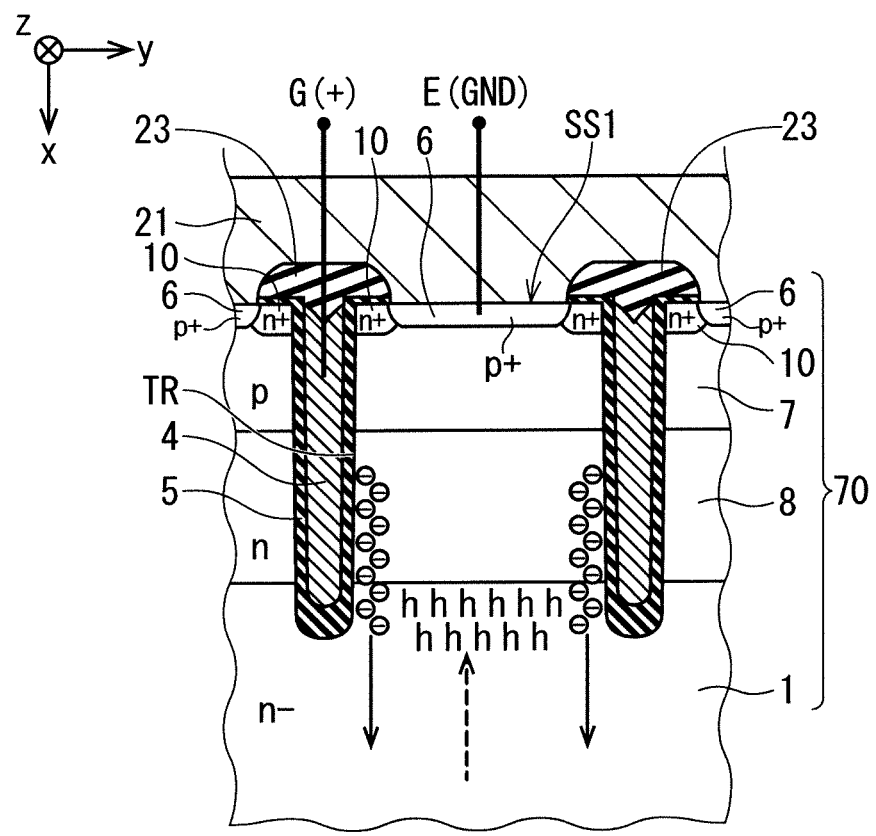
FIG. 46 is a partial cross-sectional view illustrating electron injection from an electron storage layer in the semiconductor device of FIG. 1.

The bottom surface of the trench TR is formed of the n⁻-type drift layer 1 in the main portion TRm (refer to FIG. 3). With this, the on-voltage can be further reduced. The reason is described below. Referring to FIG. 46, when a turn-on operation is performed, a positive voltage is applied between a gate (G) and an emitter (E). With this, on the side wall surface of the trench TR, an electron storage layer is formed in the interface of the gate insulation film 5 and each of the n⁻-type drift layer 1 and the n-type impurity layer 8. Electrons are injected from the electron storage layer into the n⁻-type drift layer 1 (refer to the solid arrows in the drawing). With this, electron concentration of the n⁻-type drift layer on the emitter side (upper side in the drawing) is increased. Correspondingly thereto, holes are injected (refer to the dashed arrow in the drawing) from the collector side (lower side in the drawing). As a result, carrier concentration in the n⁻-type drift layer 1 is increased, thus reducing the on-voltage. If a p-type impurity layer is provided on the bottom surface of the trench TR in FIG. 46, the above-mentioned electron injection is inhibited by the p-type impurity layer. Therefore, the on-voltage is increased.

The n-type impurity layer 8 connects between the plurality of trenches TR in the in-plane direction of the upper substrate surface SS1. With this, the on-voltage can be further reduced. The reason is described below. Referring again to FIG. 46, a potential barrier to the holes is formed between the trenches TR due to the interface of the n-type impurity layer 8 and the n⁻-type drift layer 1 that connects between the trenches TR. In this potential barrier, the holes injected from the collector side (lower side in the drawing) are stored (refer to the dashed arrow in the drawing). As a result, carrier concentration of the n⁻-type drift layer 1 on the emitter side is increased, thus reducing the on-voltage. If a p-type impurity layer is provided between the trenches TR in a manner of dividing the n-type impurity layer 8 in FIG.

46, the above-mentioned potential barrier is also divided by the p-type impurity layer. Therefore, the on-voltage is increased.

The p$^+$-type impurity layer 11 (FIG. 3) is provided, and therefore electric field concentration on the bottom surface of the end portion TRe of the trench TR can be alleviated. Note that, in the bottom surface of the main portion TRm of the trench TR, electric field concentration is alleviated due to a field plate effect obtained by other adjacent trenches TR, and hence adverse influence on a breakdown voltage due to the absence of the p$^+$-type impurity layer 11 is small. Conversely, in the end portion TRe, a field plate effect obtained by other adjacent trenches TR is small, and hence a breakdown voltage is liable to be reduced unless the p$^+$-type impurity layer 11 is provided.

The thickness $t_{sd}$ of a portion of the gate insulation film 5 that is opposed to the side wall surface of the trench TR and is opposed to the n$^-$-type drift layer 1 is smaller than the thickness $t_{bt}$ of a portion of the gate insulation film 5 that is opposed to the bottom surface of the trench TR. With this, the on-voltage can be further reduced. The reason is described below. Referring again to FIG. 46, an electric charge amount $Q_e$ per unit area of the electron storage layer formed in the semiconductor substrate 70 where the side wall surface of the trench TR is formed is expressed as below using the thickness $t_{sd}$, the relative permittivity $\varepsilon_{ox}$ of the gate insulation film 5, the permittivity $\varepsilon_0$ in a vacuum, and a difference between the gate-emitter voltage Vge and a flat band voltage $V_{fb}$.

$$Q_e = \frac{\varepsilon_{ox}\varepsilon_0}{t_{sd}}(V_{ge} - V_{fb}) \quad (1.14)$$

In order to further reduce the on-voltage, more electrons need to be injected from the electron storage layer. In order to realize that, it is preferred that the electric charge amount $Q_e$ be large. Therefore, it is preferred that the thickness $t_{sd}$ be smaller than the thickness $t_{bt}$. Note that, when the thickness of a portion of the gate insulation film 5 that is opposed to the side wall surface of the trench TR and is opposed to the n-type impurity layer 8 is also small as in the above, the on-voltage can be further reduced.

The side wall surface of the end portion TRe (FIG. 3) does not have the n$^+$-type emitter region 10 (FIG. 2), and is typically formed only of the p$^+$-type impurity layer 11. Therefore, the end portion TRe does not have a channel. With this, a parasitic MIS structure having a channel generated due to the p$^+$-type impurity layer 11 can be prevented from being provided. If such a parasitic MIS structure is present, a MIS structure generated due to the p-type base layer 7 and a parasitic MIS structure generated due to the p$^+$-type impurity layer 11 exist in the IGBT 91 in a mixed manner. Those two MIS structures have different characteristics. Specifically, impurity concentration of the p-type base layer 7 and impurity concentration of the p$^+$-type impurity layer 11 are usually different, and hence a threshold voltage of the MIS structure generated due to the p-type base layer 7 and a threshold voltage of the parasitic MIS structure generated due to the p$^+$-type impurity layer 11 are different. For this reason, the gate may be turned into the on state at an unintentional timing in the vicinity of the end portion TRe, which may result in generation of thermal destruction of the IGBT that is caused by current concentration in the vicinity of the end portion TRe. According to this preferred embodiment, a channel is not formed in the end portion TRe, and therefore such local current concentration can be prevented.

(Supplementary Note)

Note that, this preferred embodiment is effective when applied to an IGBT of a high breakdown voltage class of approximately 3300 V, for example, and is also similarly effective when applied to another breakdown voltage class. Further, the IGBT is not limited to the configuration described in detail in the above, and a reverse-conducting IGBT (RC-IGBT) may be used, for example. Further, a semiconductor material for the semiconductor substrate is not particularly limited. Further, as a modified example, the n type as the first conductivity type and the p type as the second conductivity type may be swapped. Such mentioned matters are similarly true in a second preferred embodiment described below.

<Second Preferred Embodiment>

(Gist of Configuration)

Figure 47:
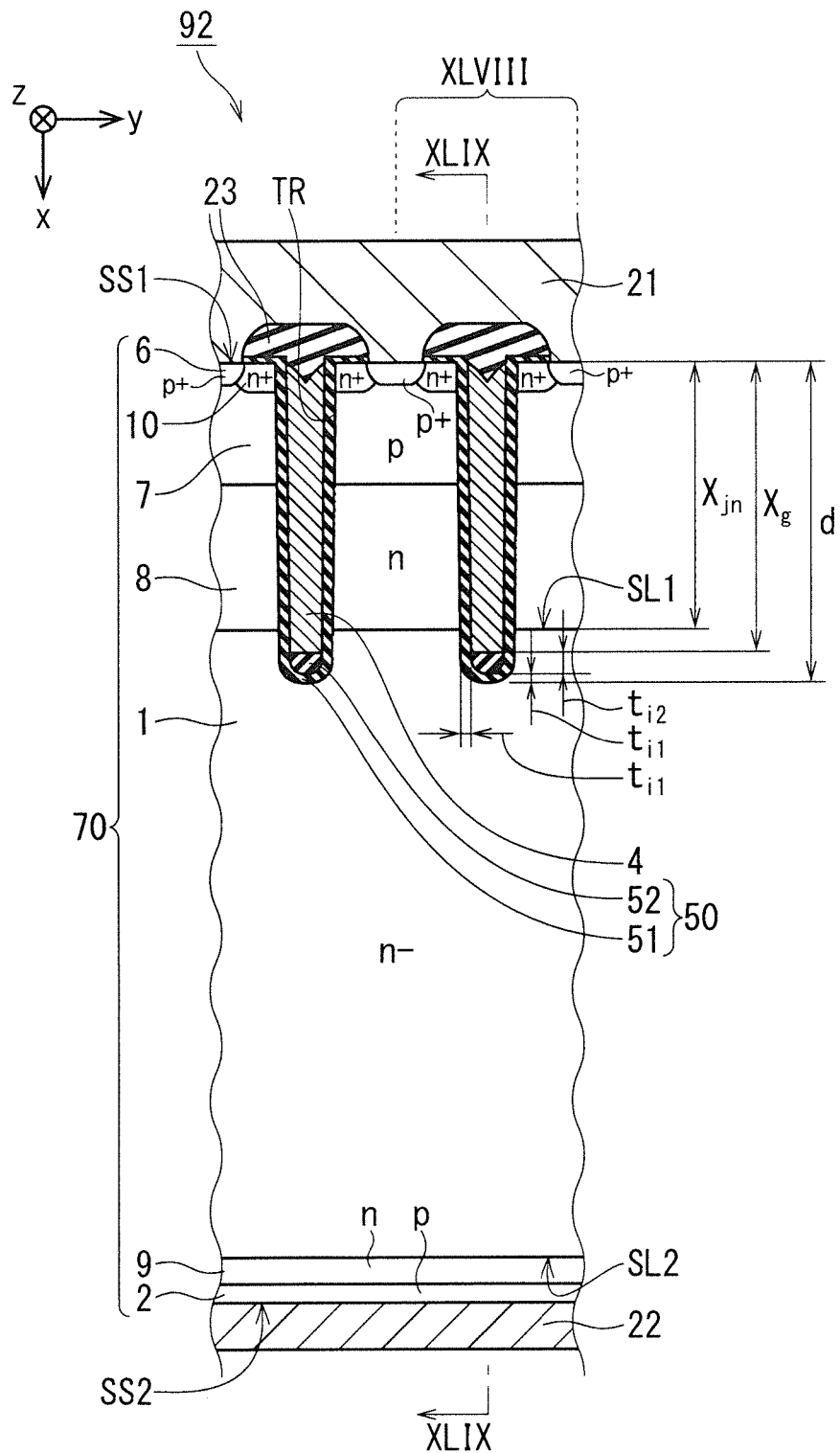
FIG. 47 is a partial cross-sectional view schematically illustrating a configuration of a semiconductor device according to a second preferred embodiment of the present invention.
Figure 48:
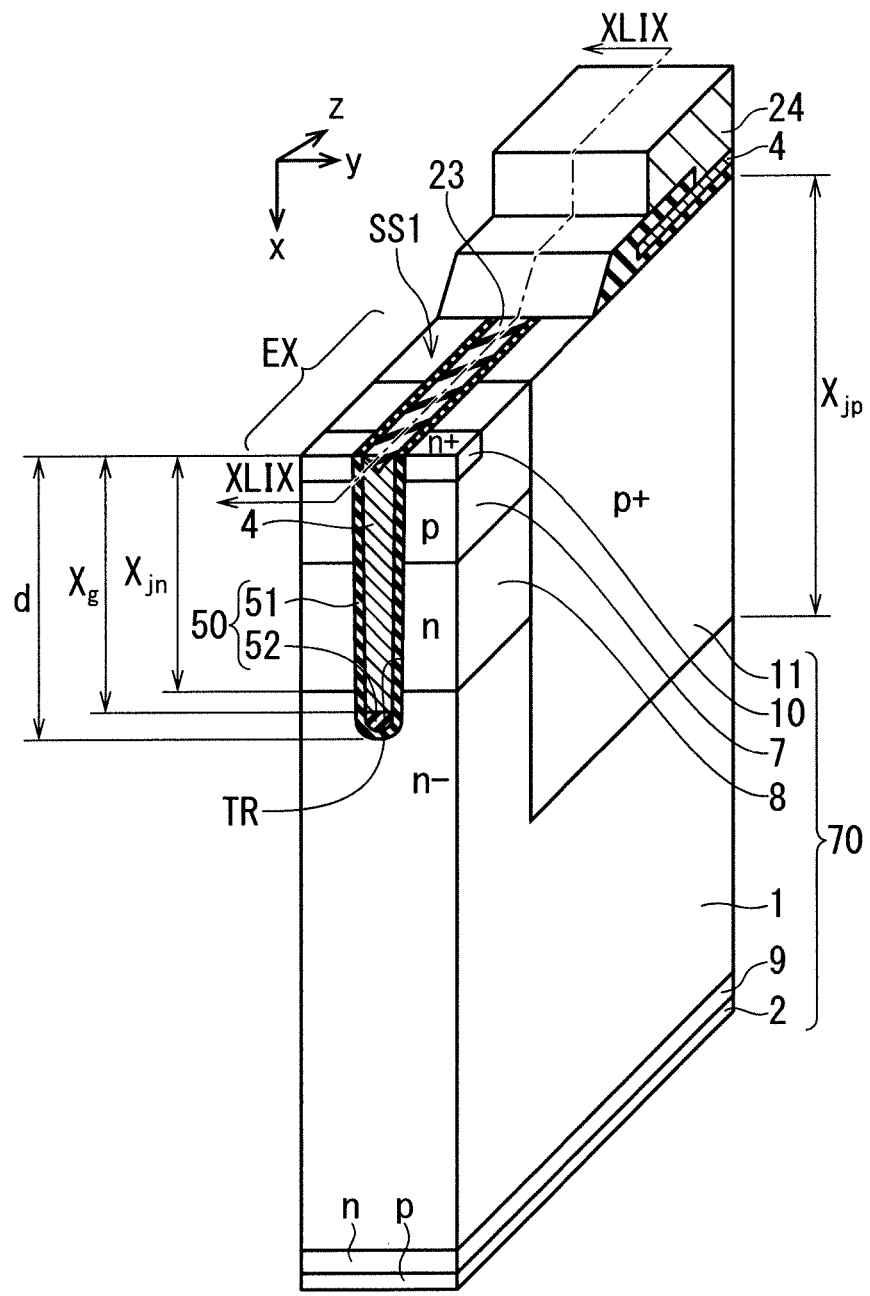
FIG. 48 is a cross-sectional perspective view of the region XLVIII of FIG. 47.
Figure 49:
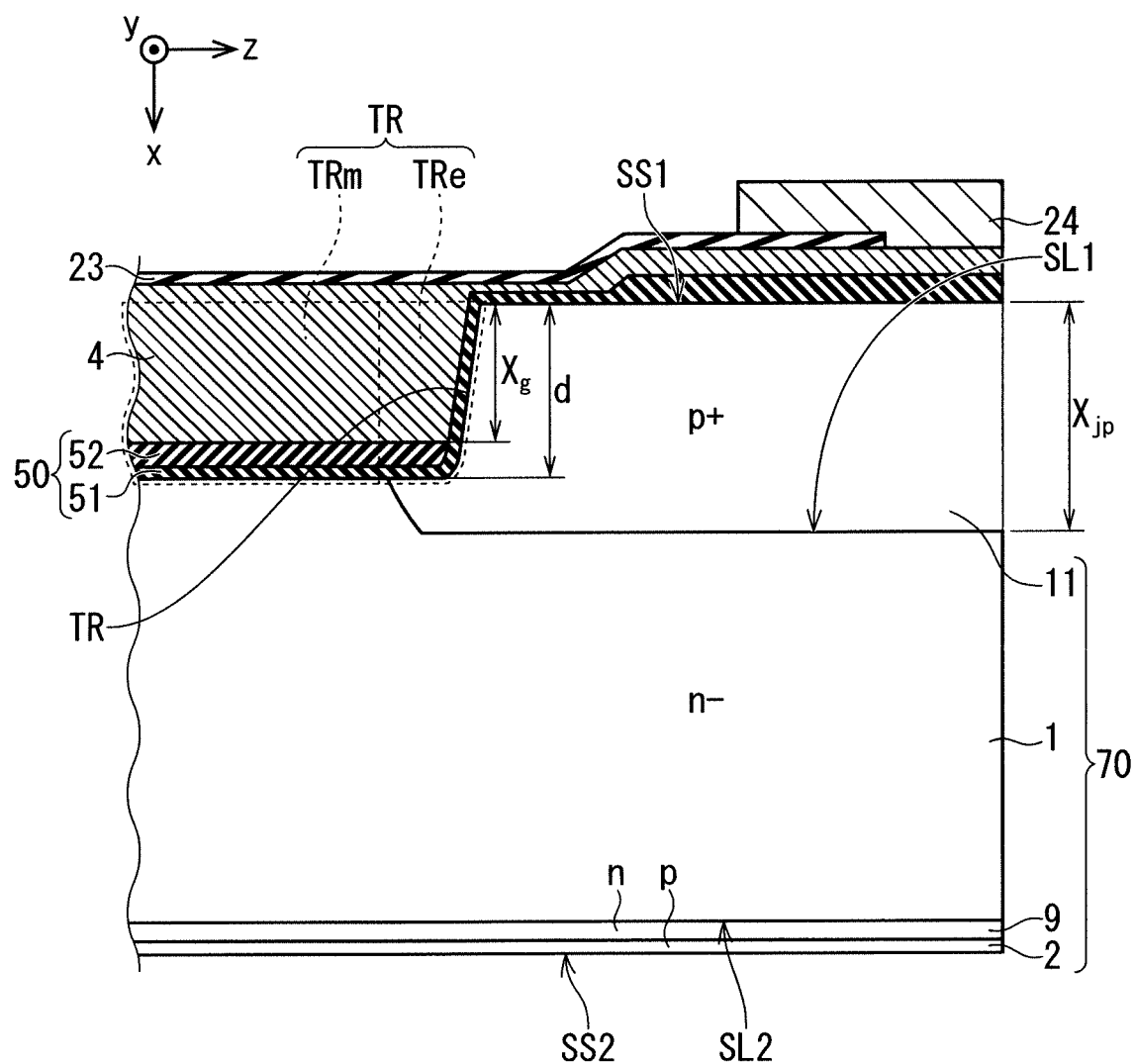
FIG. 49 is a partial cross-sectional view taken along the line XLIX-XLIX of FIG. 47.

FIG. 47 is a partial cross-sectional view schematically illustrating a configuration of an IGBT 92 according to this second preferred embodiment. FIG. 48 is a cross-sectional perspective view of the region XLVIII of FIG. 47. FIG. 49 is a partial cross-sectional view taken along the line XLIX-XLIX of FIG. 47. Note that, in the region EX of FIG. 48, in order to make the upper substrate surface SS1 of the semiconductor substrate 70 more easily visible, illustration of the configuration above the upper substrate surface SS1 is omitted.

The IGBT 92 has a gate insulation film 50 in place of the gate insulation film 5 (first preferred embodiment). Similarly to the case of the gate insulation film 5, the thickness of a portion of the gate insulation film 50 that is opposed to the bottom surface of the trench TR is larger than the thickness of a portion of the gate insulation film 50 that is opposed to the side wall surface of the trench TR and is opposed to the n-type drift layer 1. The gate insulation film 50 has an insulation film 51 (first insulation film) and an insulation film 52 (second insulation film). The insulation film 52 is provided on the bottom surface of the trench TR with intermediation of the insulation film 51. The insulation film 52 is not provided on the side wall surface of the trench TR. Therefore, the side wall surface of the trench TR is opposed to the gate electrode 4 only with intermediation of the insulation film 51, without intermediation of the insulation film 52.

The insulation film 51 has a thickness $t_{i1}$ between the gate electrode 4 and the n-type drift layer 1 in each side wall surface of the trench TR. The thickness $t_{i1}$ may be substantially uniform on the side wall surface of the trench TR. Further, in this preferred embodiment, the insulation film 51 has, as illustrated in FIG. 47, a substantially common thickness to the above-mentioned thickness $t_{i1}$ between the gate electrode 4 and the n$^-$-type drift layer 1 in each bottom surface of the trench TR. In other words, in this preferred embodiment, the insulation film 51 covers the inner surface of the trench TR with the uniform thickness $t_{i1}$. The insulation film 52 has a thickness $t_{i2}$ in the depth direction (x-direction in the drawing).

The insulation film 51 has first composition. The insulation film 52 has second composition that is different from the above-mentioned first composition. The first composition may be an oxide. Particularly in a case where the insulation film 51 is an oxide film formed through thermal oxidation, satisfactory interfacial characteristics of the gate insulation film are easily attained. Specifically, defect density in the interface is reduced, thus reducing gate leakage. The insulation film 51 and the insulation film 52 have permittivity $\varepsilon_{i1}$ and permittivity $\varepsilon_{i2}$, respectively. It is preferred that the permittivity $\varepsilon_{i2}$ be lower than the permittivity $\varepsilon_{i1}$ from the viewpoint of reduction of the parasitic capacitance $C_{bt}$ in the bottom surface of the trench TR.

Next, the gist of preferred dimensions of elements of the IGBT 92 are described below. Note that, dimensions similar to the dimensions defined in the first preferred embodiment are represented by similar terms. Further, the ratio r defined relating to the gate insulation film 5 in the first preferred embodiment is defined relating to the gate insulation film 50 in this preferred embodiment.

Similarly to the first preferred embodiment, the depth $X_g$ is larger than the depth $X_{jn}$. Further, the depth d is larger than the depth $X_{jn}$ and is smaller than the depth $X_{jn}$. Further, in this preferred embodiment, as in the later description, it is preferred that Expression (2.4) and Expression (2.15) that is expressed using effective permittivity $\varepsilon_{ef}$ defined in Expression (2.9) be satisfied.

Note that, configuration other than the above is substantially the same as the configuration of the above-mentioned first preferred embodiment, and hence the same or corresponding elements are denoted by the same reference symbols to omit repeated description.

(Relationship Between Depth d and Depth $X_{jn}$)

Concerning the relationship between the depth d and the depth $X_{jn}$, it is preferred that the relationship of Expression (1.1) be satisfied similarly to the first preferred embodiment.

(Preferred Value of Ratio $r=X_g/X_{jn}$)

Concerning the preferred value of the ratio $r=X_g/X_{jn}$, it is preferred that the relationship of Expression (1.2) be satisfied similarly to the first preferred embodiment.

(Correlation between Depth $X_g$, Depth $X_{jn}$, Width w, and Thickness $t_{sd}$)

FIG. 50 is a partial cross-sectional perspective view illustrating the definition of dimensions in a trench gate structure of the IGBT 92. The trench TR has a width w as a dimension in the y-axis direction in the drawing. Further, the trench TR has a length z as a dimension in the z-axis direction in the drawing. Further, the gate electrode 4 is provided until the position deeper than the depth $X_{jn}$ of the n-type impurity layer 8 by a dimension p. The definition of other dimensions is as described above. The depth-related dimensions have, based on each definition thereof, the relationship below.

$$t_{i2}=d-X_{jn}-p-t_{i1} \quad (2.1)$$

In this preferred embodiment, the insulation film 52 having the thickness $t_{i2}$ is present as illustrated in FIG. 50, and hence $t_{i2}>0$ is satisfied. Therefore, in view of Expression (2.1) above, the expression below is satisfied.

$$t_{i2}=d-X_{jn}-p-t_{i1}>0$$

$$\therefore d-X_{jn}-p>t_{i1} \quad (2.2)$$

When Expression (2.2) is normalized by the depth $X_{jn}$ of the n-type impurity layer 8, the expression below is obtained.

$$\frac{p+X_{jn}}{X_{jn}} < \frac{d-t_{i1}}{X_{jn}} \quad (2.3)$$

The ratio r is expressed also as below similarly to the first preferred embodiment.

$$r = \frac{p+X_{jn}}{X_{jn}}$$

Based on the expression above and Expression (2.3) above, the expression below is deduced.

$$r < \frac{d-t_{i1}}{X_{jn}} \quad (2.4)$$

Figure 51:
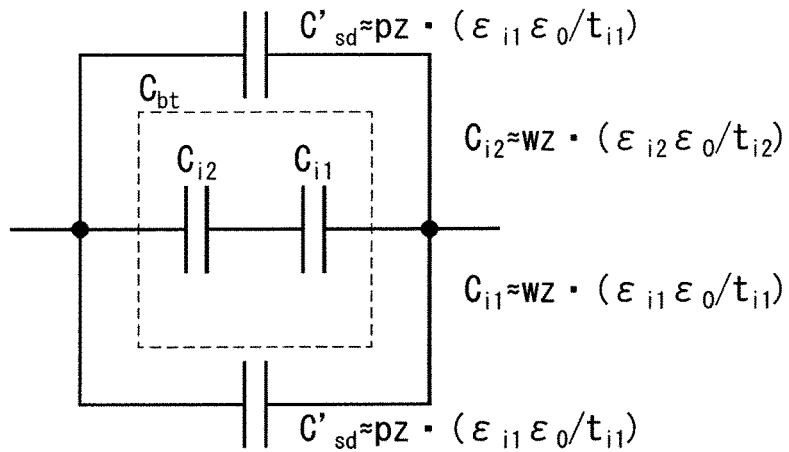
FIG. 51 is an explanatory diagram illustrating an equivalent circuit of parasitic capacitance of FIG. 50.

FIG. 51 is an explanatory diagram illustrating an equivalent circuit of parasitic capacitance of FIG. 50. Between a portion of the gate electrode 4 having the dimension p and the n⁻-type drift layer 1, a pair of parasitic capacitances $C'_{sd}$, parasitic capacitance $C_{i1}$, and parasitic capacitance $C_{i2}$ are formed. The pair of parasitic capacitances $C'_{sd}$ corresponds to each parasitic capacitance on the right side and on the left side of the side wall surface of the trench TR in the drawing. Similarly to the first preferred embodiment, a total of the pair of parasitic capacitances $C'_{sd}$, that is, a double of the parasitic capacitance $C'_{sd}$, is defined as $C_{sd}$. The parasitic capacitance $C_{sd}$ is expressed as below.

$$C_{sd} \approx 2p \cdot z \cdot \frac{\varepsilon_{i1}\varepsilon_0}{t_{i1}} \quad (2.5)$$

Based on Expression (2.5), similarly to the first preferred embodiment, the parasitic capacitance $C_{sd}$ is in direct proportion to the dimension p.

The parasitic capacitance $C_{i1}$ is parasitic capacitance generated due to the insulation film 51 in the bottom surface of the trench TR, and the parasitic capacitance $C_{i2}$ is parasitic capacitance generated due to the insulation film 52 in the bottom surface of the trench TR. Those parasitic capacitances are expressed as below.

$$C_{i1} \approx w \cdot z \cdot \frac{\varepsilon_{i1}\varepsilon_0}{t_{i1}}$$

$$C_{i2} \approx w \cdot z \cdot \frac{\varepsilon_{i2}\varepsilon_0}{t_{i2}}$$

The parasitic capacitance $C_{i1}$ and the parasitic capacitance $C_{i2}$ are connected in series, and hence the parasitic capacitance $C_{bt}$ in the bottom surface of the trench TR is expressed as below.

$$C_{bt} = \frac{C_{i1} \cdot C_{i2}}{C_{i1}+C_{i2}} \quad (2.6)$$

$$= w \cdot z \cdot \frac{\frac{\varepsilon_{i1}}{t_{i1}} \cdot \frac{\varepsilon_{i2}}{t_{i2}} \varepsilon_0}{\frac{\varepsilon_{i1}}{t_{i1}} + \frac{\varepsilon_{i2}}{t_{i2}}}$$

Here, the thickness $t_{bt}$ of the gate insulation film 50 on the bottom surface of the trench TR is expressed as below.

$$t_{bt}=t_{i1}+t_{i2} \quad (2.7)$$

Regarding the stacked body of the insulation film 51 and the insulation film 52 on the bottom surface of the trench TR as a virtual insulation film having the thickness $t_{bt}$ and uniform relative permittivity $\varepsilon_{ef}$, the parasitic capacitance $C_{bt}$ is expressed as below.

$$C_{bt} = w \cdot z \cdot \frac{\varepsilon_{ef}\varepsilon_0}{t_{bt}} \quad (2.8)$$

$$= w \cdot z \cdot \frac{\varepsilon_{ef}\varepsilon_0}{t_{i1} + t_{i2}}$$

Based on Expression (2.6) and Expression (2.8), the relative permittivity $\varepsilon_{ef}$ is deduced as below.

$$w \cdot z \cdot \frac{\varepsilon_{ef}\varepsilon_0}{t_{i1} + t_{i2}} = w \cdot z \cdot \frac{\frac{\varepsilon_{i1}}{t_{i1}} \cdot \frac{\varepsilon_{i2}}{t_{i2}}\varepsilon_0}{\frac{\varepsilon_{i1}}{t_{i1}} + \frac{\varepsilon_{i2}}{t_{i2}}} \quad (2.9)$$

$$\therefore \frac{\varepsilon_{ef}}{t_{i1} + t_{i2}} = \frac{\frac{\varepsilon_{i1}}{t_{i1}} \cdot \frac{\varepsilon_{i2}}{t_{i2}}}{\frac{\varepsilon_{i1}}{t_{i1}} + \frac{\varepsilon_{i2}}{t_{i2}}}$$

$$\therefore \varepsilon_{ef} = \frac{\frac{\varepsilon_{i1}}{t_{i1}} \cdot \frac{\varepsilon_{i2}}{t_{i2}}}{\frac{\varepsilon_{i1}}{t_{i1}} + \frac{\varepsilon_{i2}}{t_{i2}}}(t_{i1} + t_{i2})$$

Referring again to FIG. 50, the sum of the thickness of the insulation film 51 and the thickness of the insulation film 52 on the bottom surface of the trench TR is expressed as below.

$$t_{i1} + t_{i2} = d - X_{jn} - p \quad (2.10)$$

Based on Expression (2.8) and Expression (2.10), the parasitic capacitance $C_{bt}$ is expressed as below.

$$C_{bt} = w \cdot z \cdot \frac{\varepsilon_{ef}\varepsilon_0}{d - X_{jn} - p} \quad (2.11)$$

Based on Expression (2.11), the parasitic capacitance $C_{bt}$ and the dimension p have the reciprocal of the linear function, and has correlation with d, $X_{jn}$, and w.

In this preferred embodiment, switching characteristics are made further excellent through reduction of the parasitic capacitance $C_{bt}$ in the bottom surface of the trench TR. Specifically, a parameter is selected so as to satisfy the relationship of $C_{bt}<C_{sd}$ for the reason mentioned in the first preferred embodiment. This relationship is expressed as below through use of Expression (2.5) and Expression (2.11).

$$w \cdot z \cdot \frac{\varepsilon_{ef}\varepsilon_0}{d - X_{jn} - p} < 2p \cdot z \cdot \frac{\varepsilon_{i1}\varepsilon_0}{t_{i1}} \quad (2.12)$$

$$\therefore \frac{(\varepsilon_{ef}/\varepsilon_{i1})w}{d - X_{jn} - p} < \frac{2p}{t_{i1}}$$

$$\therefore (\varepsilon_{ef}/\varepsilon_{i1})w \cdot t_{i1} < 2p \cdot (d - X_{jn} - p)$$

$$\therefore 2p^2 - 2(d - X_{jn})p + (\varepsilon_{ef}/\varepsilon_{i1})w \cdot t_{i1} < 0$$

Based on Expression (2.12), the dimension p falls within the range below.

$$\frac{(d - X_{jn}) - \sqrt{(d - X_{jn})^2 - 2(\varepsilon_{ef}/\varepsilon_{i1})w \cdot t_{i1}}}{2} < \quad (2.13)$$

$$p < \frac{(d - X_{jn}) + \sqrt{(d - X_{jn})^2 - 2(\varepsilon_{ef}/\varepsilon_{i1})w \cdot t_{i1}}}{2}$$

Figure 52:
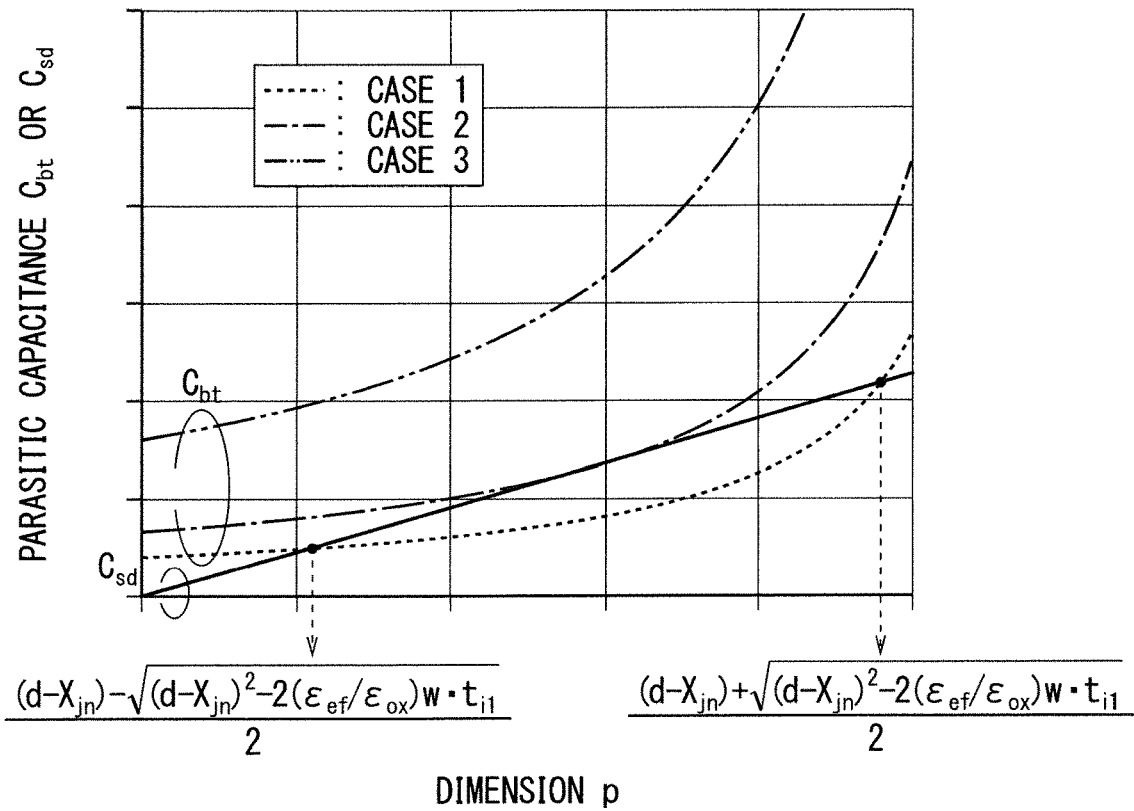
FIG. 52 is a graph showing the relationship between the dimension p and the parasitic capacitance under the condition that a dimension $t_{i1}$ of FIG. 50 is fixed.

FIG. 52 is a graph showing the relationship between the dimension p and the parasitic capacitance under the condition that the thickness $t_{i1}$ is fixed. As described above, the parasitic capacitance $C_{sd}$ is in direct proportion to the dimension p. On the other hand, the parasitic capacitance $C_{bt}$ is expressed by Expression (2.13), and hence is shown in divided Cases 1 to 3 below.

$(d-X_{jn})^2 - 2(\varepsilon_{ef}/\varepsilon_{i1})w \cdot t_{i1} > 0$      Case 1:

$(d-X_{jn})^2 - 2(\varepsilon_{ef}/\varepsilon_{i1})w \cdot t_{i1} = 0$      Case 2:

$(d-X_{jn})^2 - 2(\varepsilon_{ef}/\varepsilon_{i1})w \cdot t_{i1} < 0$      Case 3:

In view of the graph of FIG. 52, in order to satisfy the above-mentioned relationship of $C_{bt}<C_{sd}$, Case 1 needs to be adopted. That is, the expression below needs to be satisfied.

$(d-X_{jn})^2 - 2(\varepsilon_{ef}/\varepsilon_{i1})w \cdot t_{i1} > 0$ $$\therefore (d-X_{jn})^2 > 2(\varepsilon_{ef}/\varepsilon_{i1})w \cdot t_{i1} \quad (2.14)$$

Under the above-mentioned condition, the relationship between the depth $X_{jn}$ and the sum of the dimension p and the depth $X_{jn}$ (that is, the depth $X_g$ of the gate electrode 4) is expressed as below based on Expression (2.13).

$$\frac{(d - X_{jn}) - \sqrt{(d - X_{jn})^2 - 2(\varepsilon_{ef}/\varepsilon_{i1})w \cdot t_{i1}}}{2} + X_{jn} <$$

$$p + X_{jn} < \frac{(d - X_{jn}) + \sqrt{(d - X_{jn})^2 - 2(\varepsilon_{ef}/\varepsilon_{i1})w \cdot t_{i1}}}{2} + X_{jn}$$

$$\therefore \frac{(d - X_{jn}) - \sqrt{(d - X_{jn})^2 - 2(\varepsilon_{ef}/\varepsilon_{i1})w \cdot t_{i1}}}{2 \cdot X_{jn}} + 1 <$$

$$\frac{p + X_{jn}}{X_{jn}} < \frac{(d - X_{jn}) + \sqrt{(d - X_{jn})^2 - 2(\varepsilon_{ef}/\varepsilon_{i1})w \cdot t_{i1}}}{2 \cdot X_{jn}} + 1$$

Based on the relationship above, it is preferred that the ratio=$(p+X_{jn})/X_{jn}$ fall within the range below.

$$r_{min} < r < r_{max} \quad (2.15)$$

$$r_{min} = \frac{(d - X_{jn}) - \sqrt{(d - X_{jn})^2 - 2(\varepsilon_{ef}/\varepsilon_{i1})w \cdot t_{i1}}}{2 \cdot X_{jn}} + 1$$

$$r_{max} = \frac{(d - X_{jn}) + \sqrt{(d - X_{jn})^2 - 2(\varepsilon_{ef}/\varepsilon_{i1})w \cdot t_{i1}}}{2 \cdot X_{jn}} + 1$$

Based on the above, in this second preferred embodiment, it is preferred that the ratio r satisfy Expression (1.2), Expression (2.4), and Expression (2.15) at the same time.

(Manufacturing Method for Trench Gate Structure)

FIG. 53 to FIG. 61 are partial cross-sectional views illustrating a first to ninth processes in an example of a manufacturing method for a trench gate structure of the IGBT 92.

Figure 53:
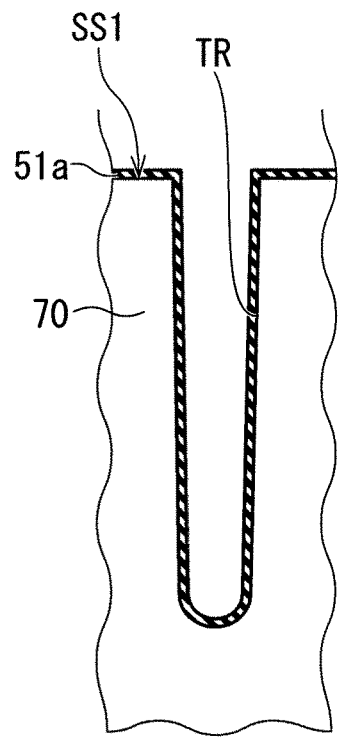
FIG. 53 is a partial cross-sectional view illustrating a first process in an example of a manufacturing method for a trench gate structure of the semiconductor device of FIG. 47.
Figure 54:
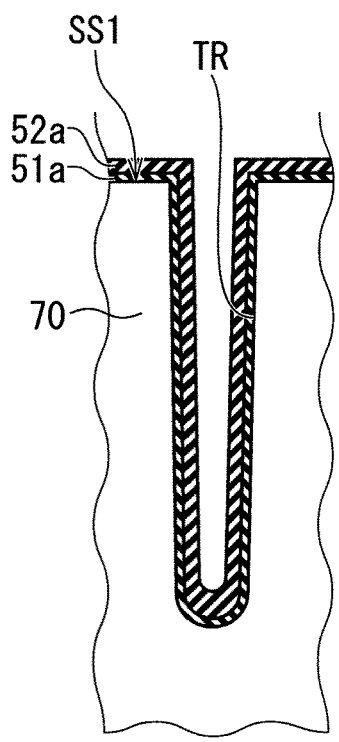
FIG. 54 is a partial cross-sectional view illustrating a second process in the example of the manufacturing method for a trench gate structure of the semiconductor device of FIG. 47.

Referring to FIG. 53, through steps similar to FIG. 36 to FIG. 38 (first preferred embodiment) described above, a thermal oxidation film 51a is formed on the upper substrate surface SS1 including the inner surface of the trench TR. Referring to FIG. 54, an insulation film 52a is formed on the thermal oxidation film 51a. The insulation film 52a has a portion to be the insulation film 52.

Figure 57:
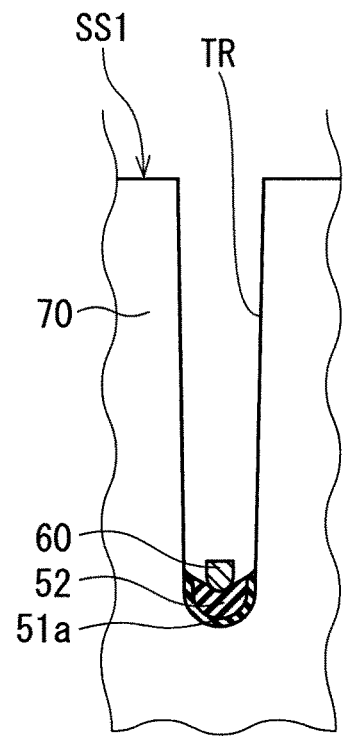
FIG. 57 is a partial cross-sectional view illustrating a fifth process in the example of the manufacturing method for a trench gate structure of the semiconductor device of FIG. 47.

Referring to FIG. 55, a polysilicon film 60 to fill the trench TR is formed with intermediation of the thermal oxidation film 51a and the insulation film 52a. Referring to FIG. 56, etch back is performed with wet etching on the polysilicon layer 60, thereby reserving the polysilicon layer 60 only on the bottom surface of the trench TR. Referring to FIG. 57, wet etching using the polysilicon layer 60 as a mask is performed, thereby reserving the thermal oxidation film 51a and the insulation film 52a only on the bottom surface of the trench TR.

Figure 58:
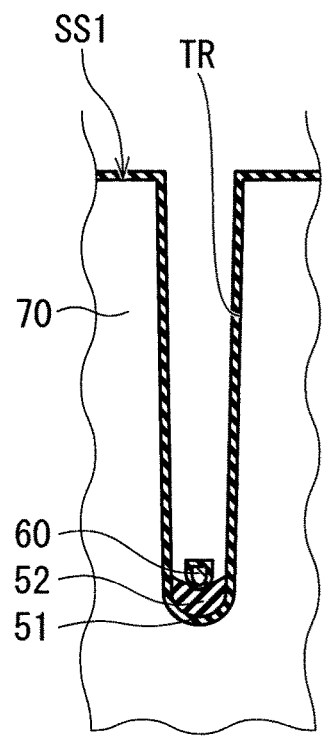
FIG. 58 is a partial cross-sectional view illustrating a sixth process in the example of the manufacturing method for a trench gate structure of the semiconductor device of FIG. 47.
Figure 59:
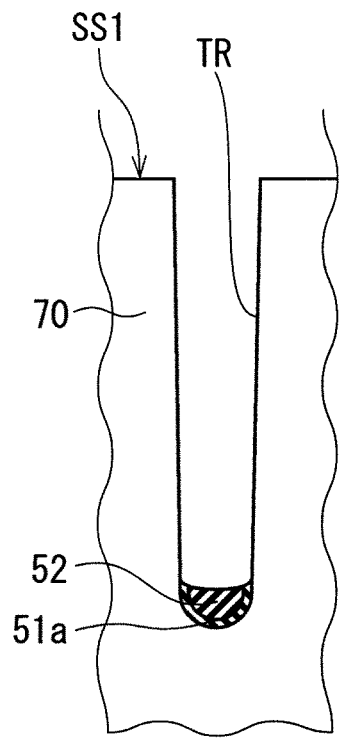
FIG. 59 is a partial cross-sectional view illustrating a seventh process in the example of the manufacturing method for a trench gate structure of the semiconductor device of FIG. 47.

Referring to FIG. 58, a sacrificial layer is formed through thermal oxidation, thereby further forming a thermal oxidation film 51a on an exposed inner surface of the trench TR. Next, the thermal oxidation film 51a not covered by the polysilicon layer 60 is removed by wet etching. Next, the polysilicon layer 60 is removed by wet etching. With this, referring to FIG. 59, the thermal oxidation film 51a and the insulation film 52a are reserved only on the bottom surface of the trench TR.

Figure 60:
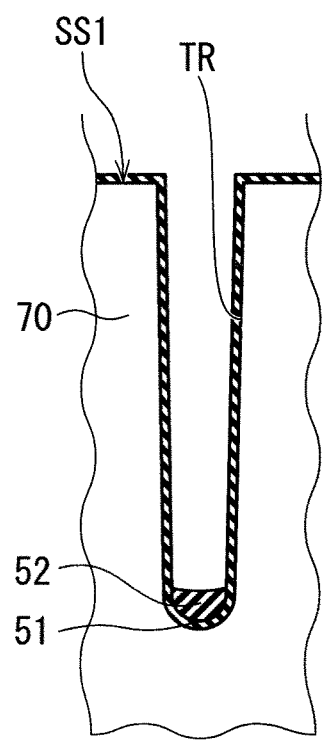
FIG. 60 is a partial cross-sectional view illustrating an eighth process in the example of the manufacturing method for a trench gate structure of the semiconductor device of FIG. 47.

Referring to FIG. 60, the inner surface of the trench TR is thermally oxidized. With this, the insulation film 51 that is formed of a thermal oxidation film including the thermal oxidation film 51a (FIG. 59) is formed. A portion of the insulation film 51 on the bottom surface of the trench TR includes the thermal oxidation film 51a, and therefore has a thickness larger than other portions.

Figure 61:
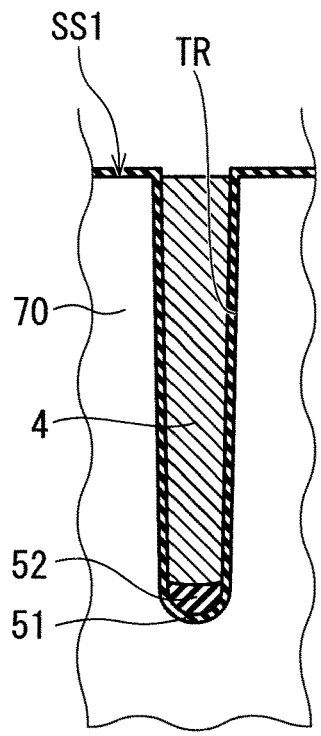
FIG. 61 is a partial cross-sectional view illustrating a ninth process in the example of the manufacturing method for a trench gate structure of the semiconductor device of FIG. 47.

Referring to FIG. 61, a polysilicon layer is deposited on the upper substrate surface SS1 so as to fill the trench TR with intermediation of the gate insulation film 5. Through etch back, a portion of the polysilicon layer outside of the trench TR is removed, thereby forming the gate electrode 4. With this, a trench gate structure of the IGBT 92 is obtained.

In order to more easily perform the above-mentioned processes, it is preferred that composition of the insulation film 52a (that is, composition of the insulation film 52) be composition that is appropriate for performing deposition on the inner surface of the trench TR having a high aspect ratio as uniformly as possible. Further, it is preferred that the above-mentioned composition be composition that is capable of performing etching at a higher speed than the composition of the n⁻-type drift layer 1, that is, composition that has high etching selectivity for the n⁻-type drift layer 1.

(Summary of Effects)

According to this preferred embodiment, the second insulation film 52 having second composition is provided on the bottom surface of the trench TR with intermediation of the insulation film 51 having first composition. With this, a portion of the gate insulation film 50 on the bottom surface can be formed of a plurality of materials. Therefore, difference between the portion of the gate insulation film 50 on the bottom surface and other portions can be provided not only by the thickness but also by physical property of the materials. Particularly, through use of the insulation film 52 having the permittivity $\varepsilon_{i2}$ lower than the permittivity $\varepsilon_{i1}$ of the insulation film 51, the parasitic capacitance $C_{bt}$ in the bottom surface of the trench TR can be notably reduced. With this, improvement in switching characteristics, suppression in oscillation phenomenon in particular, is possible.

Particularly, through use of a thermal oxidation film as the thermal oxidation 51 and an insulation film other than a thermal oxidation film as the insulation film 52, a stress generated at the time of thermal oxidation can be suppressed as compared to the case where a thermal oxidation film is used as the entire insulation film 51. With this, generation of damage or defects of the semiconductor substrate 70 on the inner surface of the trench that is caused by the above-mentioned stress can be suppressed. Therefore, gate leakage and threshold voltage unevenness can be suppressed, and reliability of the gate insulation film can be enhanced.

When Expression (2.14) is satisfied, the relationship of $C_{bt} < C_{sd}$ concerning the parasitic capacitance can be satisfied. According to the above-mentioned simulation results, when the relationship is satisfied, a low on-voltage and satisfactory switching characteristics can be more easily attained.

Note that, in this preferred embodiment described above, the thickness of the insulation film 51 between the gate electrode 4 and the n⁻-type drift layer 1 in the side wall surface of the trench TR and the thickness of the insulation film 51 between the gate electrode 4 and the n⁻-type drift layer 1 in the bottom surface of the trench TR are substantially in common, but these thicknesses may be different from each other as long as the condition of $C_{bt} < C_{sd}$ concerning the parasitic capacitance is satisfied.

<Third Preferred Embodiment>

In this third preferred embodiment, the semiconductor device according to the above-mentioned first and second preferred embodiments and the modified examples thereof is applied to a power converter. The present invention is not to be limited to a specific power converter. However, as this third preferred embodiment, description is given below of the case where the present invention is applied to a three-phase inverter.

Figure 62:
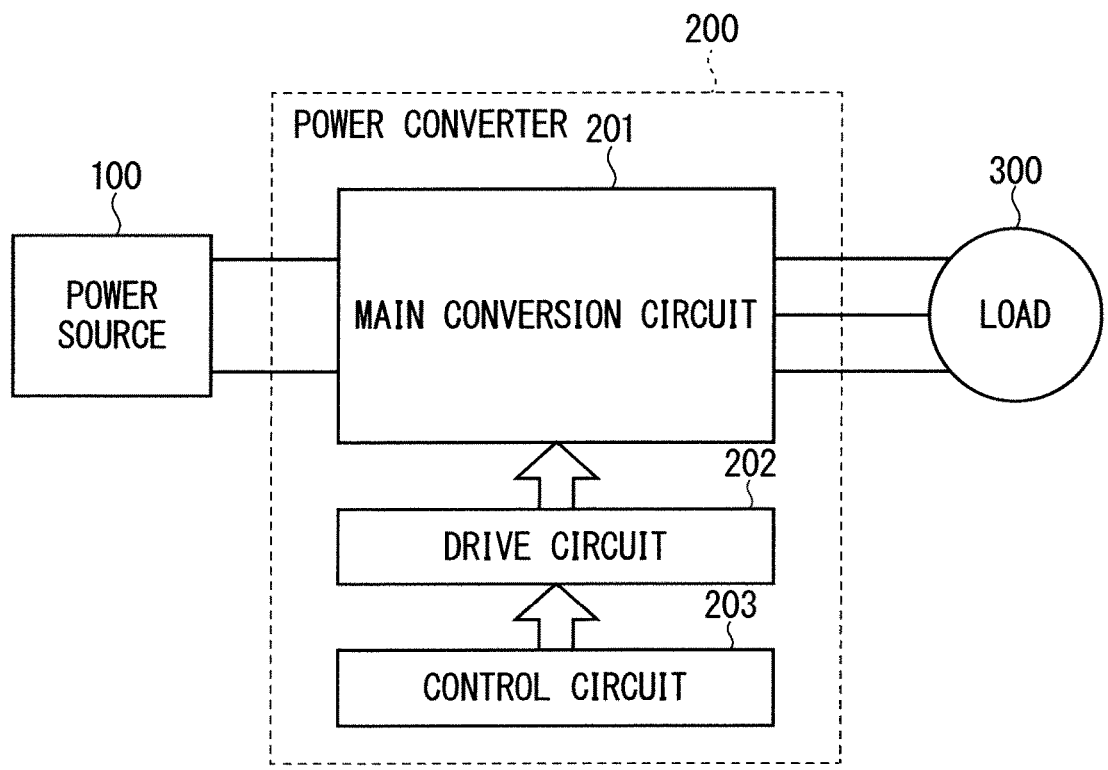
FIG. 62 is a block diagram schematically illustrating a configuration of a power conversion system to which a power converter according to a third preferred embodiment of the present invention is applied.

FIG. 62 is a block diagram schematically illustrating a configuration of a power conversion system to which a power converter 200 according to the third preferred embodiment of the present invention is applied.

The power converter 200 is a three-phase inverter connected between a power source 100 and a load 300, which converts DC power supplied from the power source 100 into AC power, and supplies the AC power to the load 300. The power converter 200 includes a main conversion circuit 201, a drive circuit 202, and a control circuit 203. The main conversion circuit 201 includes the IGBT 91 (first preferred embodiment) or the IGBT 92 (second preferred embodiment) as a switching element, and converts input DC power into AC power and outputs the AC power. The drive circuit 202 outputs a drive signal for driving each semiconductor device as a switching element to the semiconductor device. The control circuit 203 outputs a control signal for controlling the drive circuit 202 to the drive circuit 202.

The power source 100 is a DC power source, and supplies DC power to the power converter 200. The power source 100 may be formed of various elements. For example, the power source 100 may be formed of a DC system, a solar battery, or a storage battery, or may be formed of a rectifier circuit or an AC/DC converter that is connected to an AC system. Further, the power source 100 may be formed of a DC/DC converter for converting DC power output from a DC system into predetermined power.

The load 300 is a three-phase electric motor driven by AC power supplied from the power converter 200. Note that, the load 300 is not to be limited to specific use, but is an electric motor mounted in various electrical devices. For example, the load 300 may be used as an electric motor for a hybrid vehicle, an electric vehicle, a railway vehicle, and an elevator, or an air-conditioning device.

Now, the power converter 200 is described in detail. The main conversion circuit 201 includes a switching element and a freewheeling diode (not shown). When the switching element is switched, the main conversion circuit 201 converts DC power supplied from the power source 100 into AC power, and supplies the AC power to the load 300. Specific circuit configuration of the main conversion circuit 201 may be various. However, the main conversion circuit 201 according to this preferred embodiment is a 2-level three-phase full-bridge circuit, and may be formed of six switching elements and six freewheeling diodes that are connected to the respective switching elements in inverse-parallel. In the six switching elements, paired two switching elements are connected in series to form upper and lower arms, and each of the upper and lower arms forms a phase (U-phase, V-phase, or W-phase) of the full-bridge circuit. Further, output terminals of the upper and lower arms, that is, three output terminals of the main conversion circuit 201, are connected to the load 300.

The drive circuit 202 generates a drive signal for driving the switching element of the main conversion circuit 201, and supplies the drive signal to a control electrode of the switching element of the main conversion circuit 201. Specifically, the drive circuit 202 follows a control signal from the control circuit 203 described later to output a drive signal for bringing the switching element into the on state and a drive signal for bringing the switching element into the off state to the control electrode of each switching element. In a case where the switching element is maintained in the on state, the drive signal is a voltage signal having a threshold voltage of the switching element or higher (on-signal), and in a case where the switching element is maintained in the off state, the drive signal is a voltage signal having a threshold voltage of the switching element or lower (off-signal).

The control circuit 203 controls the switching element of the main conversion circuit 201 so that desired power is supplied to the load 300. Specifically, the control circuit 203 calculates, based on power to be supplied to the load 300, a time at which each switching element of the main conversion circuit 201 is to be brought into the on state (on-time). For example, the main conversion circuit 201 can be controlled by PWM control where the on-time of the switching element is modulated in accordance with a voltage to be output. Then, at each time point, the control circuit 203 outputs a control command (control signal) to the drive circuit 202 such that an on-signal is output to a switching element to be brought into the on state and that an off-signal is output to a switching element to be brought into the off state. The drive circuit 202 follows this control signal to output an on-signal or an off-signal as a drive signal to the control electrode of each switching element.

According to this preferred embodiment, the main conversion circuit 201 includes the IGBT 91 (first preferred embodiment) or the IGBT 92 (second preferred embodiment) as a switching element. With this, in the main conversion circuit, switching characteristics can be improved while adverse influence on other important electrical characteristics is suppressed. Specifically, turn-off/turn-on loss can be reduced through reduction of a mirror zone appearing in a gate waveform at the time of a turn-off/turn-on. Further, an oscillation phenomenon and a snap-off phenomenon can be suppressed. With this, conversion efficiency of the power converter can be enhanced, and an output waveform from the main conversion circuit can more faithfully correspond to a control signal.

In this preferred embodiment, an example in which the present invention is applied to a 2-level three-phase inverter has been described. However, the present invention is not to be limited thereto, and may be applied to various power converters. In this preferred embodiment, the power converter is a 2-level power converter, but a multilevel power converter such as a 3-level power converter may be used. Further, in a case where power is supplied to a single-phase load, the present invention may be applied to a single-phase inverter. Further, in a case where power is supplied to a DC load or the like, the present invention may also be applied to a DC/DC converter or an AC/DC converter.

Further, a power converter to which the present invention is applied is not to be limited to the above-mentioned case where a load is an electric motor. For example, the power converter may also be used as a power source device of any of an electric discharge machine, a laser processing machine, an induced heating cooking device, and a non-contact device power supply system, and may further be used as a power conditioner of a photovoltaic power generation system, a power storage system, and the like.

Note that, in the present invention, each of the preferred embodiments may be freely combined, and each of the preferred embodiments may be modified or omitted as appropriate within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate having a first substrate surface and a second substrate surface that is opposite to the first substrate surface, the semiconductor substrate comprising,
      a drift layer having a first surface and a second surface that is opposite to the first surface, the drift layer having a first conductivity type,
      a first impurity layer being provided on the first surface of the drift layer, having the first conductivity type, and having impurity concentration higher than impurity concentration of the drift layer,
      a second impurity layer being provided on the first surface of the drift layer, and having a second conductivity type different from the first conductivity type,
      a base layer being provided on the first impurity layer and having the second conductivity type,
      a first emitter region being provided on the base layer, partially forming the first substrate surface, and having the first conductivity type,
      a second emitter region being provided on the base layer, partially forming the first substrate surface, and having the second conductivity type, and
      a collector region being provided directly or indirectly on the second surface of the drift layer, at least partially forming the second substrate surface, and having the second conductivity type, wherein
      a plurality of trenches are formed on the first substrate surface of the semiconductor substrate, the plurality of trenches each have an inner surface in which a bottom surface and a side wall surface are provided, the plurality of trenches each have a main portion extending along the first substrate surface and an end portion extending along the first substrate surface to be connected to the main portion, the bottom surface is formed of the drift layer in the main portion and is formed of the second impurity layer in the end portion, and the first impurity layer connects between the plurality of trenches in an in-plane direction of the first substrate surface;

a gate insulation film covering the inner surface of the plurality of trenches; and a gate electrode being embedded in the plurality of trenches with intermediation of the gate insulation film, wherein the gate insulation film has a first thickness between the gate electrode and the drift layer in the side wall surface, and has a second thickness between the gate electrode and the drift layer in the bottom surface, the second thickness being larger than the first thickness, wherein the gate insulation film is made of a single material, and wherein the following relationships are satisfied:

$$r < \frac{d - t_{sd}}{X_{jn}}, \text{ and} \qquad \text{[Expression 1]}$$

$$r_{min} < r < r_{max} \qquad \text{[Expression 2]}$$

$$r_{min} = \frac{(d - X_{jn}) - \sqrt{(d - X_{jn})^2 - 2w \cdot t_{sd}}}{2 \cdot X_{jn}} + 1$$

$$r_{max} = \frac{(d - X_{jn}) = \sqrt{(d - X_{jn})^2 - 2w \cdot t_{sd}}}{2 \cdot X_{jn}} + 1$$

where $X_{jn}$ represents the depth of the interface of the drift layer and the first impurity layer, r represents a ratio of the depth of the interface of the gate insulation film and the gate electrode to the depth of the interface of the drift layer and the first impurity layer, w represents a width of the plurality of trenches, d represents a depth of the bottom surface of the plurality of trenches, and $t_{sd}$ represents a thickness of the gate insulation film on the side wall surface of the plurality of trenches.

2. The semiconductor device according to claim 1, wherein a depth of an interface of the gate insulation film and the gate electrode is larger than a depth of an interface of the drift layer and the first impurity layer, and a depth of the bottom surface of the plurality of trenches is larger than the depth of the interface of the drift layer and the first impurity layer, and is smaller than a depth of an interface of the drift layer and the second impurity layer.

3. A semiconductor device comprising:

a semiconductor substrate having a first substrate surface and a second substrate surface that is opposite to the first substrate surface, the semiconductor substrate comprising, a drift layer having a first surface and a second surface that is opposite to the first surface, the drift layer having a first conductivity type, a first impurity layer being provided on the first surface of the drift layer, having the first conductivity type, and having impurity concentration higher than impurity concentration of the drift layer, a second impurity layer being provided on the first surface of the drift layer, and having a second conductivity type different from the first conductivity type, a base layer being provided on the first impurity layer and having the second conductivity type, a first emitter region being provided on the base layer, partially forming the first substrate surface, and having the first conductivity type, a second emitter region being provided on the base layer, partially forming the first substrate surface, and having the second conductivity type, and a collector region being provided directly or indirectly on the second surface of the drift layer, at least partially forming the second substrate surface, and having the second conductivity type, wherein a plurality of trenches are formed on the first substrate surface of the semiconductor substrate, the plurality of trenches each have an inner surface in which a bottom surface and a side wall surface are provided, the plurality of trenches each have a main portion extending along the first substrate surface and an end portion extending along the first substrate surface to be connected to the main portion, the bottom surface is formed of the drift layer in the main portion and is formed of the second impurity layer in the end portion, and the first impurity layer connects between the plurality of trenches in an in-plane direction of the first substrate surface;

a gate insulation film covering the inner surface of the plurality of trenches; and a gate electrode being embedded in the plurality of trenches with intermediation of the gate insulation film, wherein the gate insulation film has a first thickness between the gate electrode and the drift layer in the side wall surface, and has a second thickness between the gate electrode and the drift layer in the bottom surface, the second thickness being larger than the first thickness, wherein the gate insulation film comprises a first insulation film having first composition that covers the inner surface of the plurality of trenches with a uniform thickness and a second insulation film having second composition that is provided on the bottom surface of the plurality of trenches with intermediation of the first insulation film, and the second composition is different from the first composition, and wherein the following relationships are satisfied:

$$r < \frac{d - t_{i1}}{X_{jn}}, \qquad \text{[Expression 4]}$$

and $$r_{min} < r < r_{max} \qquad \text{[Expression 5]}$$

$$r_{min} = \frac{(d - X_{jn}) - \sqrt{(d - X_{jn})^2 - 2(\varepsilon_{ef}/\varepsilon_{i1})w \cdot t_{i1}}}{2 \cdot X_{jn}} + 1$$

$$r_{max} = \frac{(d - X_{jn}) + \sqrt{(d - X_{jn})^2 - 2(\varepsilon_{ef}/\varepsilon_{i1})w \cdot t_{i1}}}{2 \cdot X_{jn}} + 1$$

where $X_{jn}$ represents the depth of the interface of the drift layer and the first impurity layer, r represents a ratio of the depth of the interface of the gate insulation film and the gate electrode to the depth of the interface of the drift layer and the first impurity layer, w represents a width of the plurality of trenches, d represents a depth of the bottom surface of the plurality of trenches, $t_{i1}$ and $t_{i2}$ represent a thickness of the first insulation film and a thickness of the second insulation film, respectively, $\varepsilon_{i1}$ and $\varepsilon_{i2}$ represent permittivity of the first insulation film and permittivity of the second insulation film, respectively, and $\varepsilon_{ef}$ is represented as follows:

$$\varepsilon_{ef} = \frac{\frac{\varepsilon_{i1}}{t_{i1}} \cdot \frac{\varepsilon_{i2}}{t_{i2}}}{\frac{\varepsilon_{i1}}{t_{i1}} + \frac{\varepsilon_{i2}}{t_{i2}}}(t_{i1} + t_{i2}). \qquad \text{[Expression 3]}$$

4. A power converter including the semiconductor device according to claim 1, comprising:
   a main conversion circuit including the semiconductor device, for converting input power to output the input power;
   a drive circuit for outputting a drive signal for driving the semiconductor device to the semiconductor device; and
   a control circuit for outputting a control signal for controlling the drive circuit to the drive circuit.

5. A power converter including the semiconductor device according to claim 3, comprising:
   a main conversion circuit including the semiconductor device, for converting input power to output the input power;
   a drive circuit for outputting a drive signal for driving the semiconductor device to the semiconductor device; and
   a control circuit for outputting a control signal for controlling the drive circuit to the drive circuit.

* * * * *